(12) United States Patent
Benkley, III et al.

(10) Patent No.: US 10,713,461 B2
(45) Date of Patent: Jul. 14, 2020

(54) DOUBLE SIDED SENSOR MODULE SUITABLE FOR INTEGRATION INTO ELECTRONIC DEVICES

(71) Applicant: IDEX ASA, Fornebu (NO)

(72) Inventors: Fred G. Benkley, III, Middleton, MA (US); David N. Light, Los Gatos, CA (US)

(73) Assignee: IDEX Biometrtics ASA, Oslo (NO)

( * ) Notice: Subject to any disclaimer, the term of this patent is extended or adjusted under 35 U.S.C. 154(b) by 101 days.

(21) Appl. No.: 16/134,298

(22) Filed: Sep. 18, 2018

(65) Prior Publication Data
US 2019/0087622 A1   Mar. 21, 2019

Related U.S. Application Data

(60) Provisional application No. 62/560,431, filed on Sep. 19, 2017, provisional application No. 62/596,263, filed on Dec. 8, 2017.

(51) Int. Cl.
| | |
|---|---|
| *G06K 9/00* | (2006.01) |
| *H04M 1/02* | (2006.01) |
| *H01L 23/538* | (2006.01) |

(52) U.S. Cl.
CPC ....... *G06K 9/0002* (2013.01); *G06K 9/00006* (2013.01); *G06K 9/0012* (2013.01);
(Continued)

(58) Field of Classification Search
CPC ............ G06K 9/0002; G06K 9/00006; G06K 9/00053; G06K 9/0012; H01L 23/5387; H04M 1/0277; G06F 3/044
See application file for complete search history.

(56) References Cited

U.S. PATENT DOCUMENTS

| | | |
|---|---|---|
| 4,583,042 A | 4/1986 | Riemer |
| 5,180,901 A | 1/1993 | Hiramatsu |
| | (Continued) | |

FOREIGN PATENT DOCUMENTS

| | | |
|---|---|---|
| EP | 3 007 102 A2 | 4/2016 |
| TW | 200620505 A | 6/2006 |
| | (Continued) | |

OTHER PUBLICATIONS

International Search Report and Written Opinion dated Jan. 3, 2019 issued in International Application No. PCT/IB2018/057186. (16 pages).
(Continued)

*Primary Examiner* — Premal R Patel
(74) *Attorney, Agent, or Firm* — Rothwell, Figg, Ernst & Manbeck, P.C.

(57) ABSTRACT

A sensor assembly includes a flexible substrate with conductive traces formed on opposed sides of the substrate and oriented transversely to each other. The substrate is wrapped around a core so that the traces formed on opposed sides of a first part of the substrate form a first sensor surface on one surface of the core, and the traces formed on opposed sides of a second part of the substrate form a second sensor surface on an opposed surface of the core. The core may comprise an encapsulant overmolded onto the conductive traces on a surface of the first part of the substrate, and the second part of the substrate is folded over the encapsulant. The sensor assembly may include an integrated circuit disposed on the flexible substrate, wherein one or more of the conductive traces are electrically connected to each integrated circuit.

29 Claims, 56 Drawing Sheets

(52) U.S. Cl.
CPC ...... *G06K 9/00053* (2013.01); *H01L 23/5387* (2013.01); *H04M 1/0277* (2013.01)

(56) References Cited

U.S. PATENT DOCUMENTS

| | | | |
|---|---|---|---|
| 5,270,664 | A | 12/1993 | McMurtry et al. |
| 5,473,144 | A | 12/1995 | Mathurin, Jr. |
| 5,963,679 | A | 10/1999 | Setlak |
| 6,069,970 | A | 5/2000 | Salatino |
| 6,356,097 | B1 | 3/2002 | Loewenhardt et al. |
| 6,360,953 | B1 | 3/2002 | Lin et al. |
| 6,950,541 | B1 | 9/2005 | Setlak et al. |
| 7,110,577 | B1 | 9/2006 | Tschudi |
| 7,203,344 | B2 | 4/2007 | McClurg et al. |
| 7,251,351 | B2 | 7/2007 | Mathiassen et al. |
| 7,751,601 | B2 | 7/2010 | Benkley, III |
| 7,848,550 | B2 | 12/2010 | Mathiassen et al. |
| 7,848,798 | B2 | 12/2010 | Martinsen et al. |
| 8,144,129 | B2 | 3/2012 | Hotelling et al. |
| 8,195,285 | B2 | 6/2012 | Martinsen et al. |
| 8,224,044 | B2 | 7/2012 | Benkley, III |
| 8,378,508 | B2 | 2/2013 | Bond et al. |
| 8,421,890 | B2 | 4/2013 | Benkley, III |
| 8,487,624 | B2 | 7/2013 | Bredholt et al. |
| 8,736,001 | B2 | 5/2014 | Salatino et al. |
| 8,791,792 | B2 | 7/2014 | Benkley, III |
| 8,866,347 | B2 | 10/2014 | Benkley, III |
| 8,867,799 | B2 | 10/2014 | Benkley, III |
| 9,030,440 | B2 | 5/2015 | Pope et al. |
| 9,122,901 | B2 | 9/2015 | Sløgedal et al. |
| 9,135,495 | B1 | 9/2015 | Pope et al. |
| 9,152,838 | B2 | 10/2015 | Wickboldt et al. |
| 9,177,191 | B2 | 11/2015 | Benkley, III |
| 9,268,988 | B2 | 2/2016 | Benkley, III |
| 9,268,989 | B2 | 2/2016 | Pope et al. |
| 9,280,695 | B2 | 3/2016 | Zyzdryn et al. |
| 9,396,379 | B2 | 7/2016 | Sløgedal et al. |
| 9,569,654 | B2 | 2/2017 | Benkley, III |
| 9,576,178 | B2 | 2/2017 | Pope et al. |
| 9,651,513 | B2 | 5/2017 | Dunlap et al. |
| 9,779,280 | B2 | 10/2017 | Benkley, III |
| 9,792,516 | B2 | 10/2017 | Vogel et al. |
| 9,798,399 | B2 | 10/2017 | Vandermeijden et al. |
| 2004/0188838 | A1 | 9/2004 | Okada et al. |
| 2005/0068051 | A1 | 3/2005 | Tesdahl et al. |
| 2006/0061368 | A1 | 3/2006 | Furse et al. |
| 2006/0083411 | A1* | 4/2006 | Benkley, III ........... G06K 9/001 382/124 |
| 2010/0272329 | A1* | 10/2010 | Benkley, III ........... G06K 9/001 382/124 |
| 2011/0019373 | A1 | 1/2011 | Ryhanen et al. |
| 2011/0175703 | A1* | 7/2011 | Benkley, III ....... G06K 9/00053 340/5.82 |
| 2011/0176037 | A1* | 7/2011 | Benkley, III ......... G06K 9/0002 348/294 |
| 2011/0254108 | A1 | 10/2011 | Gozzini et al. |
| 2012/0134549 | A1 | 5/2012 | Benkley, III |
| 2012/0162099 | A1* | 6/2012 | Yoo ....................... G06F 3/0412 345/173 |
| 2012/0242635 | A1 | 9/2012 | Erhart et al. |
| 2013/0108124 | A1 | 5/2013 | Wickboldt et al. |
| 2013/0279769 | A1* | 10/2013 | Benkley, III ....... G06K 9/00013 382/124 |
| 2013/0320464 | A1 | 12/2013 | Bond et al. |
| 2013/0341398 | A1 | 12/2013 | Rao |
| 2014/0103943 | A1 | 4/2014 | Dunlap et al. |
| 2014/0241595 | A1 | 8/2014 | Bernstein et al. |
| 2015/0091588 | A1 | 4/2015 | Wickboldt et al. |
| 2015/0115981 | A1 | 4/2015 | Christie et al. |
| 2015/0125050 | A1 | 5/2015 | Lee et al. |
| 2015/0187707 | A1 | 7/2015 | Lee et al. |
| 2015/0242672 | A1 | 8/2015 | Benkley, III et al. |
| 2015/0356338 | A1 | 12/2015 | Osborne et al. |
| 2016/0055365 | A1* | 2/2016 | Benkley, III ......... G06K 9/0008 382/124 |
| 2016/0131505 | A1 | 5/2016 | Rao et al. |
| 2016/0188951 | A1 | 6/2016 | Benkley, III |
| 2016/0267313 | A1 | 9/2016 | Pope et al. |
| 2016/0379035 | A1 | 12/2016 | Benkley, III |
| 2017/0147852 | A1 | 5/2017 | Benkley, III et al. |
| 2018/0181224 | A1* | 6/2018 | Li ........................... G06F 3/044 |
| 2018/0213646 | A1 | 7/2018 | Benkley, III et al. |

FOREIGN PATENT DOCUMENTS

| | | |
|---|---|---|
| TW | 201346779 A | 11/2013 |
| TW | 201732680 A | 9/2017 |
| WO | 03/049012 A2 | 6/2013 |
| WO | 2013155224 A1 | 10/2013 |
| WO | 2015/127046 A1 | 8/2015 |
| WO | 2016060201 A1 | 4/2016 |
| WO | 2016060202 A1 | 4/2016 |
| WO | 2016/103215 A1 | 6/2016 |
| WO | 2017/085669 A2 | 5/2017 |
| WO | 2017/164791 A1 | 9/2017 |
| WO | 2018/117442 A1 | 6/2018 |

OTHER PUBLICATIONS

Harada, S. et al., "Fully Printed Flexible Fingerprint-like Three-Axis Tactile and Slip Force and Temperature Sensors for Artificial Skin", ACS NANO, vol. 8, No. 12, Dec. 23, 2014. (7 pages).
Taiwanese Office Action dated Oct. 17, 2019 issued in Taiwanese Patent Application No. 107132775 with translation. (19 pages).
Notification of 1st Office Action dated Oct. 18, 2019, in Taiwan Patent Application No. 107132775, 12 pages.
International Search Report and Written Opinion dated Nov. 7, 2016, International Application No. PCT/IB2016/053725, 14 pages.
Jaechang Shim et al., "A Double-sided Fingerprint Sensing Method," Journal of Korea Multimedia Society, vol. 11, Mar. 3, 2008 (Mar. 3, 2008), pp. 323-330.
International Preliminary Report on Patentability dated May 31, 2018 issued in International Application No. PCT/IB2016/056939 (9 pages).
Office Action dated Apr. 27, 2018 issued in Taiwanese Patent Application No. 105137772. (17 pages).
International Search Report and Written Opinion issued in International Patent Application No. PCT/162016/056939, 16 pages (dated May 12, 2017).
Invitation to Pay Additional Fees issued in International Patent Application No. PCT/IB2016/056939, 7 pages (dated Mar. 16, 2017).
International Search Report and Written Opinion dated Apr. 10, 2018 issued in International Patent Application No. PCT/IB2018/050430. (20 pages).
International Preliminary Report on Patentability (IPRP) dated Apr. 2, 2020 issued in International Application No,. PCT/IB2018/057186. (9 pages).

\* cited by examiner

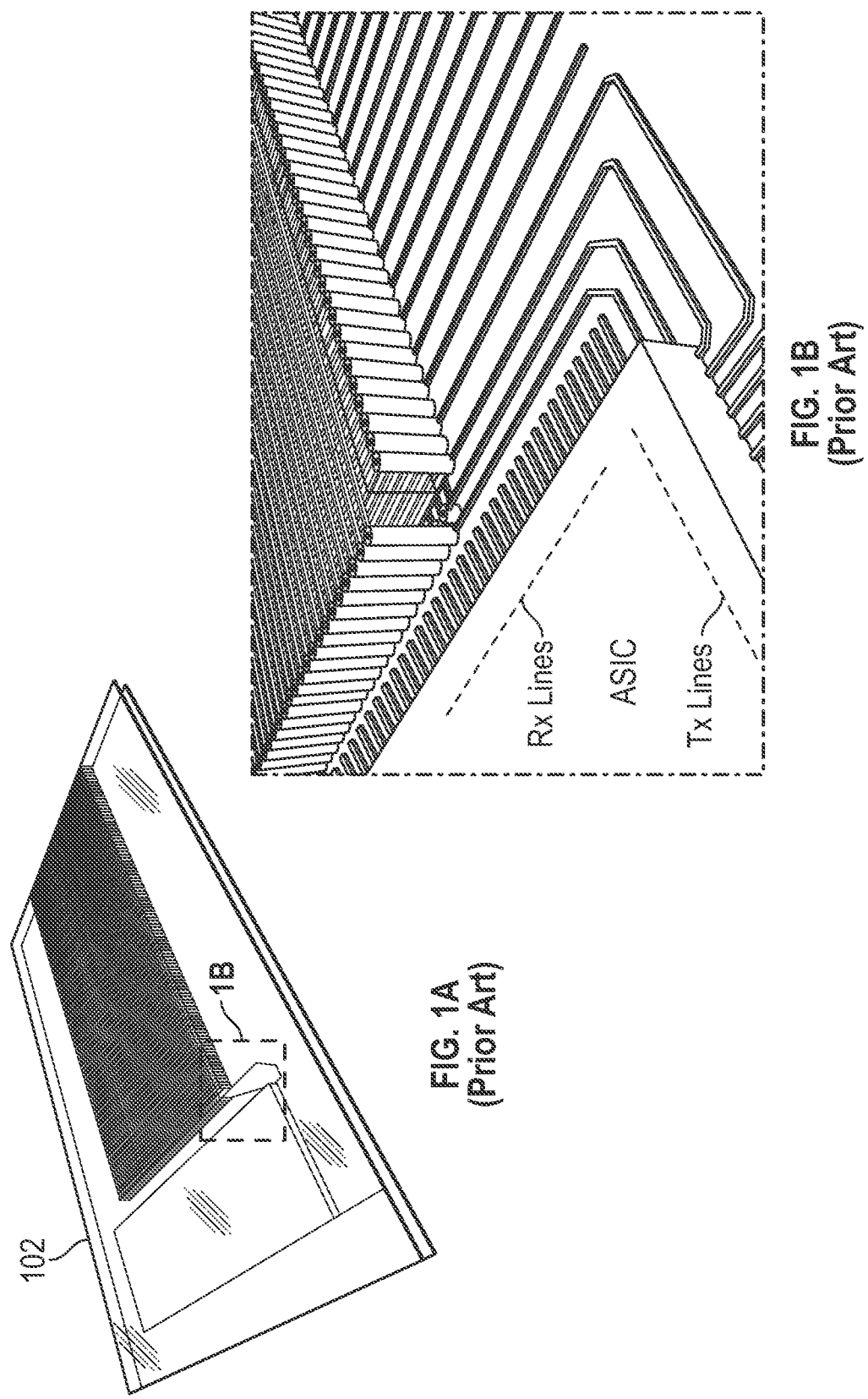

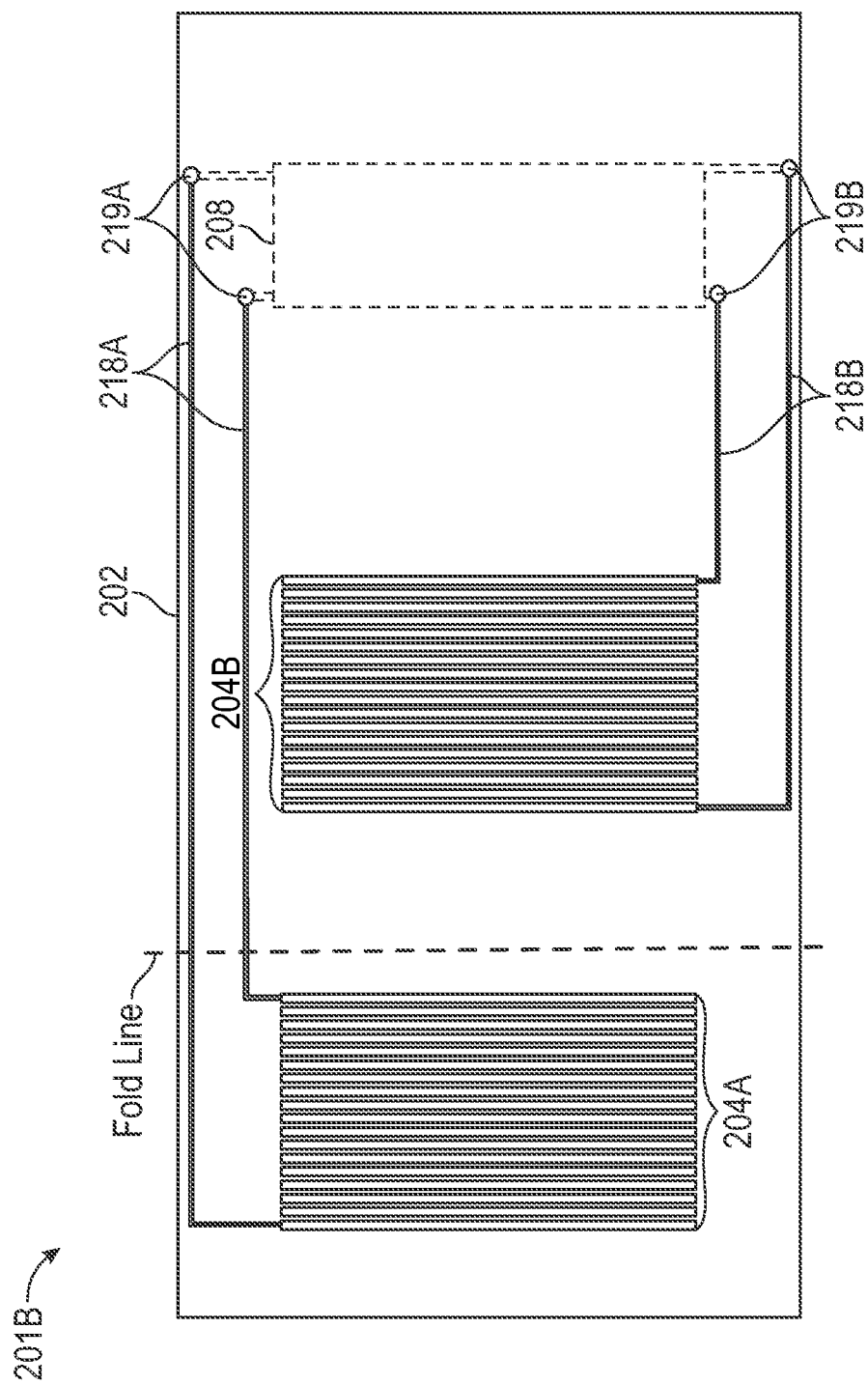

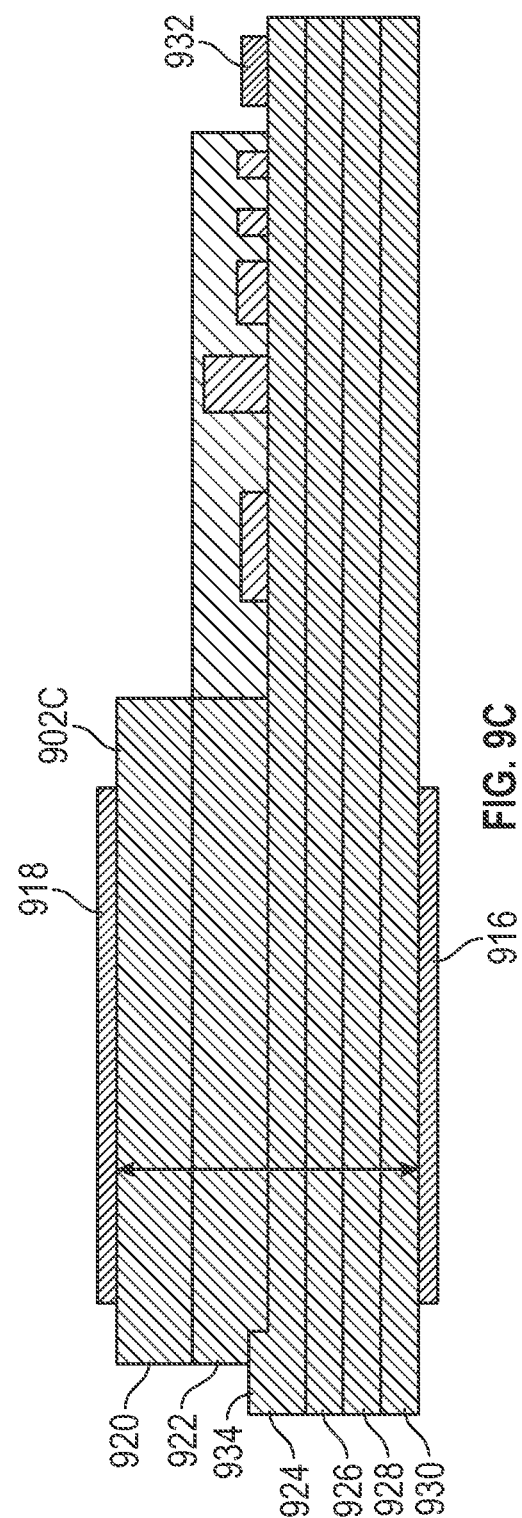

Bottom View

Top View

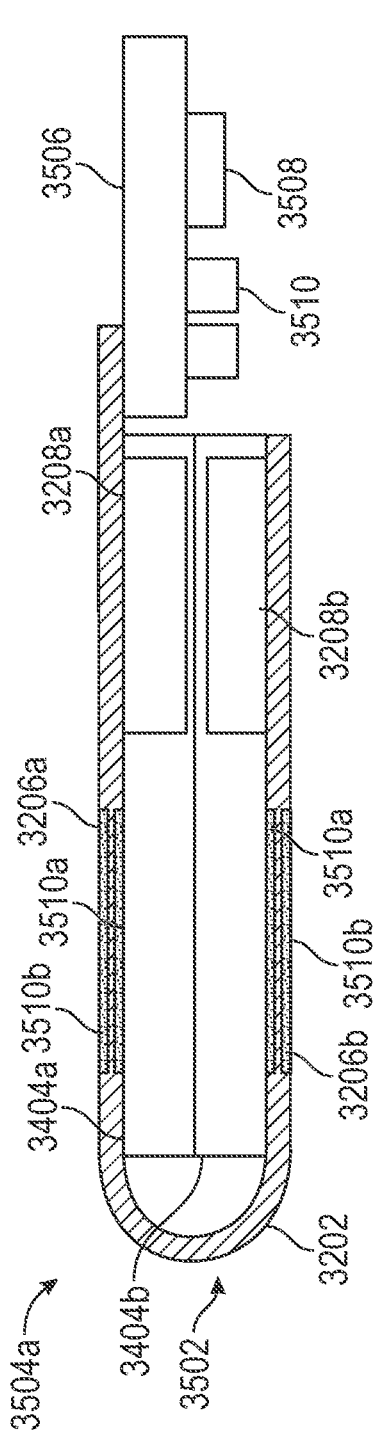
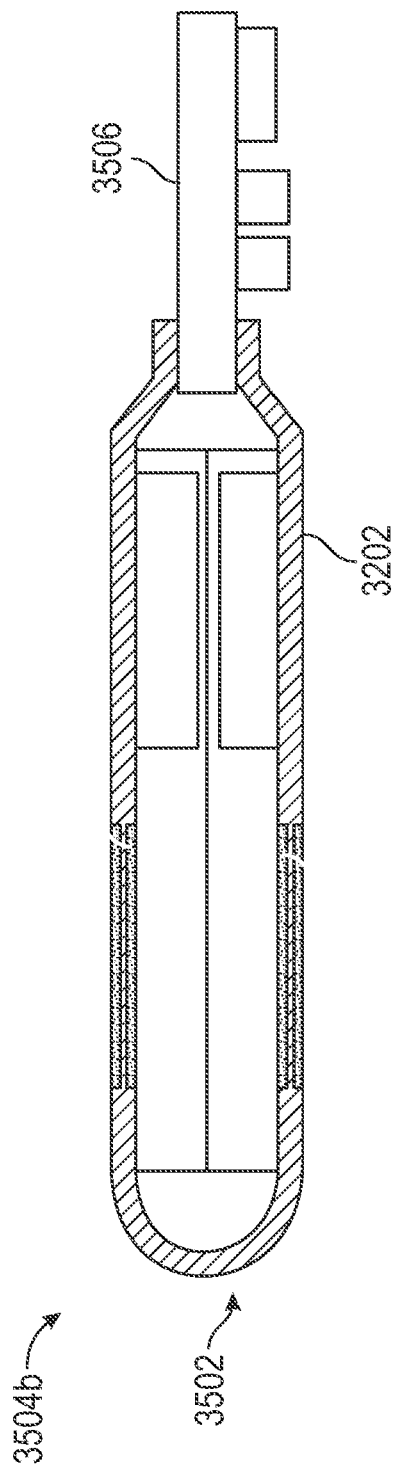
FIG. 35A
FIG. 35B

DOUBLE SIDED SENSOR MODULE SUITABLE FOR INTEGRATION INTO ELECTRONIC DEVICES

CROSS REFERENCE OF RELATED APPLICATION

This application claims the benefit under 35 U.S.C. § 119(e) of the filing dates of U.S. provisional patent application Ser. No. 62/560,431 filed Sep. 19, 2017 and U.S. provisional patent application Ser. No. 62/596,263 filed Dec. 8, 2017, the respective disclosures of which are incorporated herein by reference.

FIELD OF THE DISCLOSURE

This disclosure relates to a structurally robust fingerprint sensor module for integration into electronic devices such as, for example, smart cards, smartphones, computers (e.g., laptop, desktop, or tablet computers), "Internet of Things" (IOT) electronic devices, automotive applications, locks, consumer goods and industrial devices.

BACKGROUND

Fingerprint sensors are found in all kind of devices such as PCs, tablets, smart phones and smart cards for the security and ease of use they provide. The widespread use of fingerprint sensors may also provide a security problem as fingerprint sensors have been spoofed by fake fingerprints produced from latent fingerprints. Current art fingerprint sensors typically attempt to mitigate this problem with additional security measures, such as live finger detection, at the cost of increased false rejection of fingerprints and reduced ease of use.

There is, therefore, a need in the industry for an improved fingerprint sensor that is specifically architected to improve the anti-spoof protection without degrading the ease of use of the fingerprint sensor.

U.S. Pat. No. 8,421,890 "Electronic image using an impedance sensor grid array and method of making" the disclosure of which is hereby incorporated by reference, describes the principles of fingerprint touch sensor implemented with crossing transmit (Tx) and receive (Rx) lines.

U.S. Patent Application Publication No. 2016-0379035 "Double-sided fingerprint sensor" the disclosure of which is hereby incorporated by reference, describes a double-sided fingerprint sensor.

U.S. Patent Application Publication No. 2017-0147852 "Electronic sensor supported on rigid substrate" the disclosure of which is hereby incorporated by reference, describes a flexible fingerprint sensor wrapped around a rigid substrate.

U.S. Patent Application Publication No. 2018-0213646 "Configurable, encapsulated sensor module and method for making same" the disclosure of which is hereby incorporated by reference, describes an encapsulated wrapped fingerprint sensor.

U.S. Pat. No. 9,396,379 "Surface sensor" the disclosure of which is hereby incorporated by reference, describes incorporation of a fingerprint sensor into a cavity in a smart card.

International Patent Publication No. WO/2003/049012, "Packaging solution, particularly for fingerprint sensor" the disclosure of which is hereby incorporated by reference, describes a flexible fingerprint sensor suitable for a smart card.

SUMMARY

The following presents a simplified summary in order to provide a basic understanding of some aspects described herein. This summary is not an extensive overview of the claimed subject matter. It is intended to neither identify key or critical elements of the claimed subject matter nor delineate the scope thereof. Its sole purpose is to present some concepts in a simplified form as a prelude to the more detailed description that is presented later.

In an embodiment, a design of a two-sided flexible substrate to produce a double-sided fingerprint sensor driven by a single ASIC is described.

In another embodiment, a wrapping technique is used to produce a double-sided fingerprint sensor. In this embodiment, a two-sided flexible substrate is wrapped around a core.

In another embodiment, the double-sided fingerprint sensor is produced using two PCBs. In another embodiment, the double-sided fingerprint sensor is produced using multi-layered PCBs.

In another embodiment, a method of packaging the double-sided fingerprint sensor to create a double-sided sensor module is described.

In another embodiment, a double-sided sensor module that is particularly suitable for incorporation into a smart card is described. The double-sided sensor module is designed to be cost-effective to manufacture, and robust enough to pass ISO stress tests for smart cards. The double-sided module can be fitted into smart cards with existing manufacturing methods.

In another embodiment, a method of inserting and securely fixing a double-sided sensor module into the smart card is described.

In some embodiments, a double-sided sensor module may comprise two encapsulated single sensor modules. Each encapsulated single sensor module (e.g., assembly) may comprise a control circuit (e.g., an integrated circuit such as an application specific integrated circuit ("ASIC")). In some embodiments, the two encapsulated single sensor modules may be stacked on top of one another with one of the two encapsulated single sensor rotated in the same plane with respect to the other encapsulated single sensor to facilitate the creation of the double-sided sensor module. In a preferred embodiment, the second sensor is rotated 180 degrees relative to the first sensor, however any degree of rotation is possible. In some embodiments, the double-sided fingerprint sensor module may be incorporated into a PCB frame to interconnect each of the two encapsulated single sensor modules to a controlling processor. The PCB frame may provide interconnection to a host device according to some embodiments.

In some embodiments, the double-sided sensor module may comprise a single piece of double-sided flexible substrate. The single piece of double-sided flexible substrate may comprise two sensing areas, each sensing area connected to a separate ASIC. In some embodiments, the double-sided flexible substrate may be wrapped around a core to create the double-sided sensor module. In some embodiments, each sensing area and respective ASIC may be encapsulated to create two single sensor modules on the single substrate. In such embodiments, the double-sided flexible substrate may comprise two single sensor modules on a top surface of the substrate. The double-sided flexible substrate may be folded to stack the two single sensor modules and create the double-sided sensor module. In some embodiments, the double-sided sensor module may be incorporated into a PCB frame comprising a controlling processor (e.g., a microcontroller unit).

In some embodiments, the double-sided fingerprint sensor module may comprise one single-sided fingerprint sensor.

Other features and characteristics of the subject matter of this disclosure, as well as the methods of operation, functions of related elements of structure and the combination of parts, and economies of manufacture, will become more apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

The accompanying drawings, which are incorporated herein and form part of the specification, illustrate various embodiments of the subject matter of this disclosure. In the drawings, like reference numbers indicate identical or functionally similar elements.

FIGS. 1A-1B illustrate a prior art embodiment of a double-sided fingerprint sensor.

FIGS. 2A-2C shows top plan views of a double-sided flexible substrate used to form a double-sided fingerprint sensor.

FIGS. 9A-C show cross-sectional views of double-sided fingerprint sensors comprising two or more separate PCB boards.

FIGS. 35A-35B show cross-sectional side views of alternate double-sided sensor modules comprising a double-sided fingerprint sensor attached to a PCB.

DETAILED DESCRIPTION

Figure 2A:
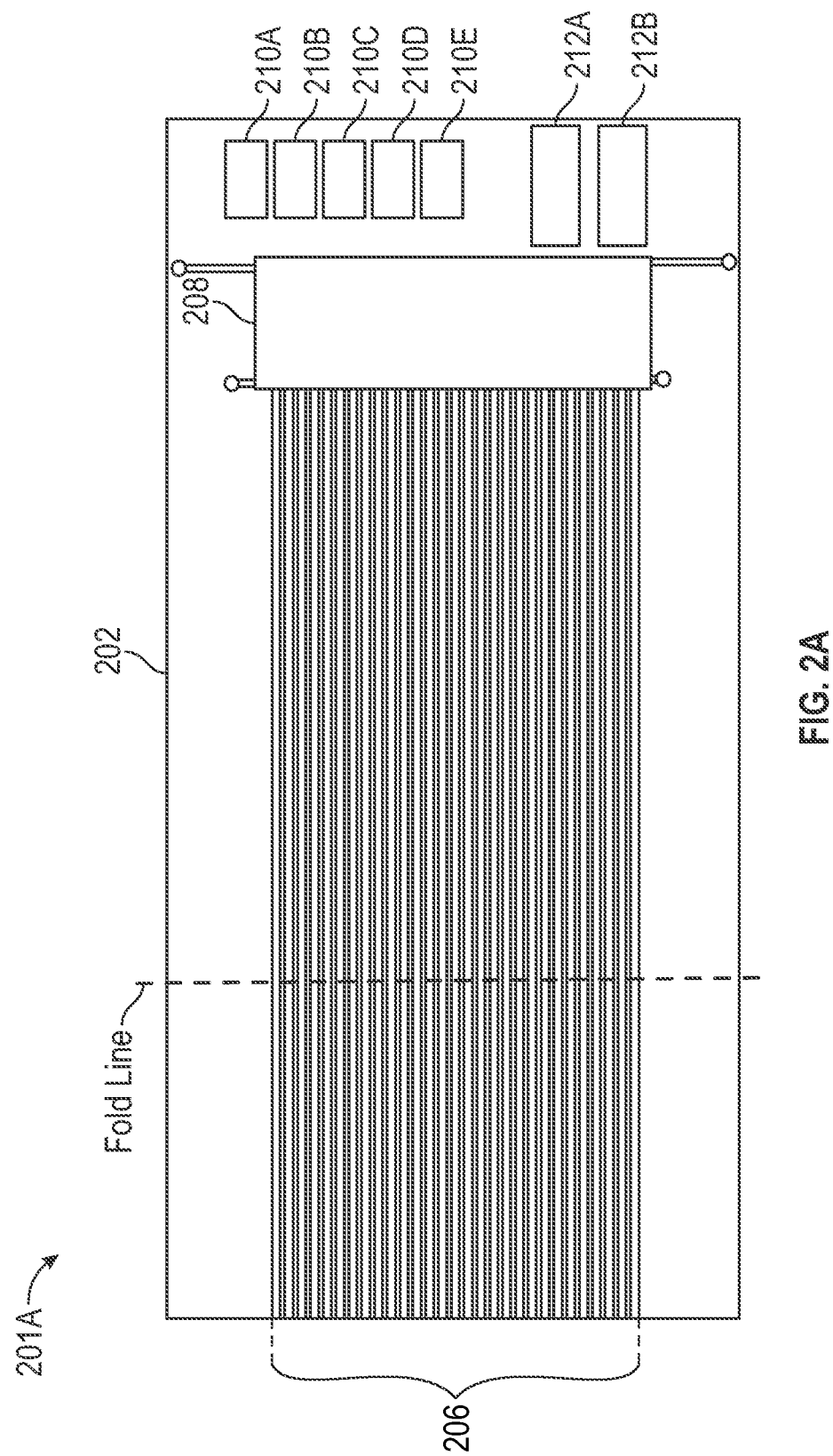

While aspects of the subject matter of the present disclosure may be embodied in a variety of forms, the following description and accompanying drawings are merely intended to disclose some of these forms as specific examples of the subject matter. Accordingly, the subject matter of this disclosure is not intended to be limited to the forms or embodiments so described and illustrated.

Unless defined otherwise, all terms of art, notations and other technical terms or terminology used herein have the same meaning as is commonly understood by one of ordinary skill in the art to which this disclosure belongs. All patents, applications, published applications and other publications referred to herein are incorporated by reference in their entirety. If a definition set forth in this section is contrary to or otherwise inconsistent with a definition set forth in the patents, applications, published applications, and other publications that are herein incorporated by reference, the definition set forth in this section prevails over the definition that is incorporated herein by reference.

Unless otherwise indicated or the context suggests otherwise, as used herein, "a" or "an" means "at least one" or "one or more."

This description may use relative spatial and/or orientation terms in describing the position and/or orientation of a component, apparatus, location, feature, or a portion thereof. Unless specifically stated, or otherwise dictated by the context of the description, such terms, including, without limitation, top, bottom, above, below, under, on top of, upper, lower, left of, right of, in front of, behind, next to, adjacent, between, horizontal, vertical, diagonal, longitudinal, transverse, radial, axial, etc., are used for convenience in referring to such component, apparatus, location, feature, or a portion thereof in the drawings and are not intended to be limiting.

Furthermore, unless otherwise stated, any specific dimensions mentioned in this description are merely representative of an exemplary implementation of a device embodying aspects of the disclosure and are not intended to be limiting.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, the terms "substantially" and "substantial" refer to a considerable degree or extent. When used in conjunction with, for example, an event, circumstance, characteristic, or property, the terms can refer to instances in which the event, circumstance, characteristic, or property occurs precisely as well as instances in which the event, circumstance, characteristic, or property occurs to a close approximation, such as accounting for typical tolerance levels or variability of the embodiments described herein.

As used herein, the terms "optional" and "optionally" mean that the subsequently described, component, structure, element, event, circumstance, characteristic, property, etc. may or may not be included or occur and that the description includes instances where the component, structure, element, event, circumstance, characteristic, property, etc. is included or occurs and instances in which it is not or does not.

In the context of the present disclosure, a "fingerprint" comprises a unique pattern of ridges on the tips of the fingers including the thumb. Accordingly, the term "fingerprint," as used herein, also includes a thumbprint.

Fingerprint sensors are found in all kinds of devices such as PCs, tablets, smart phones and smart cards for the security and ease of use they provide. The widespread use of fingerprint sensors may also provide a security problem as fingerprint sensors have been spoofed by fake fingerprints produced from latent fingerprints. The conventional fingerprint sensors typically attempt to mitigate this problem with additional security measures, such as live finger detection, at the cost of increased false rejection of fingerprints and reduced ease of use. There is, therefore, a need in the industry for an improved fingerprint sensor that is specifically architected to improve the anti-spoof protection without degrading the ease of use of the fingerprint sensor. A fingerprint sensor that could simultaneously capture two prints in a pinching motion using a thumb in combination with a fore finger would be much more difficult to spoof.

One possible method of providing a fingerprint sensor capable of simultaneously detecting two fingerprints is to use two fingerprint sensors. However, using two fingerprint sensors results in double the amount of cost for manufacturing, double the thickness and double the power required to operate the fingerprint sensors. Furthermore, complications involving mounting the two fingerprint sensors on the host device, connecting the two sensors to the host device, and coordinating the various actions of a processor controlling the two separate fingerprint sensors give rise to practical problems for existing manufacturing methods and equipment.

Another possible method of providing a fingerprint sensor capable of simultaneously detecting two fingerprints is to create a single sensor that has two sensing areas. U.S. Patent Application Publication No. 2016-0379035 "Double-sided fingerprint sensor" the disclosure of which is hereby incorporated by reference, describes a fingerprint sensor with two sensing areas as an embedded die package. Such a package may be expensive to manufacture since a pitch of the drive lines and the pickup lines needs to be very small.

Accordingly, there is a need for alternative manufacturing and packaging methods to implement a double-sided fingerprint sensor using a flexible substrate that is practical to manufacture with existing manufacturing methods and equipment. The double sided fingerprint sensor, as will be described in further detail, is capable of providing two sensing areas which are not restricted to a parallel configuration.

Such a double sided fingerprint sensor is particularly suited for use in smart card applications to increase security levels and prevent spoofing.

A smart card, as defined by the Secure Technology Alliance (formally the SmartCard Alliance), is a device in which an integrated circuit, or chip, is embedded. Smart card technology conforms to international standards including ISO/IEC 7816 and ISO/IEC 14443. Accordingly, a person of ordinary skill in the art will understand that a smart card is not restricted to a plastic card. While the plastic card was the initial smart card form factor, technology used for the smart card is now available in a wide variety of form factors, including plastic cards, key fobs, and subscriber identification modules (SIMs) used in GSM mobile phones, watches, electronic passports and USB-based tokens. Smart card applications include, but are not restricted to, bank cards, mobile phone subscriber identification modules (SIM), healthcare cards, government and enterprise ID cards, benefits and social welfare cards, driver's licenses, physical and logical access cards, mass transit (ticketing) cards, and cards that combine multiple applications on a single card.

Smart cards are commonly made of layers of a flexible material, laminated together using heat and pressure to form the finished cards. One or more internal layers may carry a circuit to allow components within the card to be connected together. In contactless cards, an antenna may run around the card to make an RF connection with an external card reader and to transfer power to components within the card.

Bank cards commonly have a secure element component to make contact with terminals of an external card reader, Point of Sale (POS) terminal or Automated Teller Machine (ATM). When a biometric sensor, such as a fingerprint sensor, is placed in a smart card, the sensor must be able to interact with the secure element and existing circuitry (and antenna) within the card.

Smart cards are preferably robust enough to withstand everyday use, e.g. rough handling by the user, repeated insertion into PoS and/or wallet or purse and insertion into the rollers of an ATM machine. The card must have a sufficient life-time to avoid the card provider having to re-issue often.

Smart cards are manufactured in high volumes using standard processes and machinery. It is preferable that a double-sided fingerprint sensor can be readily incorporated into a structurally robust fingerprint sensor module or package and that the single module or package can be readily incorporated into the smart card without major changes being required to standard manufacturing processes.

As used herein, each electronic sensor forms a grid to detect surface features of a proximally located object (such as a fingerprint) at a plurality of locations. In an embodiment, the grid includes a plurality of conductive drive traces, or lines, (or transmit "Tx" lines) which are each connectable to a drive source capable of producing a single frequency, multitoned frequency or binary sequence of pulses of fixed or variable amplitude, and a plurality of conductive pickup traces, or lines, (or receive "Rx" lines) oriented transversely (preferably substantially perpendicular) to the drive lines. The drive lines are preferably substantially parallel to each other, and the pickup lines are preferably substantially parallel to each other. The drive lines are separated from the pickup lines by an insulating (e.g., dielectric) layer. In various embodiments, the insulating dielectric layer separating the drive lines from the pickup lines comprises one or more flexible, insulating dielectric layers.

Each drive line may thus be capacitively coupled to a pickup line through the dielectric layer. The drive lines can form one axis (e.g., X-axis) of the grid, while the pickup lines form another axis (e.g., Y-axis) of the grid. Each location where a drive line and a pickup line overlap may form an impedance-sensitive electrode pair whereby the overlapping portions of the drive and pickup lines form opposed plates of a capacitor separated by a dielectric layer or layers. This impedance-sensitive electrode pair may be treated as a pixel (e.g., an X-Y coordinate) at which a surface feature of the proximally located object is detected by variations in a signal detected at each pickup line due to a change in capacitance cause by contact with or near the pickup line. The grid forms a plurality of pixels that can collectively create a map of the surface features of the proximally located object. For instance, the pixels of the grid can map locations where there are ridge and valley features of the finger surface touching the electronic sensor. The map can be used as an identifying pattern to match with ridge/valley patterns stored in a database. Additional details of a fingerprint sensor with overlapping drive lines and pickup lines as well as the drive, sense, and scanning electronics, are discussed in U.S. Pat. No. 8,421,890, entitled "Electronic imager using an impedance sensor grid array and method of making," and U.S. Pat. No. 8,866,347, entitled "Biometric sensing", the respective disclosures of which are incorporated by reference in their entirety. Further improvements and enhancements to the devices, methods, and circuitry used to improve the sensitivity of the measurement principal employing a sensor grid comprised of overlapping drive lines and pickup lines separated by a dielectric including the drive, sense, scanning, and noise reduction electronics, are described in U.S. Patent Application Publication No. 2016/0188951, entitled "Fingerprint Sensor Employing an Integrated Noise Rejection Structure" the disclosure of which is incorporated by reference in its entirety.

In the context of the present disclosure, a "sensor element" comprises an arrangement of one or more components configured to produce a signal based on a measurable parameter (e.g., capacitance, light/optics, heat/thermal, pressure, etc.), characteristics of which will vary based on the presence or absence of an object that is in local proximity to the sensor element. A fingerprint sensor will comprise an array of such sensor elements configured to produce a signal based on a portion of the surface of a finger placed on or near the fingerprint sensor. The sensitivity of each of the sensor elements of the fingerprint sensor is such that characteristics of the signal produced at each sensor element will vary based on surface features of the portion of finger placed on or near the array, and the varying characteristics of signals produced at each sensor element may be combined or otherwise processed to form a data file with an actual or virtual "image" of the fingerprint of the portion of the finger surface placed on or near the array.

Specific examples of such sensor elements may include, but are not restricted to, capacitive, optical, thermal, and pressure sensor elements. As an illustrative example, two types of capacitive sensor elements that may be employed in a fingerprint sensor are mutual capacitance sensor elements and self-capacitance sensor elements. An array of mutual capacitance sensor elements comprises a plurality of spaced apart drive lines and a plurality of spaced apart pickup lines arranged transversely to the drive lines and spaced from the drive lines by a dielectric material. Each intersection of the pickup lines and the drive lines constitutes a mutual capacitance sensor element configured to produce a signal indicative of a capacitance change due to the presence or absence of a portion of an object that is in local proximity to the mutual capacitance sensor element. An array of self capacitance sensor elements comprises a first plurality of spaced apart conductive lines and a second plurality of spaced apart conductive lines arranged transversely to the first plurality of spaced apart conductive lines. Each conductive line of the first and second plurality of conductive lines is configured to transmit a signal to the finger surface placed in detectable proximity and receive a resultant signal. Accordingly, each conductive line constitutes a self-capacitance sensor element configured to produce a signal indicative of a capacitance change due to the presence or absence of a portion of an object that is in local proximity to the self capacitance sensor element.

While aspects of this disclosure are presented in the context of specific types of sensor elements and fingerprint sensor configurations, it should be appreciated that implementations of those aspects are not necessarily limited to a specific type of type of sensor elements of fingerprint sensor configuration or the specific type of types of sensor elements of fingerprint sensors described herein.

Wrapped Flexible Sensor with Two-Sensing Areas

FIGS. 1A-1B illustrate a double-sided sensor as described in U.S. Patent Application Publication No. 2016-0379035. As shown in FIG. 1A, the double sided sensor 102 uses embedded die package technology and includes a substrate core sandwiched between top module layers and bottom module layers and an application specific integrated circuit ("ASIC") connected to the top sensor grid and a bottom sensor grid (not shown in FIG. 1A). FIG. 1B illustrates a magnified area of the double-sided sensor and shows that tight tolerances are necessary to achieve the drive (Tx) lines and the pickup (Rx) lines. Such tight tolerances are challenging to achieve with traditional multilayer rigid printed circuit board technology. Specifically, the challenge is to achieve both fine pitch wiring, i.e. narrow line width (circuit line width), and narrow space (air gap) between adjacent lines (circuit lines)—as well as the tolerances on the small dimensions of the drive (Tx) lines, pickup (Rx) lines, vias, and routing lines, as shown in FIG. 1B. In a non-limiting embodiment, the double-sided sensor may comprise 15 µm trace width and 20 µm air gap, with +/−10~20% tolerance on the small dimensions of the drive (Tx) lines, pickup (Rx) lines, vias, and routing lines.

An alternative packaging solution for a double-sided fingerprint sensor is to implement the use of a flexible substrate with conductive drive and pick up traces formed thereon that is wrapped around a rigid substrate, for example, as described in U.S. Patent Application Publication No. 2017-0147852 "Electronic sensor supported on rigid substrate" the disclosure of which is hereby incorporated by reference.

Figure 2C:
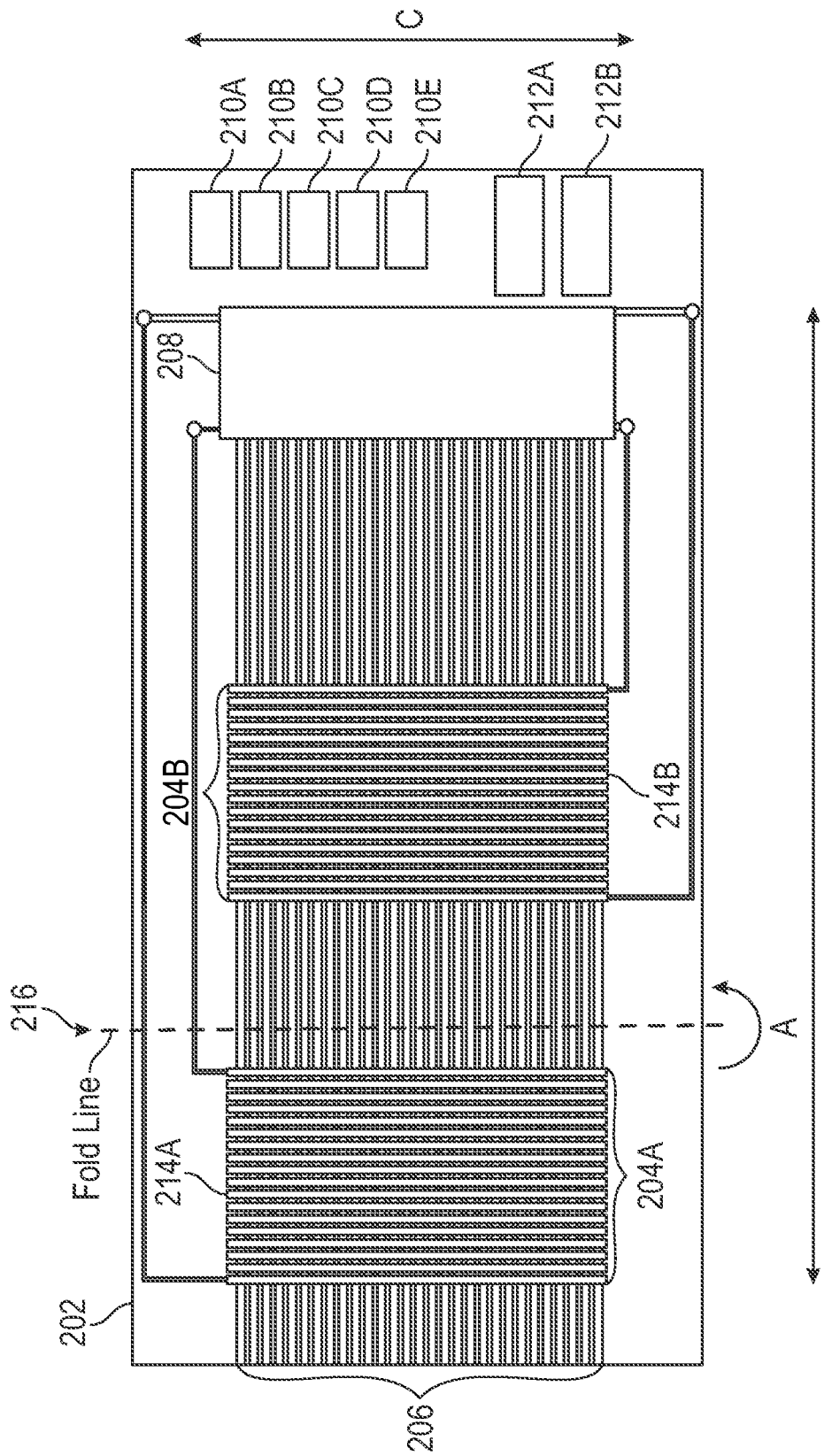

FIGS. 2A-2C illustrate a double-sided flexible substrate 202 used to form a double-sided fingerprint sensor, according to an exemplary embodiment. The double-sided flexible substrate 202 comprises a flexible dielectric substrate, which may be a polymer-based substrate (e.g. polyimide), such as Kapton® or Upilex®, and sensor elements comprising a plurality of conductive traces made of a suitable conductive material, such as copper, tin, silver, nickel, aluminum, or gold are formed, etched, deposited, plated, printed, or otherwise applied to or embedded into each surface, or side, of the double-sided flexible substrate 202. The pluralities of conductive traces may be utilized as drive lines and pickup lines of the double-sided flexible substrate 202. As shown in FIG. 2A, a first surface 201A of the double-sided flexible substrate 202 may comprise a plurality of pickup (Rx) lines 206, an ASIC 208, and additional passive components including capacitors 210A-E and inductors 212A-B. Each of the plurality of pickup lines 206 is separately connected to the ASIC 208. FIG. 2B shows a second surface 201B of the double-sided flexible substrate 202. The second surface 201B of the double-sided flexible substrate 202 may comprise a first plurality of drive (Tx) lines 204A and a second plurality of drive (Tx) lines 204B. Each drive line is electrically connected to the ASIC 208 on the first surface 201A by interconnect lines 218A-B (for simplicity, only four interconnect lines are shown). Although only four drive lines are shown as connected to the ASIC 208, each drive line of the first and the second plurality of drive lines 204A-B is separately connected to the ASIC 208 on the first surface 201A by vias 219A-B extending through the double-sided flexible substrate 202. In another embodiment, the ASIC 208, capacitors 210A-E, and inductors 212A-B may be mounted on the second surface 201B of the double-sided flexible substrate. In this embodiment, each of the first plurality of drive (Tx) lines 204A and the second plurality of drive (Tx) lines 204B is directly connected to the ASIC 208 and each of the pickup (Rx) lines 206 is separately connected to the ASIC 208 on the second surface 201B by vias extending through the double-sided flexible substrate 202.

In some embodiments, the first surface 201A of the double-sided flexible substrate 202 may comprise a plurality of drive (Tx) lines, the ASIC 208, and additional passive components including capacitors 210A-E and inductors 212A-B. Each of the plurality of drive lines is separately connected to the ASIC 208. In this embodiment, the second surface 201B of the double-sided flexible substrate 202 may comprise a first plurality of pickup (Rx) lines and a second plurality of pickup (Rx) lines. Each pickup line is electrically connected to the ASIC 208 on the first surface 201A by interconnect lines and vias extending through the double-sided flexible substrate 202. In some embodiments, the ASIC 208, capacitors 210A-E, and inductors 212A-B may be mounted on the second surface 201B of the double-sided flexible substrate. In this embodiment, each of the first plurality of pickup (Rx) lines and the second plurality of pickup (Rx) lines is directly connected to the ASIC 208 and each of the drive (Tx) lines is separately connected to the ASIC 208 on the second surface 201B by vias extending through the double-sided flexible substrate 202.

FIG. 2C is a top plan view of the double-sided flexible substrate 202 where the first and second plurality of drive lines 204A-B are superimposed on the plurality of pickup lines 206 with a dielectric layer (i.e., the flexible substrate) separating the drive lines and the pickup lines. As shown in FIG. 2C, two separate sensing areas 214A-B are formed at the portions of the double-sided flexible substrate 202 where the pickup lines 206 overlap with the first and the second plurality of drive lines 204A-B. In an alternative embodiment, the double-sided flexible substrate 202 may comprise a first and a second plurality of pickup lines with a shared plurality of drive lines to form the first and second sensing areas 214A-B. Accordingly, the two separate sensing areas 214A-B are formed at the portions of the double-sided flexible substrate 202 where the drive lines overlap with the first and the second plurality of pickup lines. In some embodiments, the first and second sensing areas 214A-B may each comprise a sensing area of 9×9 mm. In some embodiments, the first and second sensing areas 214A-B may each comprise a sensing area of 4.5×9 mm. However, these values are not required and the first and second sensing areas 214A-B may comprise varying sensing areas in alternative embodiments.

In some embodiments, the length of the double-sided flexible substrate 202 along direction B may be between 45-55 mm and the width of the double-sided flexible substrate 202 along direction C may be between 15-25 mm. In some embodiments, the distance between the first and second sensing areas 214A-B along direction B may be between 6-7 mm. In some embodiments, the distance between the first sensing area 214A and an end of the double-sided flexible substrate 202 along direction B may be between 3-4 mm. However, these values are not required and the length, width, and distances may vary in alternative embodiments. In some embodiments, the total area of the double-sided flexible substrate 202 may be reduced by moving the ASIC 208 and the passive components including capacitors 210A-E and inductors 212A-B to a separate printed circuit board (PCB) connected via an Anisotropic Conductive Film (ACF).

In some embodiments, the first plurality of lines 204A and the second plurality of lines 204B (be they drive lines or pickup lines) are not spatially separate as shown in FIG. 2A and form a continuous arrangement of lines. The distance between the first plurality of lines 204A and the second plurality of lines 204B may vary in alternative embodiments.

To produce a double-sided fingerprint sensor, the double-sided flexible substrate 202 is at least partially wrapped around a core. In an embodiment, the core is placed on the top surface of a portion of the double-sided flexible substrate 202 containing the sensing area 214B closer to the ASIC 208 and a portion of the double-sided flexible substrate 202 containing the other sensing area 214A is folded over the core along the fold line 216 in direction A. In the illustrated embodiments, the distance between the sensing area 214A and the sensing area 214B is greater than the height of the short edge of the core between the top and bottom surfaces so that the double-sided flexible substrate 202 partially wrapped around the core in direction A forms one sensing area 214A positioned over the top surface of core and the other sensing area 214B positioned over the bottom surface of the core. In some embodiments, the double-sided flexible substrate 202 may contain a single sensing area (i.e., there is no spatial separation between groups of conductive lines 204A, 204B). In this embodiment, the double-sided flexible substrate 202 is wrapped around the core in direction A so that a portion of the single sensing area overlies a bottom surface of the core, a portion of the single sensing area overlies a top surface of the core, and a portion of the single sensing area is wrapped around the core. In some embodiments, a molding compound encapsulant is used to encapsulate the ASIC 208 and form the core on the top surface of the portion of the double-sided flexible substrate 202 containing the sensing area 214B. Accordingly, one sensing area 214A is positioned on a first surface of the core while the other sensing area 214B is positioned on a second surface of the core. In some embodiments, the outer surface of the at least partially wrapped double-sided flexible substrate 202 may comprise a plurality of drive (Tx) lines as described in FIGS. 2A-2B. In some embodiments, the outer surface of the at least partially wrapped double-sided flexible substrate 202 may comprise a plurality of pickup (Rx) lines as described in FIGS. 2A-2B. In some embodiments, the double-sided flexible substrate 202 is wrapped such that the first surface 201A overlies and faces the first and second surfaces of the core. In some embodiments, the double-sided flexible substrate 202 is wrapped such that the second surface 201B overlies and faces the first and second surfaces of the core. The first and second surfaces may constitute top and bottom (i.e., parallel) surfaces, or the first and second surfaces may be non-parallel.

In an embodiment, the core can be rigid or semi-rigid, e.g. glass, plastic, ceramic, PCB board, or could be flexible, e.g. polyester, FR4, a polymer. The core has a stiffener function, but may be chosen to allow the wrapped double-sided fingerprint sensor to bend and/or twist, depending on the end user application. In an embodiment, the core does not need to be continuous. For example, the core may comprise cut-outs to allow mounting of components such as interconnect components, as will be further described below. In another embodiment, an encapsulant, such as a non-conductive dielectric material, is applied directly to a surface of the double-sided flexible substrate 202 to form an encapsulant core, as will be further described below.

Figure 3:
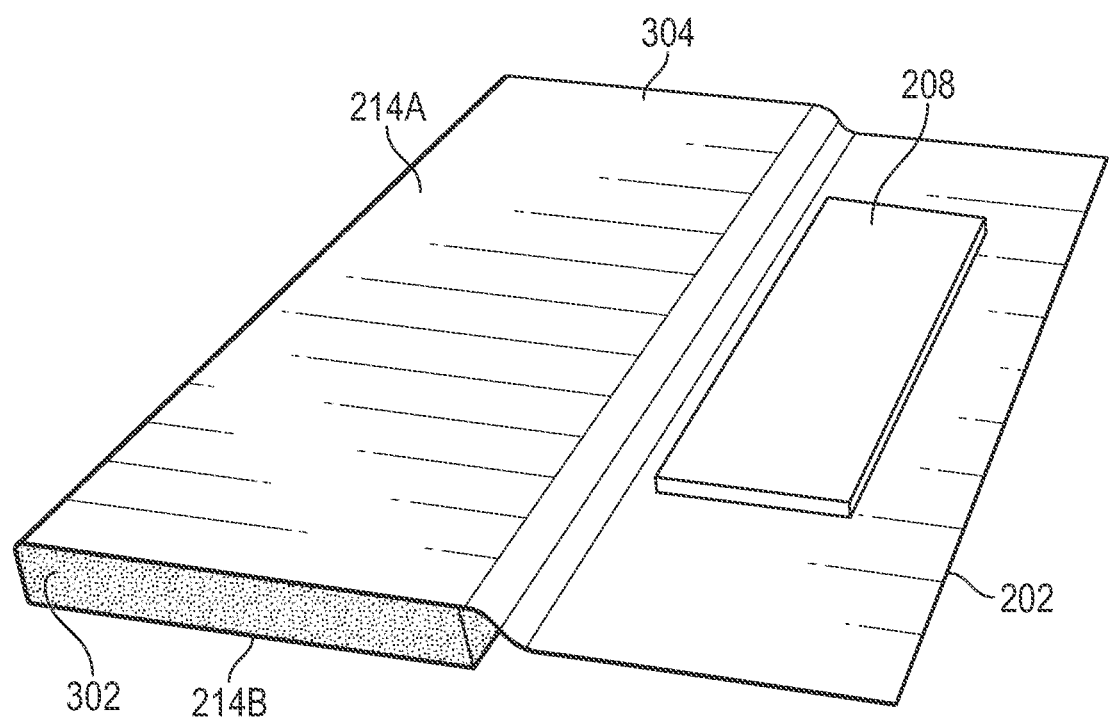
FIG. 3 illustrates the double-sided flexible substrate wrapped around a cuboid shaped core to form the double-sided fingerprint sensor.

In an embodiment, the double-sided flexible substrate 202 is wrapped around a cuboid shaped core 302 to form the double-sided fingerprint sensor 304, as illustrated in FIG. 3. Accordingly, one sensing area 214A is positioned on a top surface of the core 302 and the other sensing area 214B is positioned on a bottom surface of the core 302. In this illustrated embodiment, a portion of the double-sided flexible substrate 202 containing the ASIC 208 is not wrapped around the core 302 and may be used as a host device connection tab to connect the sensor to a host device.

Figure 4A:
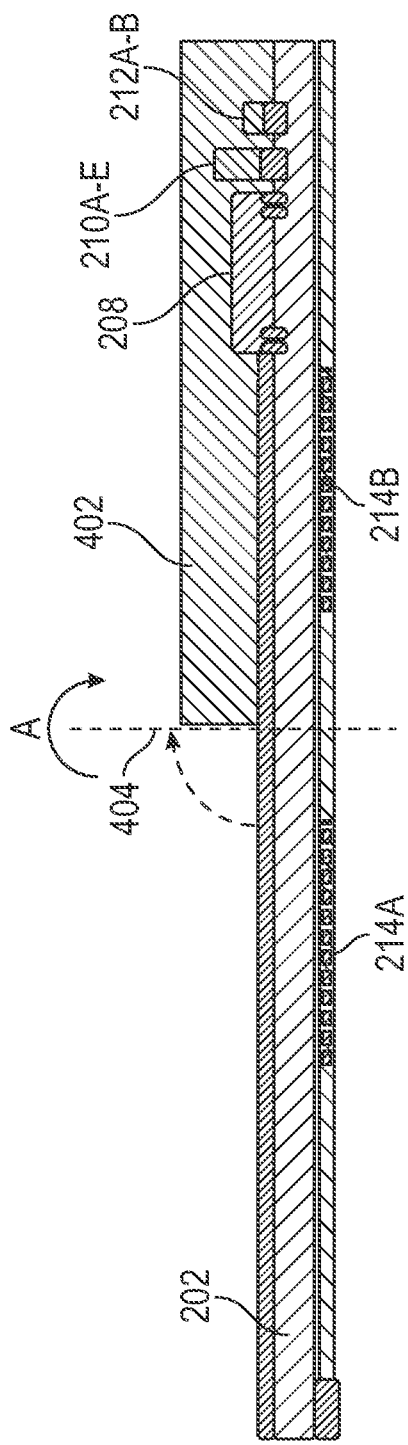
FIGS. 4A-4C show cross-sectional views of embodiments of the double-sided fingerprint sensor.
Figure 4B:
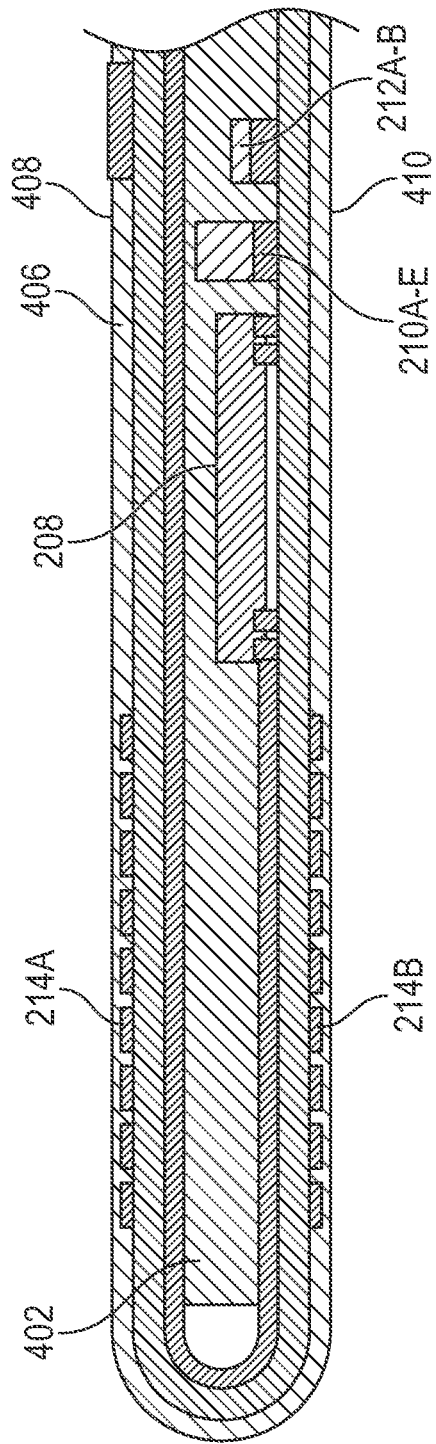
Figure 4C:
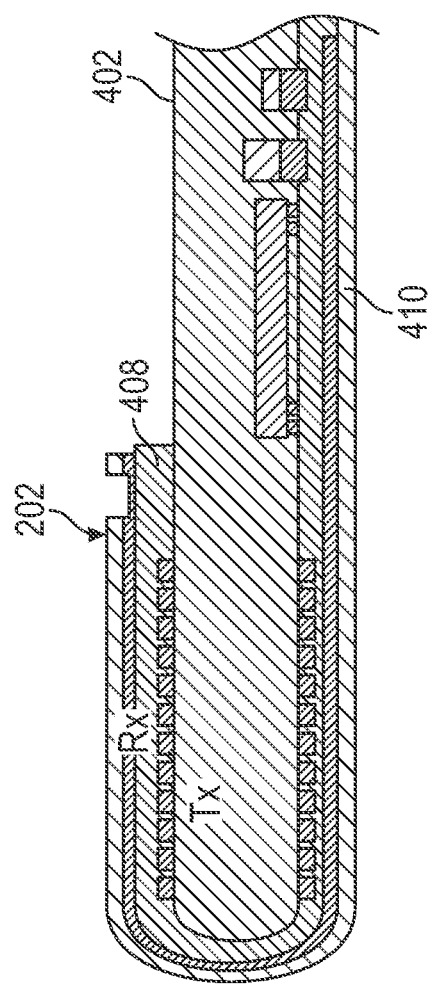

FIGS. 4A-4C show cross-sectional views of other embodiments of the double-sided fingerprint sensor. As shown in FIG. 4A, an encapsulant 402, such as a molding compound non-conductive dielectric material, is applied (e.g., over-molded) on a portion of a top surface of the double-sided flexible substrate 202 to encapsulate the ASIC 208, the capacitors 210A-E, and the inductors 212A-B and form an encapsulant core 402. The encapsulant core 402 covers the top surface of a portion of the flexible substrate 202 containing the sensing area 214B closer to the ASIC 208. A top surface of a portion of the double-sided flexible substrate 202 containing the other sensing area 214A is not covered by the encapsulant and that portion is folded over the encapsulant core 402 along a fold axis 404 in direction A to form the double-sided fingerprint sensor 406 with sensing areas 214A, 214B disposed on opposed sides of the encapsulant core 402. An exemplary embodiment of the folded double-sided fingerprint sensor 406 is shown in FIG. 4B. As shown in FIG. 4B, one sensing area 214A is positioned on a top surface of the double-sided fingerprint sensor 406 and the other sensing area 214B is positioned on a bottom surface of the double-sided fingerprint sensor 406.

As shown in FIG. 4C, in an embodiment, a folded over portion 408 of the double-sided flexible substrate 202 does not have to cover the entire top surface of the encapsulant core 402. For example, the folded over portion 408 of the double-sided flexible substrate 202 may be shorter than the length of the encapsulant core 402 along direction B, while a portion 410 of the double-sided flexible substrate 202 covered by the encapsulant core 402 stretches along the length of the encapsulant core 402 in direction B, as illustrated in FIG. 4C. In another embodiment, the folded over portion 408 of the double-sided flexible substrate 202 may be longer than the length of the encapsulant core 402 in direction B.

Figure 5A:
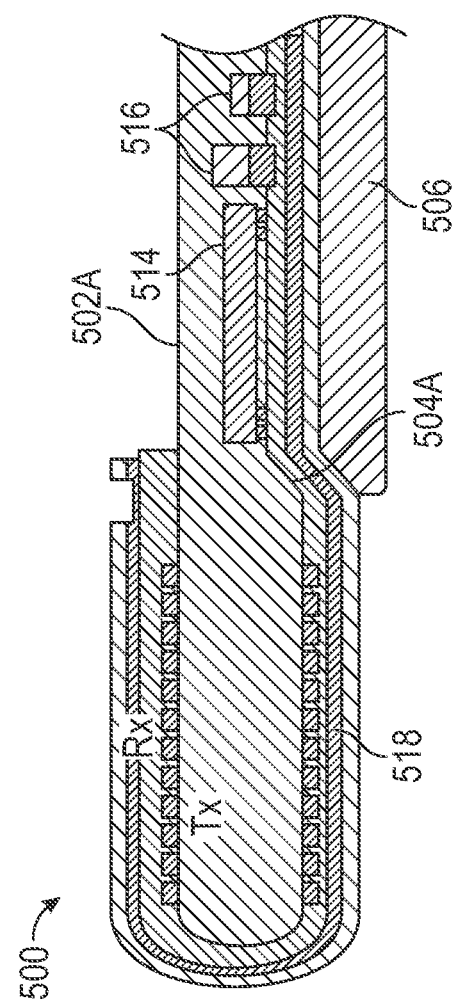
FIGS. 5A-5H illustrate embodiments of double-sided fingerprint sensors comprising different core shapes.
Figure 5B:
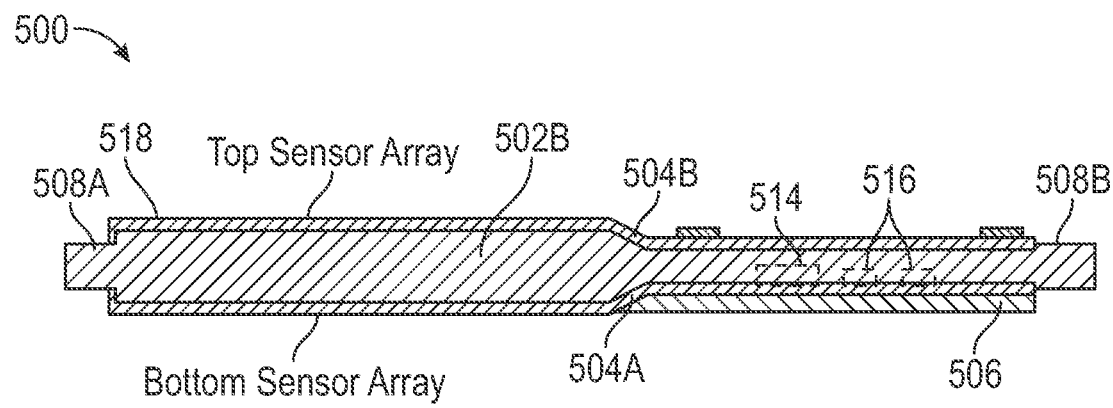
Figure 5C:
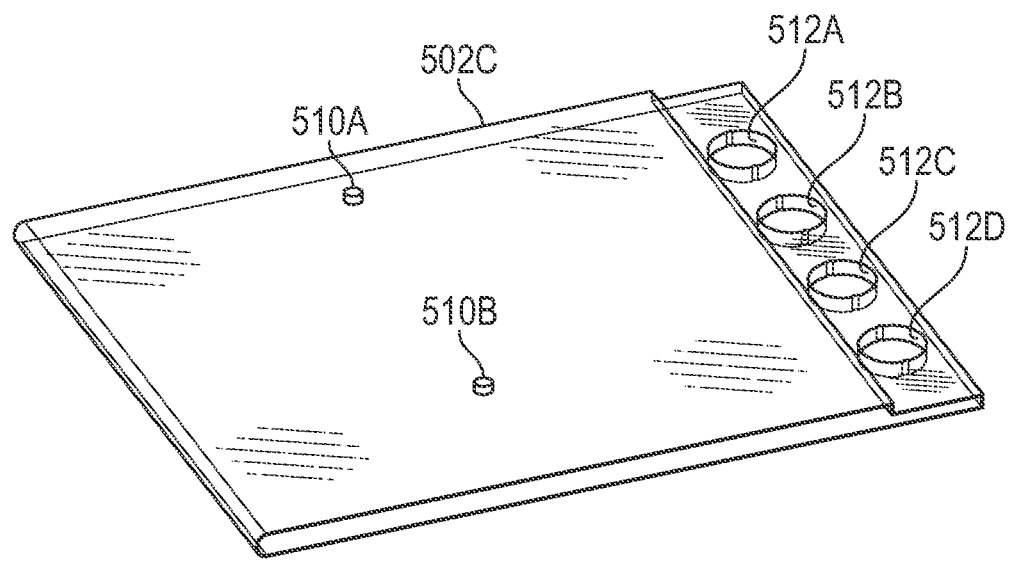

FIGS. 5A-5C illustrate embodiments of double-sided fingerprint sensors 500 comprising different core shapes that can be created when a molding compound encapsulant is used to form the encapsulant core 502A-B. FIG. 5A illustrates an encapsulant core 502A comprising an angled step 504A. FIG. 5B illustrates another embodiment of the encapsulant core 502B comprising two angled steps. In this embodiment, the encapsulant core 502B comprises an angled step 504A on the bottom surface of the encapsulant core 502B and an angled step 504B on the top surface of the encapsulant core 502B. The angled step 504A in FIGS. 5A-5B slightly elevates the ASIC 514 and the passive components 516, such as capacitors and inductors, mounted on the inside surface of the double-sided flexible substrate 518 so that a stiffener layer 506 may be placed underneath the outer surface of a portion of the double-sided flexible substrate 518 comprising the components. The stiffener 506 layer provides an extra layer of protection for the ASIC 514 and the passive components 516.

Figure 5D:
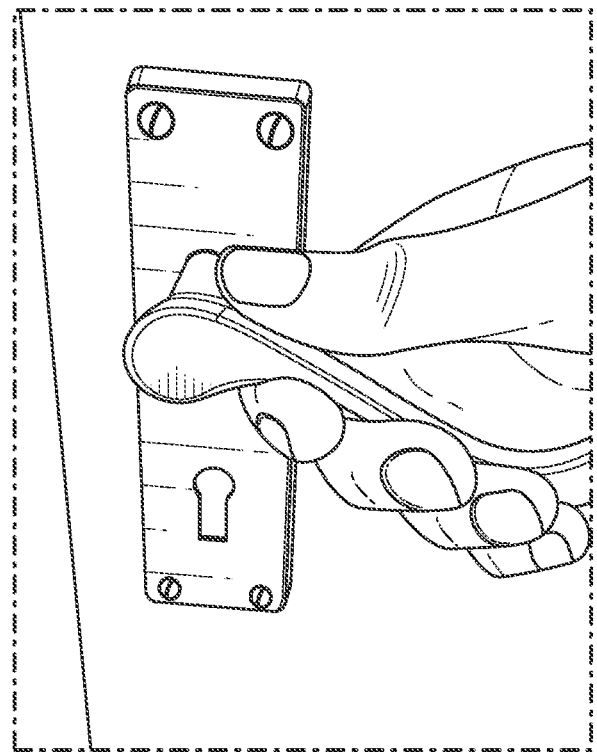
Figure 5E:
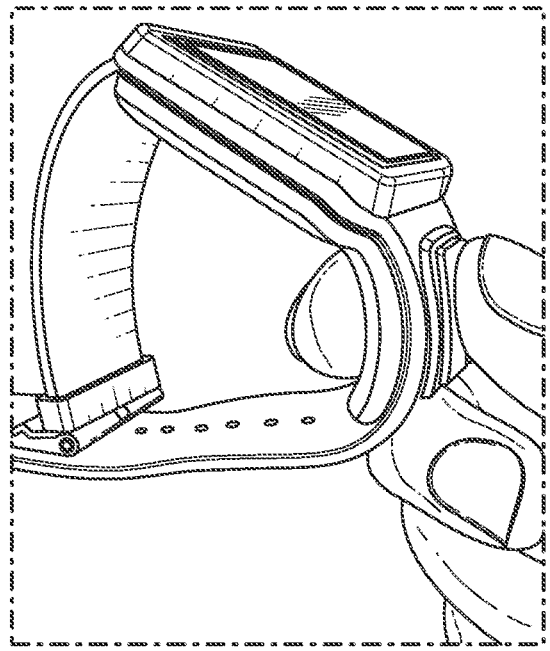
Figure 5F:
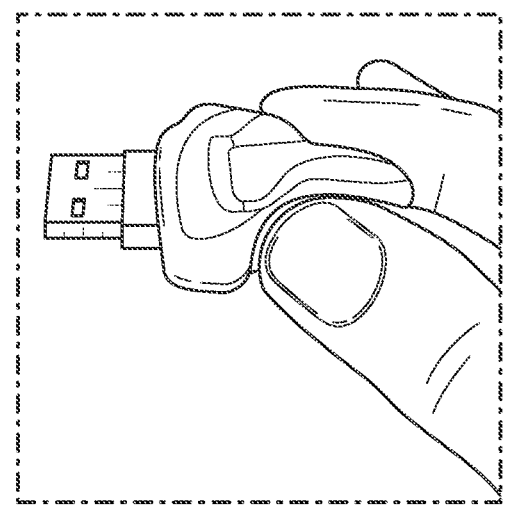
Figure 5G:
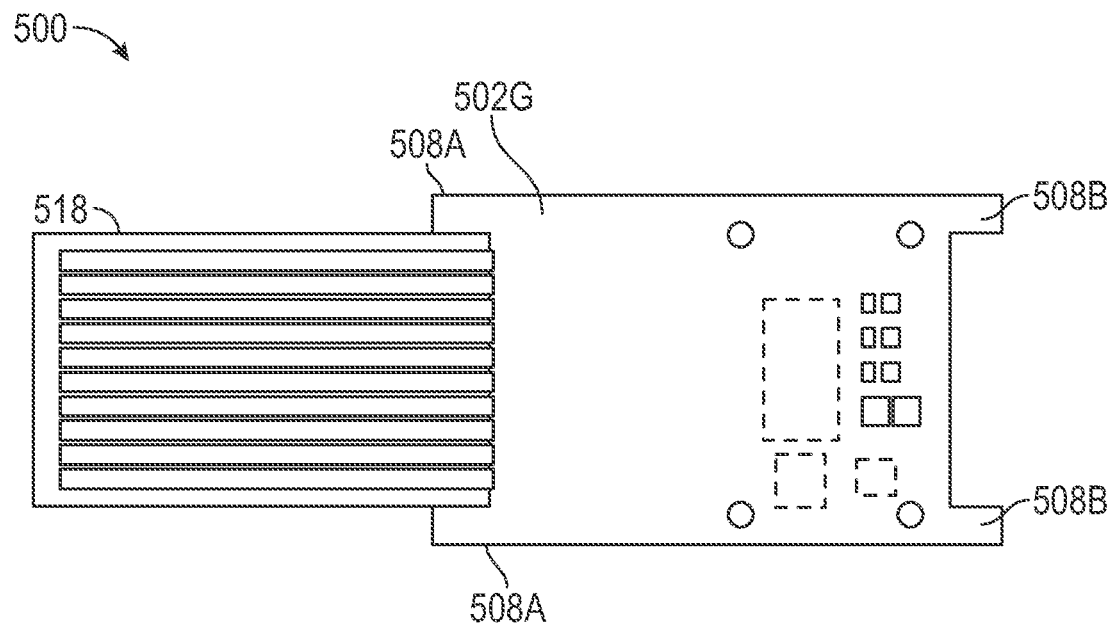
Figure 5H:
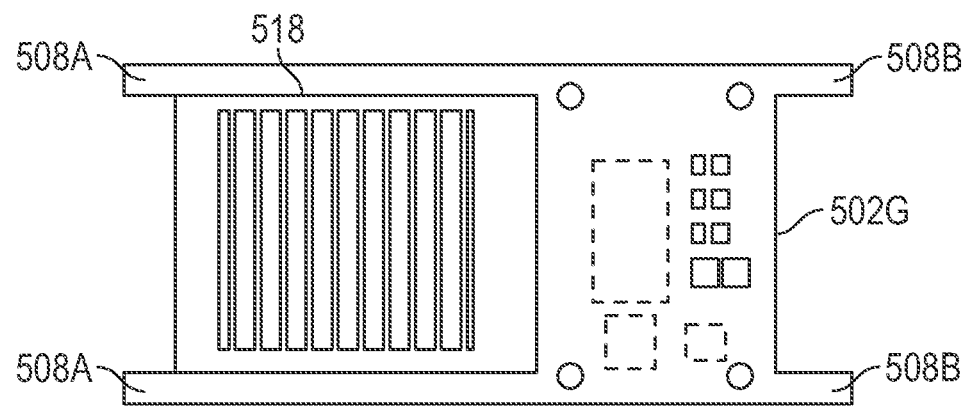

FIGS. 5G-5H illustrate a top view of an encapsulated core 502G comprising two prongs 508A-B with a double-sided flexible substrate 518. In some embodiments, the encapsulated core 502G is extended and specially shaped to further comprise the two prongs 508A-B. The two prongs 508A-B may be used to facilitate the mounting of the fingerprint sensor 500 into a host device. FIG. 5G shows the assembly before the a double-sided flexible substrate 518 is wrapped over the top surface of the core 502G and FIG. 5H shows the assembly after the a double-sided flexible substrate 518 is wrapped over the top surface of the core 502G.

FIG. 5C illustrates an embodiment of the encapsulant core 502C comprising one or more integral mounting pins and one or more cutouts. The integral mounting pins 510A-B are used to secure a flexible substrate when wrapped around the encapsulant core 502C and the cutouts 512A-D are used to facilitate mounting of the wrapped double-sided fingerprint sensor onto a host device using interconnection components, as will be described in further detail in FIGS. 6A-6D. In an embodiment, there may be any number of integral mounting pins and cutouts depending on the application of the wrapped double-sided fingerprint sensor.

Accordingly, the flexible substrate can be wrapped around a core of various shapes and sizes. There are numerous real-life "internet of things" devices that could incorporate a double-sided sensor wrapped around a core with non-parallel sides, ranging from wearables, stylus devices, smart watches, door locks, padlocks, USB modules, automotive components, home appliances, levers, joysticks, knobs, among others. An appropriately shaped core may enable double-sided wrappers applied to a door knob (FIG. 5D), a wrist band of a wearable electrical device (FIG. 5E), and a USB base (FIG. 5F).

Figure 6A:
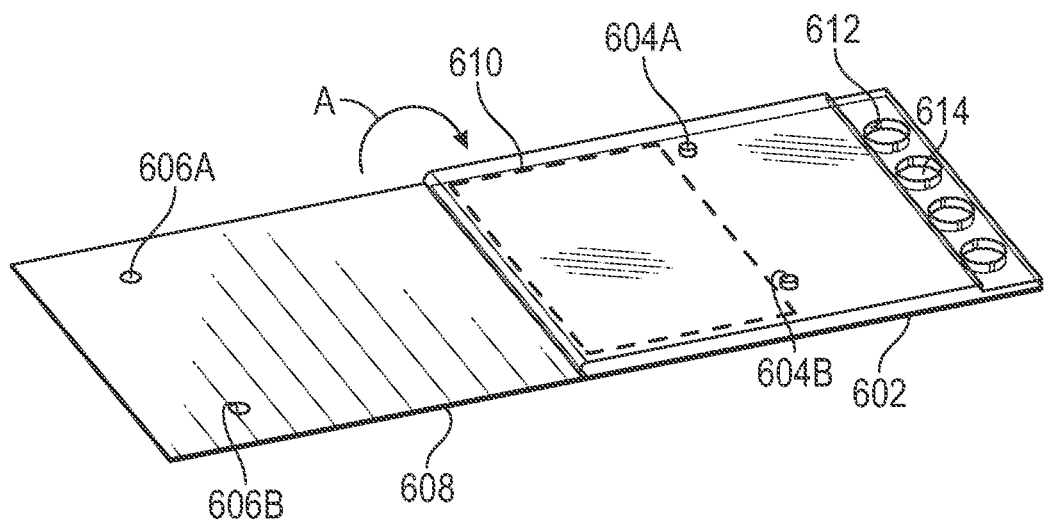
FIGS. 6A-6D illustrate a method of securely wrapping a flexible substrate around an encapsulant core.
Figure 6B:
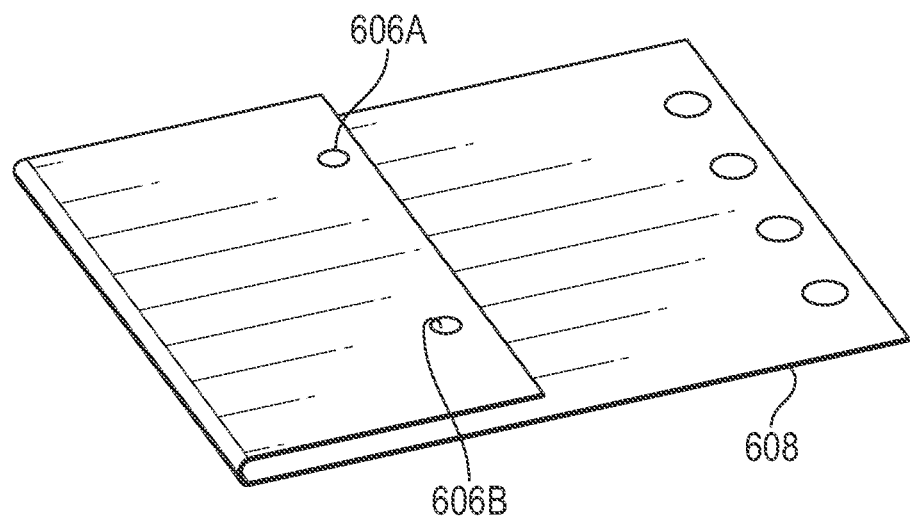
Figure 6C:
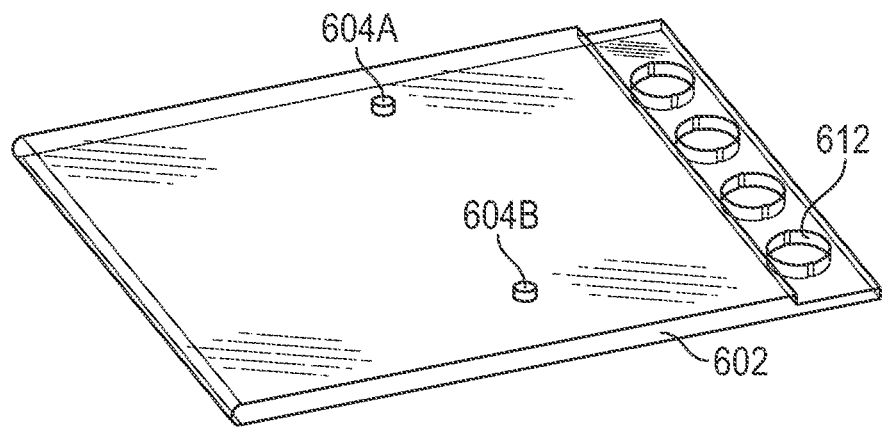
Figure 6D:
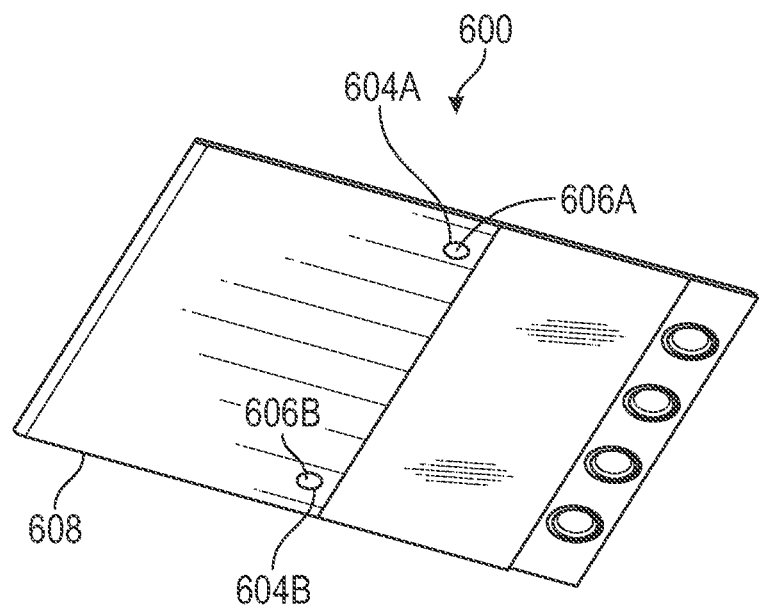

FIGS. 6A-6D illustrate a system and method of securely wrapping a flexible substrate 608 around an encapsulant core 602 that may be similar to core 502C shown in FIG. 5C. As shown in FIG. 6A, the encapsulant core 602 comprises mounting pins 604A-B integrally molded and positioned on a top surface for securing a flexible substrate 608 when wrapped around the core 602. The flexible substrate 608 comprises alignment holes 606A-B positioned to align with the mounting pins 604A-B when the flexible substrate 608 is folded over the core 602 in direction A. In some embodiments, the encapsulant core 602 may comprise integrally molded alignment holes and the flexible substrate 608 may comprise mounting pins. In this embodiment, the mounting pins on the flexible substrate 608 are positioned to align with and fit into the integrally molded alignment holes of the encapsulant core 602 when the flexible substrate 608 is folded over the core 602 in direction A. In some embodiments, the flexible substrate 608 may comprise at least one mounting pin and at least one alignment hole. In this embodiment, the encapsulant core 602 may comprise at least one integrally molded alignment hole and at least one integrally molded mounting pin positioned so that the at least one integrally molded alignment hole receives the at least one mounting pin of the flexible substrate 608 and the at least one integrally molded mounting pin fits into the least one alignment hole of the flexible substrate 608 when the flexible substrate 608 is folded over the core 602. In an embodiment, adhesive is applied to an area 610 of a top surface of the encapsulant core 602 to be covered by the flexible substrate 608. FIG. 6B shows the folded flexible substrate 608 (without the encapsulating core present) and FIG. 6C shows the encapsulant core 602 (without the folded flexible substrate present), respectively, to illustrate how the alignment holes 606A-B on the folded flexible substrate 608 are positioned in relation to the mounting pins 604A-B on the encapsulant core 602. FIG. 6D shows the flexible substrate 608 folded over the encapsulant core 602 and secured by the alignment holes 606A-B fixed over the mounting pins 604A-B. In an embodiment, once the flexible substrate 608 is securely folded over the encapsulant core 602, a bonding tool applies temperature and light pressure to the portion of the top surface of the encapsulant core 602 with the applied adhesive to snap-cure the adhesive. This ensures the flatness of the sensor surface. In some embodiments, the flexible substrate 608 may be a single-sided flexible substrate or a double-sided flexible substrate.

In some embodiments, cutouts 612 may be formed in the core 602 around one or more conductive pads 614 formed on the flexible substrate 608. In some embodiments, the cutouts 612 are configured to be of the appropriate size and position to fit around electrical interconnects such as compressible conductive bumps, e.g., ACA (Anisotropic Conductive Adhesive) bumps, applied on the conductive pads 614 as will be described in more detail in FIGS. 15A-15D, 22A-22B, and 23B.

Figure 7A:
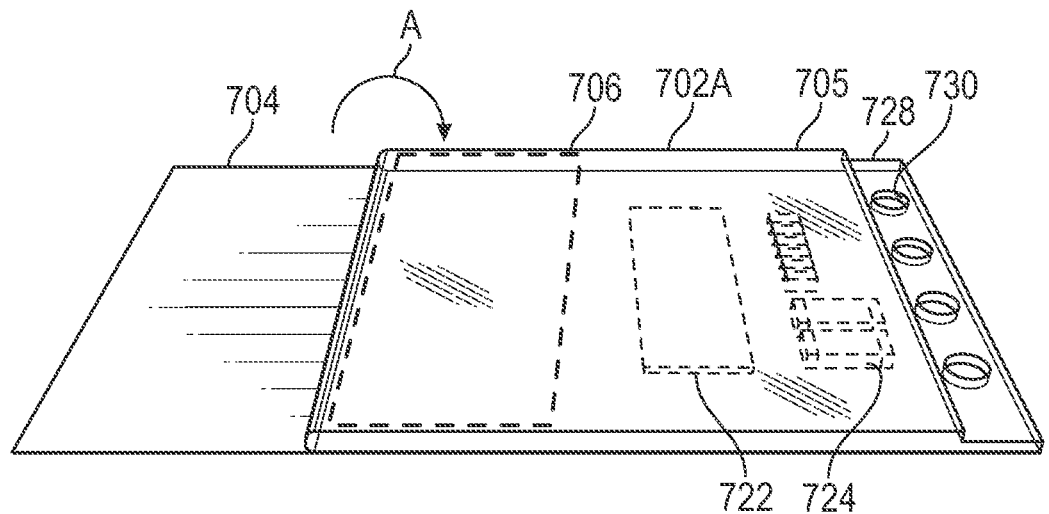
FIGS. 7A-7L illustrate alternative methods of securely wrapping a flexible substrate around an encapsulant core.

FIGS. 7A-7E illustrate alternative systems and methods of securely wrapping a flexible substrate around a core. In an embodiment, the flexible substrate used in any of the methods described by FIGS. 7A-7E may be a single-sided flexible substrate or a double-sided flexible substrate. FIG. 7A shows an encapsulant core 702A placed or formed on a surface of the flexible substrate 704. In this embodiment, a top surface of the encapsulant core 702A on which the uncovered portion of the flexible substrate 704 will be folded over is continuous and flat. Adhesive 706 is applied to the surface of the encapsulant core 702A and the uncovered portion of the flexible substrate 704 is subsequently folded over the core 702A in direction A. In an embodiment, once the flexible substrate 704 is securely folded over the encapsulant core 702A, a bonding tool applies temperature and light pressure to the portion of the top surface of the encapsulant core 702A with the applied adhesive to snap-cure the adhesive. In some embodiments, the encapsulant core 702A may include a first portion 705 encapsulating an ASIC 722 and the passive components 724 and a step 728 having a different thickness (e.g., less thickness) than the first portion 705. Openings 730 may optionally be molded into the step 728. In an embodiment, these openings 730 expose conductive pads on the flexible substrate 704 to facilitate electrical interconnection to the host device. In some embodiments, the encapsulant core 702A may be of uniform thickness, and the openings 730 may optionally be molded into a portion of the encapsulant core 702A.

Figure 7B:
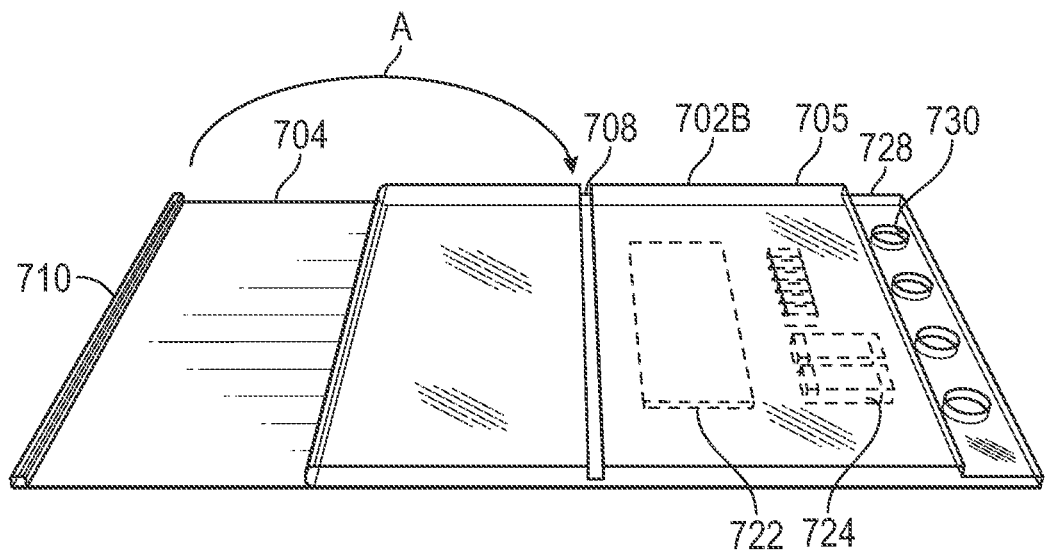

FIG. 7B illustrates another system and method of securely wrapping a flexible substrate around an encapsulant core. In this embodiment, an encapsulant core 702B and a retainer bar 710 are formed on or secured to a surface of the flexible substrate 704. The retainer bar 710 is formed on the edge of the uncovered portion of the flexible substrate 704. The encapsulant core 702B comprises an integral slot 708 parallel to the retainer bar 710 on the top surface. The integral slot 708 is positioned on the top surface of the encapsulant core 702B to be aligned with and receive the retainer bar 710 when the flexible substrate 704 is folded over the encapsulant core 702B in direction A. In some embodiments, the encapsulant core 702B may comprise an integrally molded bar protruding from the top surface and the flexible substrate 704 may comprise a retaining slot corresponding to a length and width of the integrally molded bar. The slot may be, for example, a cutout of the flexible substrate 704. In this embodiment, the integrally molded bar of the encapsulant core 702B is positioned so that it may fit into the retaining slot of the flexible substrate 704 when the flexible substrate 704 is folded over the encapsulant core 702B in direction A to securely fix the folded over portion of the flexible substrate 704 on the encapsulant core 702B surface. In an embodiment, an interference fit between the retainer bar 710 and the integral slot 708, where the dimension of the retainer bar 710 slightly exceeds the dimension of the integral slot 708, allows the uncovered portion of the flexible substrate 704 to be securely fixed on the encapsulant core 702B surface without the use of adhesives. Alternatively, an adhesive may be used to secure the bar 710 into the slot 708. In an embodiment, a dual cavity mold may be utilized to form the retainer bar 710 and the encapsulant core 702B on the surface of the flexible substrate 704 simultaneously. In some embodiments, the encapsulant core 702B may include a first portion 705 encapsulating an ASIC 722 and the passive components 724 and a step 728 having a different thickness (e.g., less thickness) than the first portion 705. Openings 730 may optionally be molded into the step 728. In an embodiment, these openings 730 expose conductive pads on the flexible substrate 704 to facilitate electrical interconnection to the host device. In some embodiments, the encapsulant core 702B may be of uniform thickness, and the openings 730 may optionally be molded into a portion of the encapsulant core 702B.

Figure 7C:
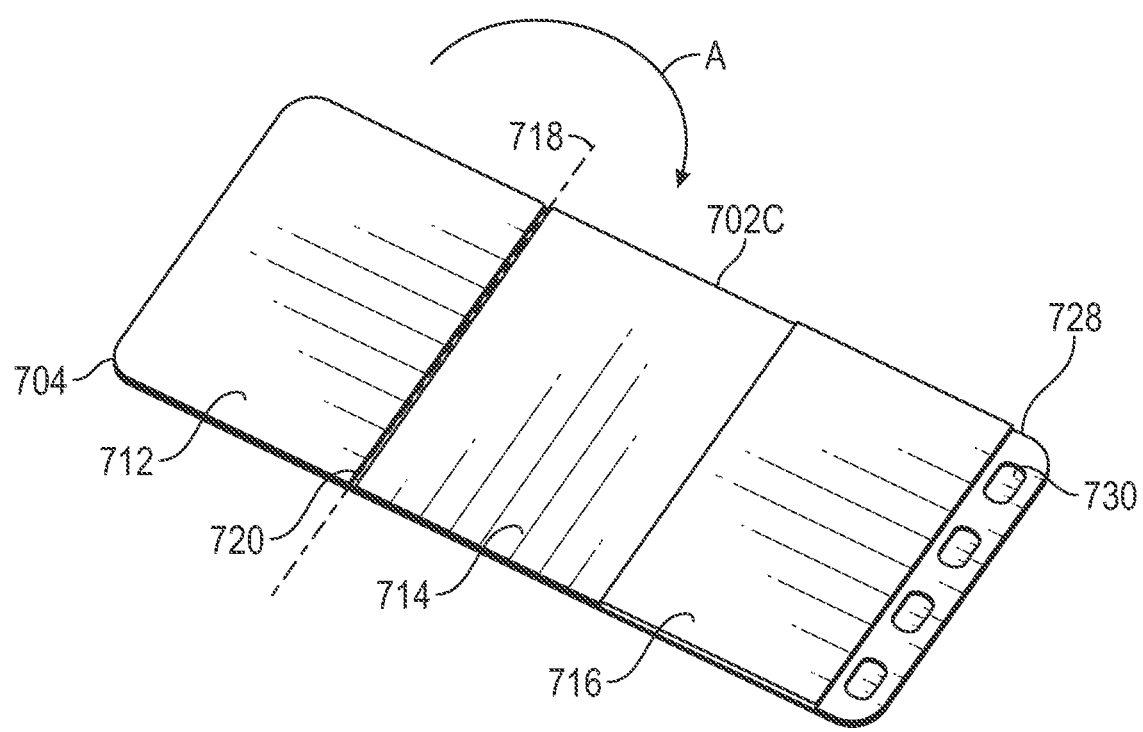
Figure 7D:
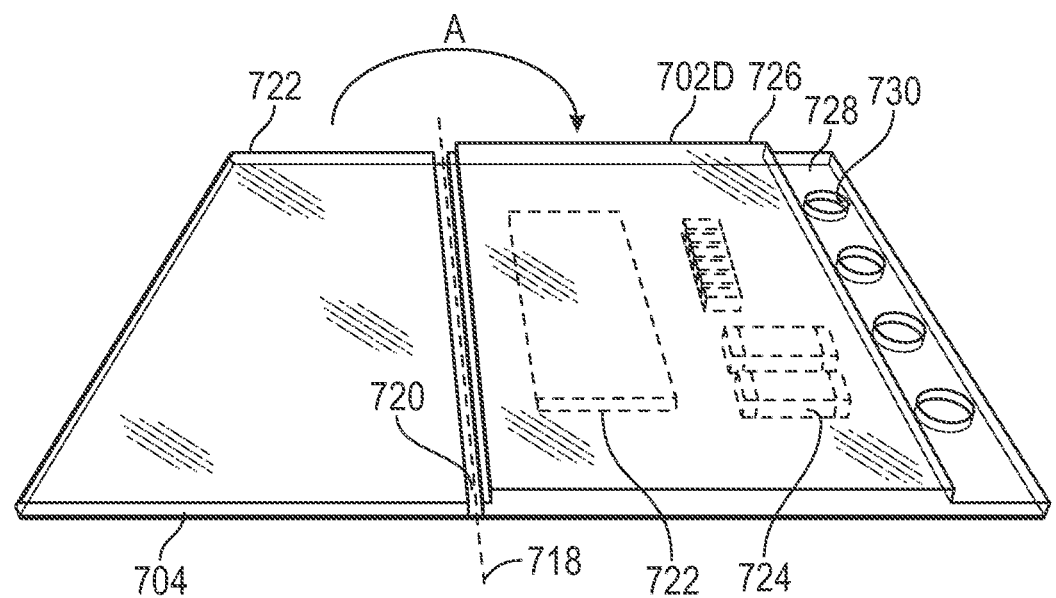

FIG. 7C illustrates another method of securely wrapping a flexible substrate around an encapsulant core. In this embodiment, a stepped encapsulant core 702C and an overmold sheet 712 are formed on a surface of the flexible substrate 704. The stepped encapsulant core 702C comprises a first portion 714 and a second portion 716. In some embodiments, the thickness of the first portion 714 is less than (e.g., half) the thickness of the second portion 716, thereby creating the step in the stepped encapsulant core 702C. The overmold sheet 712 is formed on the surface of the flexible substrate 704 not covered by the stepped encapsulant core 702C. In some embodiments, the physical dimensions of the overmold sheet 712 may be substantially similar to the physical dimensions of the first portion 714. For example, the thickness of the overmold sheet 712 may be half the thickness of the second portion 716. Accordingly, when the overmold sheet 712 is folded over the stepped encapsulant core 702C, the overmold sheet 712 is stacked on top of the first portion 714 and negates the step between the first portion 714 and the second portion 716. The stacked overmold sheet 712 in combination with the second portion 716 may create a flat top surface for the stepped encapsulant core 702C. In some embodiments, the physical dimensions of the overmold sheet 712 may be different from the physical dimensions of the first portion 714. For example, the overmold sheet 712 may be thicker or thinner than the thickness of the second portion 716. Accordingly, when the overmold sheet 712 is folded over the stepped encapsulant core 702C, the overmold sheet 712 is stacked on top of the first portion 714 and reduces the step between the first portion 714 and the second portion 716 or creates a step protruding above the second portion 716 surface. In an embodiment, adhesive is applied to either surface of the overmold sheet 712 or the first portion 714 before folding the overmold sheet 712 over the stepped encapsulated core 702C. In some embodiments, a layer of adhesive 736 is applied to a surface of the overmold sheet 712, as shown in FIG. 7F. Referring back to FIG. 7C, there may be a folding gap 720 along a fold axis 718 between the overmold sheet 712 and the stepped encapsulant core 702C to facilitate folding the overmold sheet 712 over the first portion 714 of the encapsulant core 702C in direction A. FIGS. 7G through 7J illustrate a non-limiting embodiment of a method of folding the overmold sheet 712 over the first portion 714 in direction A starting from step 1 (FIG. 7G to (FIG. 7H) to step 2 (FIG. 7H to (FIG. 7I) to step 3 (FIG. 7I to (FIG. 7J). In some embodiments, the overmold sheet 712 is bonded to the encapsulant core 702C once the overmold sheet 712 is folded over the first portion of 714, as shown in FIGS. 7K and 7L. Referring back to FIG. 7C, in an embodiment, a dowel may be placed in the folding gap 720 to ensure that the flexible substrate 704 is not wrapped tightly around the edges of the overmold sheet 712 and the encapsulant core 702C, thereby preventing damage to the flexible substrate 704 by the edges. In another embodiment, an elastomer may be dispensed in the folding gap 720 to ensure that the flexible substrate 704 is not wrapped tightly around the edges of the overmold sheet 712 and the encapsulant core 702C. In some embodiments, the folding gap 720 may be filled with foam, such as Rogers Poron®, to help maintain a constant radius bend for the wrapped around portion of the flexible substrate 704 and ensuring that the flexible substrate 704 is not wrapped tightly around the edges of the overmold sheet 712 and the encapsulant core 702C. In an embodiment, a dual cavity mold may be utilized to form the overmold sheet 712 and the stepped encapsulant core 702C simultaneously on the surface of the flexible substrate 704.

Figure 7E:
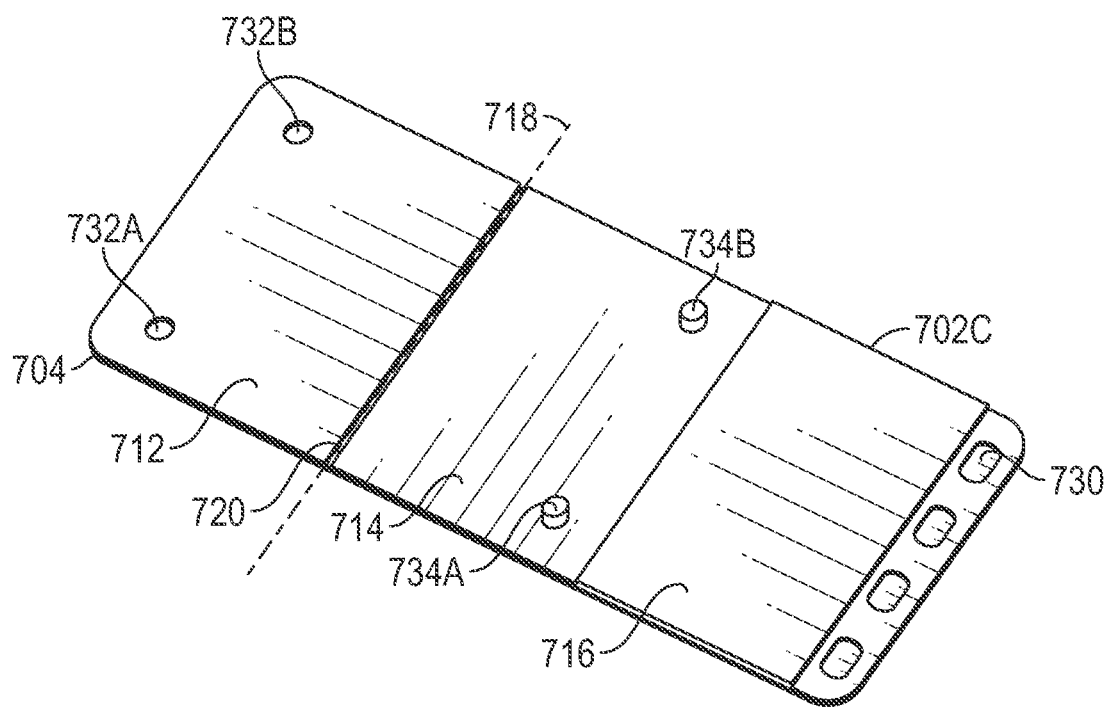
Figure 7F:
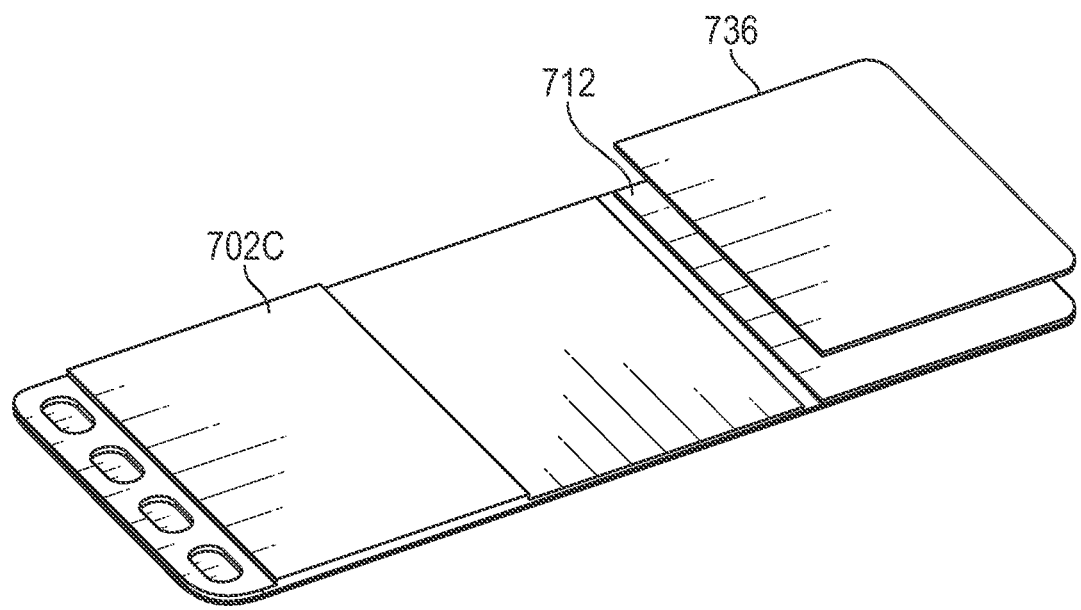
Figure 7H:
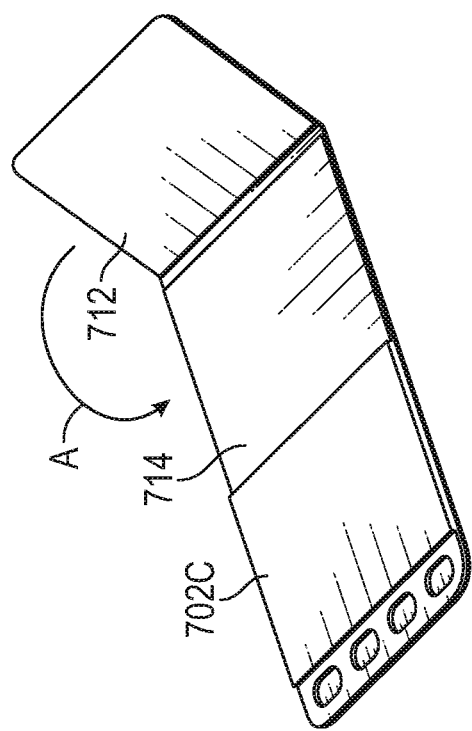
Figure 7J:
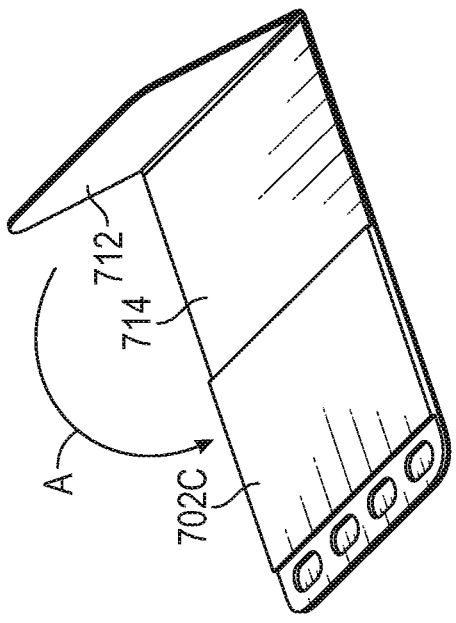
Figure 7G:
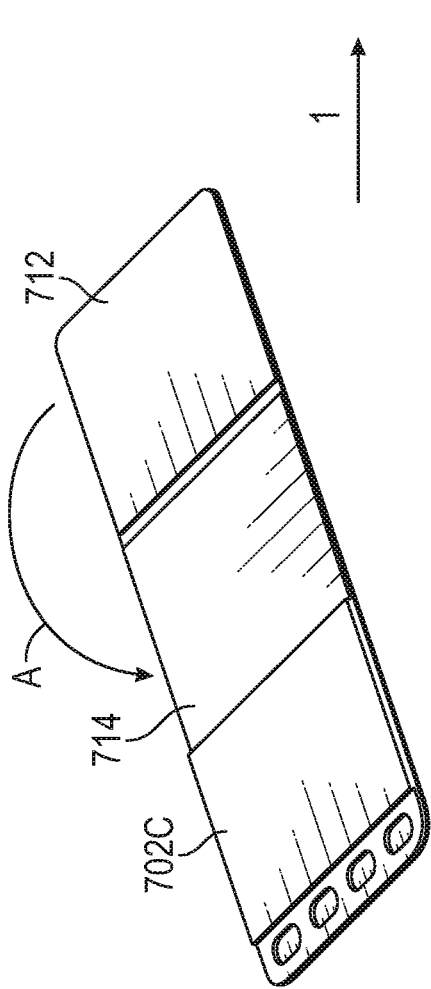
Figure 7I:
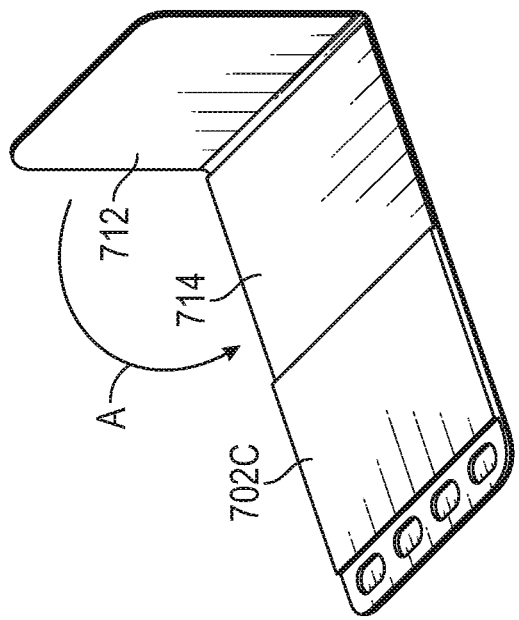
Figure 7K:
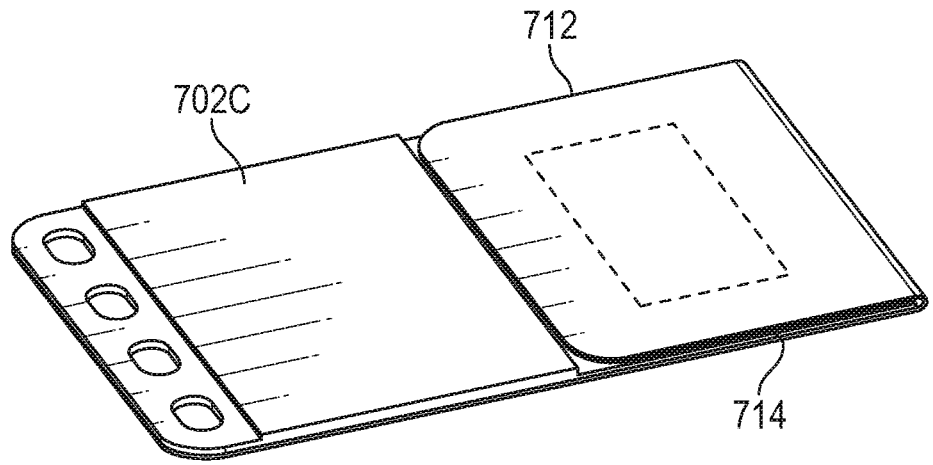
Figure 7L:
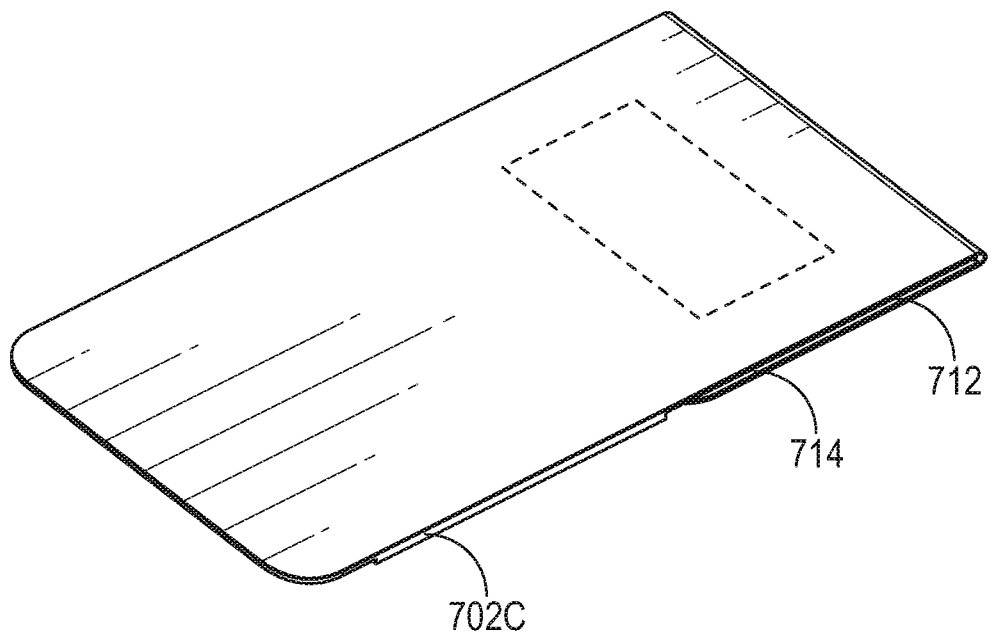

In some embodiments, the overmold sheet 712 and the first portion 714 may comprise alignment features for securing the overmold sheet 712 on the surface of the first portion 714, as shown in FIG. 7E. As illustrated in FIG. 7E, the first portion 714 may comprise mounting posts 734A-B integrally molded and positioned on a top surface for securing the overmold sheet 712 when folded over the encapsulated core 702C. The overmold sheet 712 may comprise alignment holes 732A-B integrally molded and positioned to align with the mounting posts 734A-B when the overmold sheet 712 is folded over the first portion 714.

In some embodiments, the first portion 714 may comprise alignment holes integrally molded and positioned on a top surface for securing the overmold sheet when folded over the encapsulated core 702C, and the overmold sheet 712 may comprise the mounting posts integrally molded and positioned to fit into alignment holes when the overmold sheet 712 is folded over the first portion 714. In some embodiments, the first portion 714 may comprise at least one alignment hole and at least one mounting post integrally molded. In this embodiment, the overmold sheet 712 may comprise at least one mounting post and at least one alignment hole integrally molded and positioned so that the at least one mounting post fits into the at least one alignment hole of the first portion 714 and the at least one alignment hole is aligned with at least one mounting post of the first portion 714 when the overmold sheet 712 is folded over the first portion 714.

In some embodiments, the encapsulant core 702C may comprise a second step 728 having a different thickness (e.g., less thickness) than the second portion 716. Openings 730 may optionally be molded into the second step 728. In an embodiment, these openings 730 expose conductive pads on the flexible substrate 704 to facilitate electrical interconnection to the host device. In some embodiments, the encapsulant core 702C may be of uniform thickness, and the openings 730 may optionally be molded into a portion of the encapsulant core 702C.

FIG. 7D illustrates another method of securely wrapping a flexible substrate around an encapsulant core. In this embodiment, an encapsulant core 702D and an overmold sheet 722 are formed on a surface of the flexible substrate 704. In some embodiments, the encapsulant core 702D may include a first portion 726 encapsulating an ASIC 722 and the passive components 724 and a step 728 having a different thickness (e.g., less thickness) than the first portion 726. In some embodiments, the outer perimeter of the surface area of the overmold sheet 722 and the first portion 726 are substantially similar. Accordingly, when the overmold sheet 722 is folded over the encapsulant core 702D, the overmold sheet 712 is stacked on top of the first portion 726. In some embodiments, the outer perimeter of the overmold sheet 722 may be configured to provide a variation in thickness when the overmold sheet 722 is folded over the first portion 726. For example, the folded over overmold sheet 722 may create a step protruding above the surface of the first portion 726. In some embodiments, the variation in thickness of the wrapped encapsulant core accommodates the integration of the wrapped encapsulant core into a host device. Openings 730 may optionally be molded into the step 728. In an embodiment, these openings expose conductive pads on the flexible substrate 704 to facilitate electrical interconnection to the host device. In some embodiments, the encapsulant core 702D may be of uniform thickness, and the openings 730 may optionally be molded into a portion of the encapsulant core 702D. In an embodiment, adhesive is applied to either surface of the overmold sheet 722 or the first portion 726 of the encapsulant core 702D before folding the overmold sheet 712 over the encapsulated core 702D. There is a folding gap 720 along a fold axis 718 between the overmold sheet 722 and the encapsulant core 702D to facilitate folding the overmold sheet 722 over the encapsulant core 702D in direction A. In an embodiment, a dowel may be placed in the folding gap 720 to ensure that the flexible substrate 704 is not wrapped tightly around the edges of the overmold sheet 722 and the encapsulant core 702D, thereby preventing damage to the flexible substrate 704 by the edges. In another embodiment, an elastomer may be dispensed in the folding gap 720 to ensure that the flexible substrate 704 is not wrapped tightly around the edges of the overmold sheet 722 and the encapsulant core 702D. In some embodiments, the folding gap 720 may be filled with foam, such as Rogers Poron®, to help maintain a constant radius bend for the wrapped around portion of the flexible substrate 704 and ensuring that the flexible substrate 704 is not wrapped tightly around the edges of the overmold sheet 722 and the encapsulant core 702D. In an embodiment, a dual cavity mold may be utilized to form the overmold sheet 722 and the encapsulant core 702D on the surface of the flexible substrate 704 simultaneously.

Figure 8A:
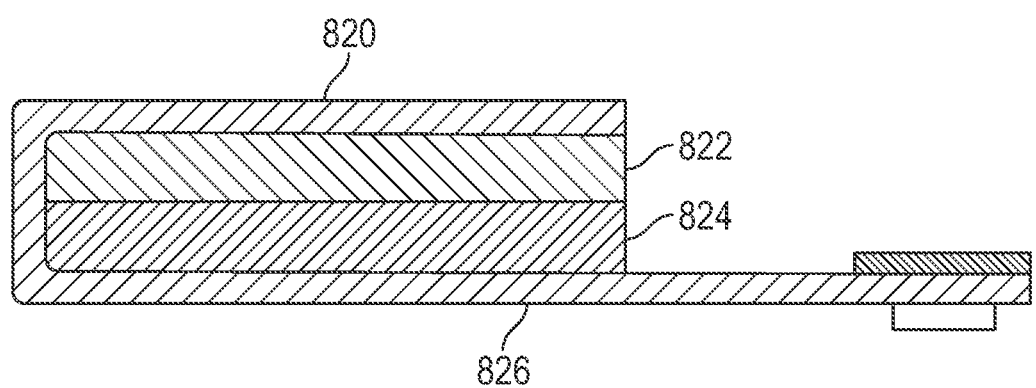
FIGS. 8A-8B show cross-sectional views of double-sided fingerprint sensors comprising a split core.
Figure 8B:
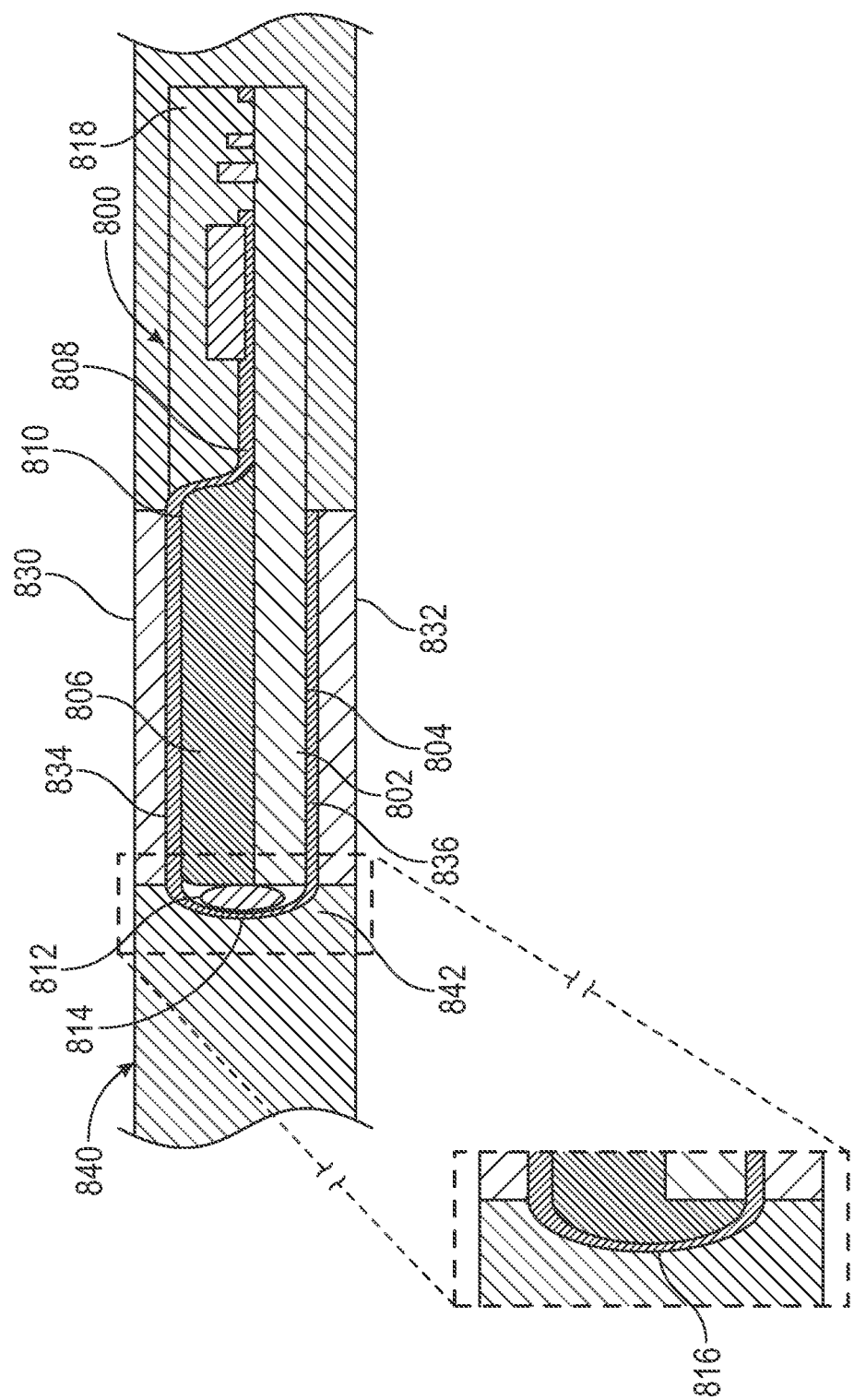

FIGS. 8A-8B illustrate embodiments of double-sided fingerprint sensors comprising a split core. As shown in FIG. 8A, the split core principle described in U.S. Patent Application Publication No. 2017-0147852 explains the assembly of a sensor assembly that can be completed by folding a first rigid substrate portion 822 and a sensor lobe 820 over a second rigid substrate portion 824 and a circuit lobe 826 and securing the first rigid substrate portion 822 to the second rigid substrate portion 824 (for simplicity, the drive lines (Tx) and receive lines (Rx) are not shown in FIGS. 8A and 8B). U.S. Patent Application Publication No. 2017-0147852 describes the split core concept in relation to a single-sided flexible substrate and the same split core principle can be used with the double-sided flexible substrate to create a doubled-sided sensor with lobes 820 and 826 forming opposed sensor surfaces.

Accordingly, FIG. 8B shows an example of a double-sided fingerprint sensor 800 comprising a split core 802 installed in a card body 840. In an embodiment, the split core 802 comprises two different materials. The first material or layer is a PCB 804 and the second material is an encapsulant (e.g. molding compound), such as a non-conductive dielectric material, directly applied on a surface of the PCB 804 to form a molded shim 806. A double-sided flexible substrate 808 is wrapped around the PCB 804 and the molded shim 806. In an exemplary embodiment, the split core 802 has rounded corners 810 to ensure that the double-sided flexible substrate 808 is not damaged by the edges of the split core 802. In another embodiment, an adhesive cushion 812 (e.g., a UV-cure compliant adhesive cushion) is provided between one end of the split core 802 and the wrapped around portion 814 of the double-sided flexible substrate 808. By inserting the adhesive cushion 812, the double-sided flexible substrate 808 is not wrapped tightly around the edges of the split core 802, thereby preventing damage to the substrate 808 by the edges. A cavity 842 in the card body 840 allows the adhesive cushion 812 to move during card flexing. In an alternative embodiment, the encapsulant directly applied on the surface of the PCB is also applied to an end of the PCB 804 to form a bumper 816 to substitute the adhesive cushion 812. Accordingly, the doubled-sided flexible substrate 808 is wrapped around the outer perimeter of the bumper 814 to prevent damage to the substrate by the edges of the split core 802.

In an embodiment, molded shim 806 does not fully cover the PCB 804, and a portion of the substrate 808 (e.g. with an ASIC) extends beyond the shim, is secured to a top surface of the PCB 804, and is overmolded with an encapsulant 818. A high modulus polymer film 830, 832 may be secured to or formed on the opposed sensor surfaces 834, 836.

Alternative Double-Sided Sensor Designs

Figure 9A:
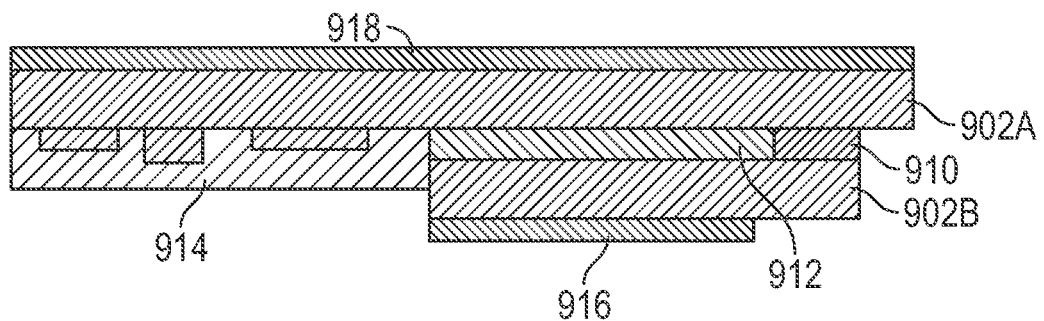
Figure 9B:
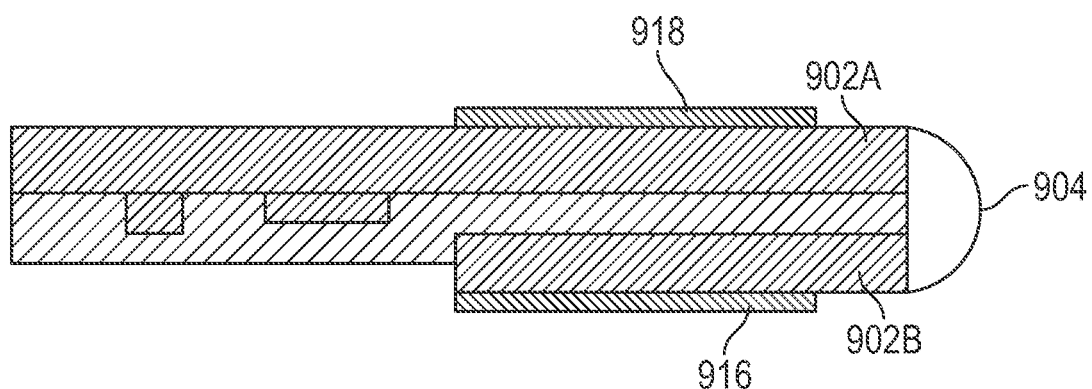

FIGS. 9A-9C illustrate embodiments of double-sided fingerprint sensors comprising two separate PCB boards. In these embodiments, two separate PCB boards are used rather than a double sided-flexible substrate. As shown in FIG. 9A, a first board 902A and a second board 902B are connected via a combination of Anisotropic Conductive Film (ACF) or Anisotropic Conductive Adhesives (ACA) 910 and non-conductive adhesive film or paste 912. In the illustrated embodiment, PCB 902A is larger than PCB 902B, and an overmold encapsulant may be provided in a region where the PCBs 902A, 902B do not overlap. Film coatings 916, 918 (e.g., about 50 μm thick) may be provided over the lower and upper sensor areas.

As shown in FIG. 9B, the interconnection between the two boards is made using a flexible (or rigid) electrical connection 904. In some embodiments, the electrical connection 904 comprises a flexible printed circuit that interconnects the two boards 902A-B. The flexible printed circuit may be attached to each board 902A-B with ACF, ACA, solder or other means of adhesion.

As show in FIG. 9C, a further alternative design for a double-sided fingerprint sensor is shown. FIG. 9C illustrates a multi-layer PCB double sided sensor. The PCB 902c may include, for example, layers 920, 930 supporting upper and lower signal receiving functions, layers 922, 928 supporting upper and lower signal transmission functions, layer 924 supporting a routing function, and a ground layer 926. In this embodiment, the multi-layer PCB comprises an interconnect 932 to the host device (e.g., card) a stepped or a cavity 934.

Double-Sided Sensor Module

Figure 10A:
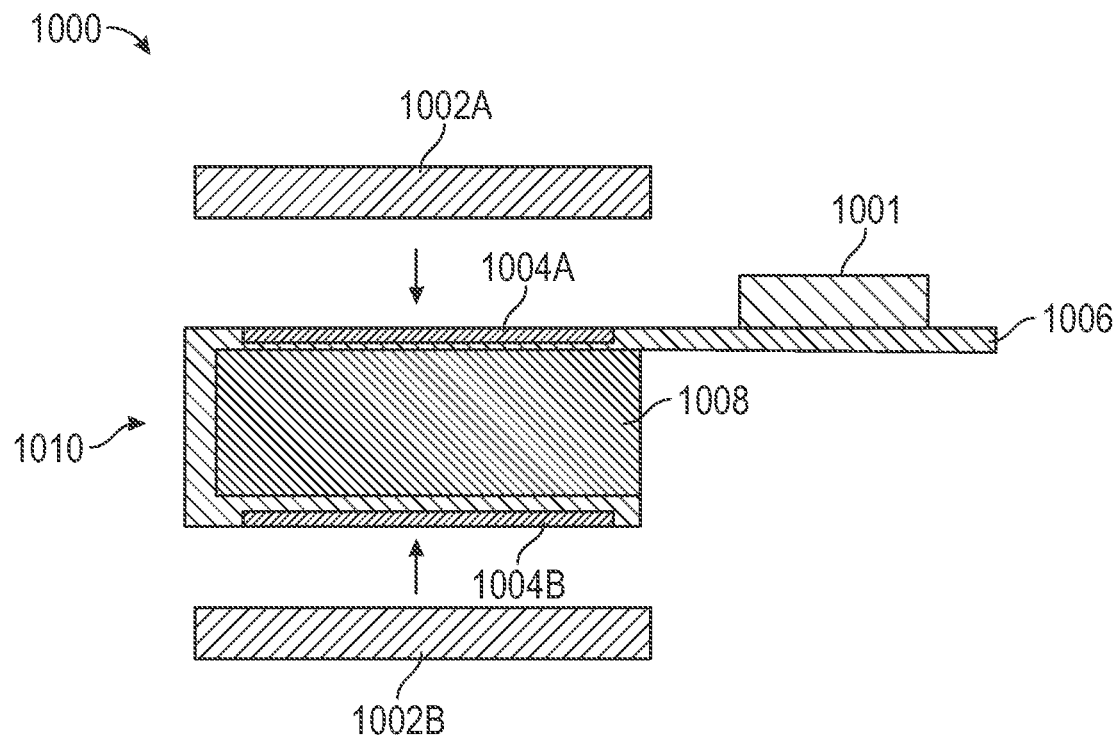
FIGS. 10A-10C show cross-sectional views of a double-sided sensor module.
Figure 10B:
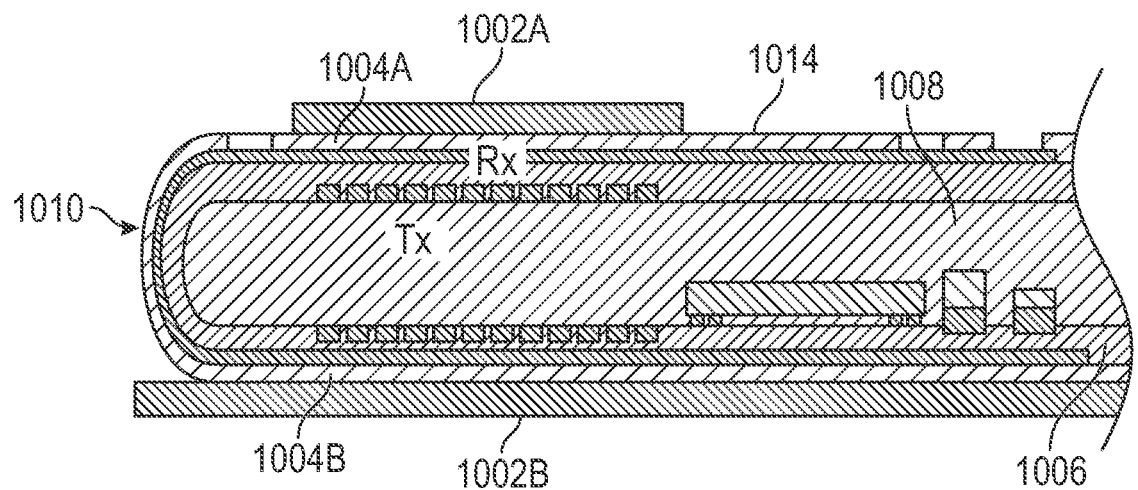
Figure 10C:
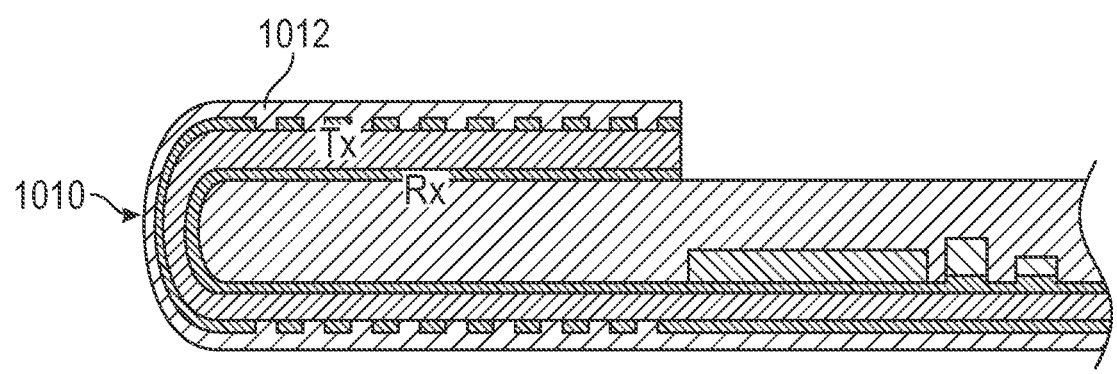

FIGS. 10A-10C illustrate embodiments of a double-sided sensor module 1000. As shown in FIGS. 10A-10C, one or more layers of protective coating may be attached to a top and a bottom surface of a wrapped double-sided flexible sensor to create the double-sided sensor module. As shown in FIG. 10A, the wrapped double-sided flexible sensor 1010 comprises a double-sided flexible substrate 1006 wrapped around a core 1008. In some embodiments, an ASIC 1001 may be disposed on a surface of the double-sided flexible substrate 1006 that is not wrapped around the core 1008. In an embodiment, the core 1008 may be a split core as described in FIGS. 8A-8B. An upper cover panel 1002A is placed over a sensing area 1004A on the top surface of the wrapped double-sided flexible sensor 1010. A lower cover panel 1002B is placed over a sensing area 1004B on the bottom surface of the wrapped double-sided flexible sensor 1010. The thickness and material of the cover panels 1002A-B are determined in order to prevent interference with the sensitivity of the wrapped double-sided flexible sensor 1010. In an embodiment, protective coatings may be used to cover the sensing areas 1004A-B. The cover panels 1002A-B may be made of glass, ceramic, polycarbonate, polyimide or fabric. In an embodiment, the cover panels 1002A-B may be transparent or colored depending on aesthetic requirements of the application of the sensor 1010. In another embodiment, the cover panels 1002A-B may be tactile.

As shown in FIG. 10B, it is not necessary for the upper cover panel 1002A and the lower cover panel 1002B to be the same. For example, the upper cover panel 1002A and the lower cover panel 1002B may comprise different materials and/or be of different lengths, shapes, colors, and/or textures. The sensor shown in FIG. 10B comprises a flexible substrate 1006 comprising a polyimide (or similar) layer with spaced-apart and mutually transverse drive (Tx) lines and pick up (Rx) lines, wrapped around a molded compound core 1008 with a solder mask 1014 disposed over the outer surface of the flexible substrate. In an embodiment illustrated in FIG. 10B, the lower cover panel 1002B may cover a larger portion of the bottom surface of the wrapped double-sided flexible sensor 1010 than the top surface covered by the upper cover panel 1002A. In an embodiment, the size of the sensing areas 1004A-B may be different. In general, the overlays 1002A, 1002B may comprise polycarbonate, polyimide, or other robust material and may have a thickness less than or equal to about 50 µm. Accordingly, the size and material of the cover panels 1002A-B may be determined based on the size of the sensing areas 1004A-B.

In an alternative embodiment, a protective coating 1012, such as a photo-imagable polyimide layer, may cover the entire area of the outer surface of the wrapped double-sided flexible sensor 1010, as shown in FIG. 10C. In an embodiment, the photo-imagable polyimide layer 1012 is 25 µm thick to minimize interference with the sensing capabilities of the wrapped double-sided flexible sensor 1010.

As noted above, the double-sided flexible sensor module can be applied in numerous real-life "internet of things" devices and smart card. An important consideration for some applications, such as smart cards, is that the smart card is subjected to considerable bend and flex in everyday use and needs to withstand being pushed and pulled under rollers in ATM machines. Accordingly, there is a need to provide additional protection to the ASIC and passive components of the double-sided sensor module, particularly if these components are not incorporated into the core. In an embodiment, one or more stiffener layers may be provided underneath or over the ASIC and the passive components to protect the components from damage, as shown in FIGS. 5A-5B, FIG. 12A, and FIGS. 13A-13B. In another embodiment, an encapsulant is used to encapsulate the ASIC and the passive components, as shown in FIG. 11.

Referring back to FIGS. 5A-5B, a stiffener 506 layer is placed underneath the ASIC 514 and the passive components 516. Suitable stiffener materials may comprise a layer of stainless steel with a thickness of 100 µm. Some alternative embodiments may use different materials comprising varying thickness.

Figure 11:
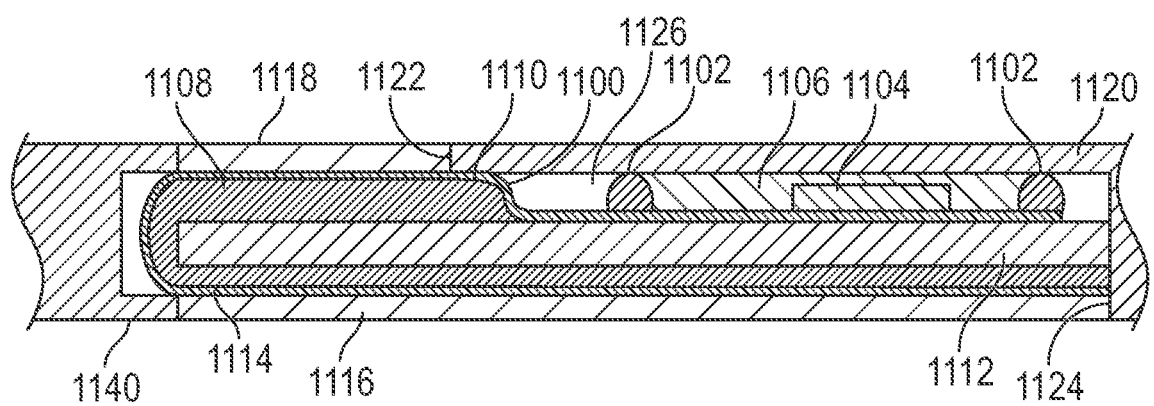
FIG. 11 shows a cross-sectional view of a double-sided sensor module inserted into a smart card.

FIG. 11 illustrates a cross sectional view of a double-sided sensor module 1100 incorporated into a smart card 1140, according to an embodiment. In this embodiment, the ASIC 1104 is not part of the encapsulant core 1108. The encapsulant core 1108 comprises a PCB 1112 and an encapsulant 1110 molded around a portion of a top surface of the PCB 1112, the entire bottom surface of the PCB 1112, and an end of the PCB 1112 to form a stepped core. The double-sided flexible substrate 1114 is wrapped around the encapsulant core 1108 and the ASIC 1104 mounted on the flexible substrate is disposed on a portion of the PCB 112 that is not covered by the encapsulant core 1108. In some embodiment, a dam 1102 comprising a first epoxy material may be applied on the lower step of the top surface of the wrapped double-sided flexible substrate 1114 to create a perimeter around the ASIC 1104. In some embodiments, the dam 1102 may create a perimeter around the ASIC 1104 and any passive components located on the lower step of the top surface of the wrapped double-sided flexible substrate 1114. A second epoxy material may be injected in the resulting dammed off area around the ASIC 1104 to encapsulate the ASIC 1104 and create a protective shield 1106. In some embodiments, the first epoxy material and the second epoxy material is different. For example, the first epoxy material may have a higher viscosity than the second epoxy material. In some embodiments, the first epoxy material and the second epoxy material may belong to a similar family of epoxy materials.

A first (upper) cover panel 1118 covers a first sensor area of the sensor and a second (lower) cover panel 1116 covers a second sensor area of the sensor. An opening formed in the card body to accommodate the sensor includes a first portion 1122 having an extent (transverse dimensions) corresponding to the size of the first cover panel 1118 and a second portion 1124 having an extent corresponding to the size of the second cover panel 1116. A first sensor area covered by first panel 1118 is accessible through the first opening 1122 extending through a first surface (top) of the card body, and the second sensor area covered by the second cover panel 1116 is accessible through the second opening 1124 extending through a second surface (bottom) of the card body. The difference in size between first opening 1122 and second opening 1124 defines a partial closure or ceiling 1126 and an internal space 1120 that accommodates the ASIC 1104 and the shield 1106.

Figure 12A:
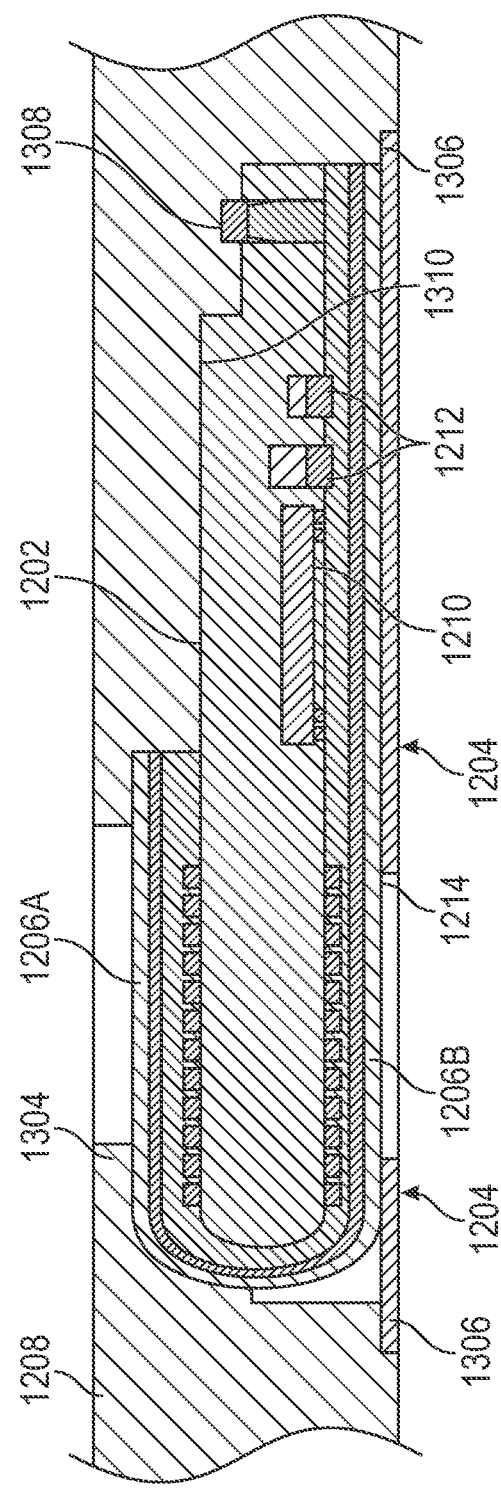
FIG. 12A shows a cross-sectional view of a double-sided sensor module inserted into a smart card and securely fixed with a stiffener frame.
Figure 12C:
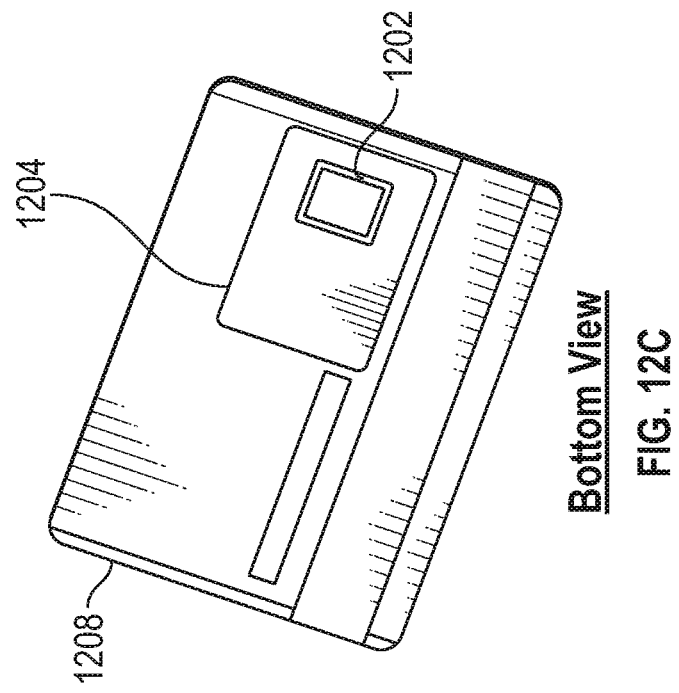
FIGS. 12B-12C show a top view and a bottom view, respectively, of a double-sided sensor module inserted into a smart card and securely fixed with a stiffener frame.
Figure 12B:
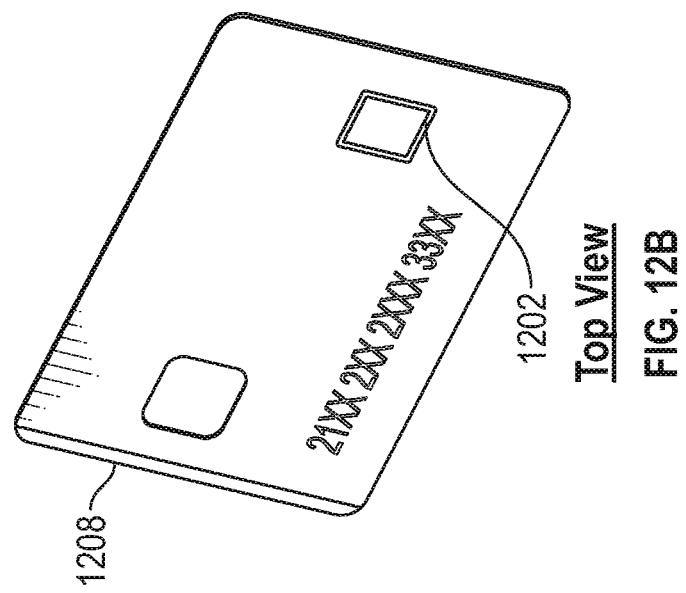
Figure 13A:
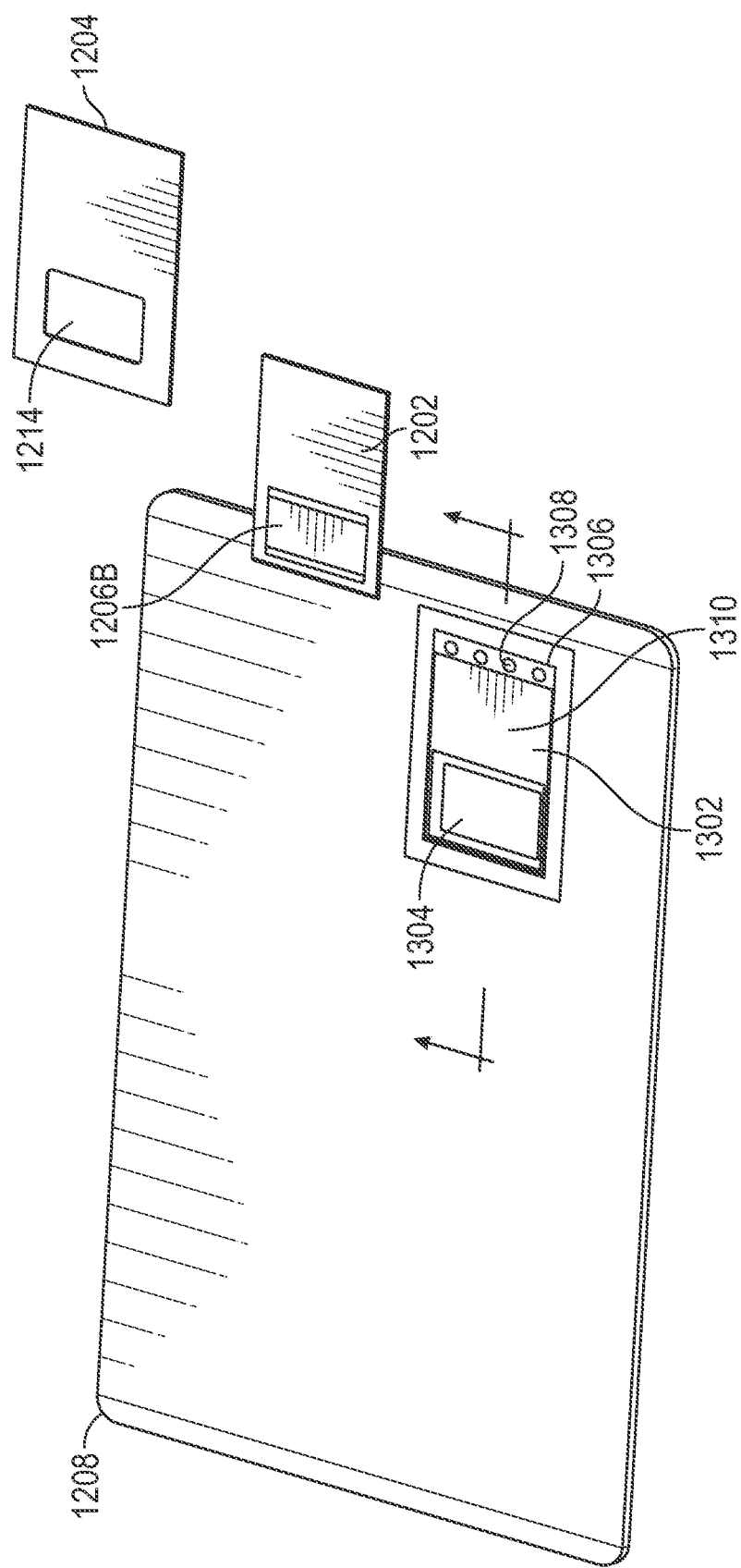
FIGS. 13A-13B shows an exploded view of the stiffener frame, the double-sided sensor module, and the smart card.
Figure 13B:
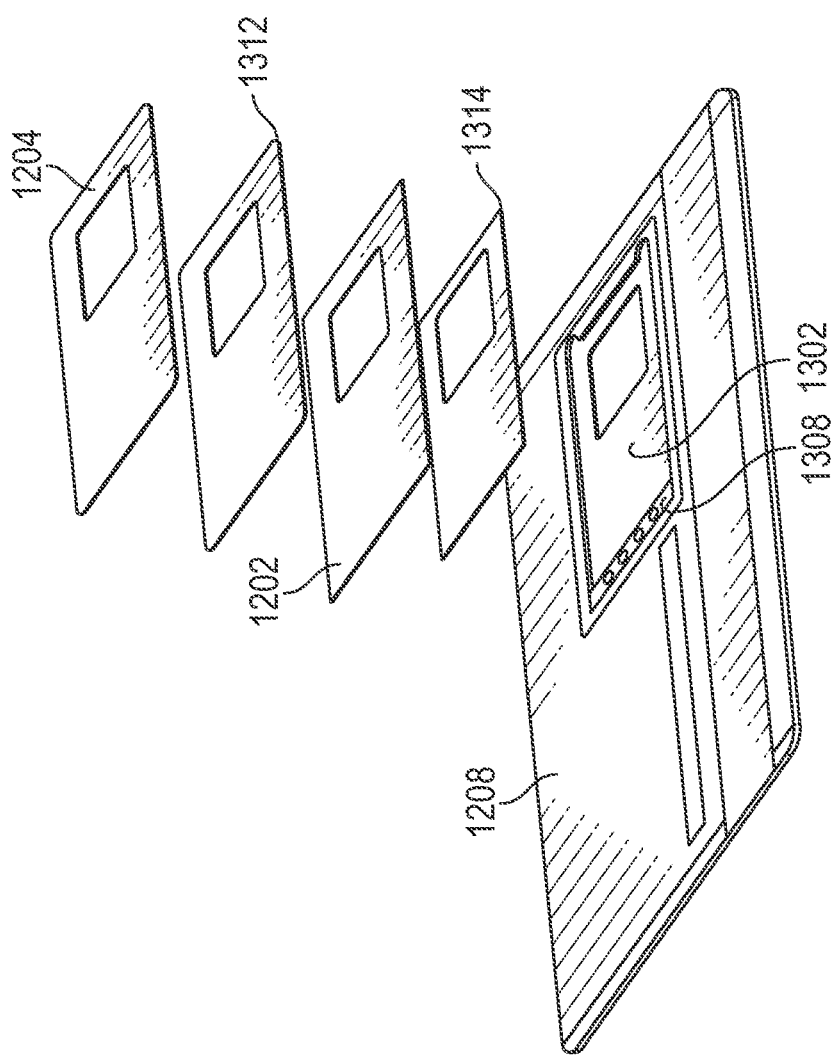

FIG. 12A illustrates a cross sectional view of the double-sided sensor module inserted into the smart card, according to another embodiment of the invention. In this embodiment, a stiffener frame 1204, also referred to as a "picture frame," comprises a thin layer of stainless steel with a cutout 1214 therein. The stiffener frame 1204 surrounds one of the sensing areas 1206B of the double-sided sensor module 1202 while securing the module 1202 in place within the cavity of the smart card 1208 and protecting the ASIC 1210 and the passive components 1212 from damage. A top view and a bottom view of the double-sided sensor module 1202 inserted into the smart card 1208 and secured in place by the stiffener frame 1204 is shown in FIG. 12B. An exploded view of this embodiment is illustrated in FIG. 13A. As shown in FIG. 13A, the double-sided sensor module 1202 is inserted into a cavity 1302 in the smart card 1208. A bottom sensing area 1206B is surrounded by the stiffener frame 1204 when the frame 1204 is applied over the bottom surface of the double-sided sensor module 1202 to securely hold the module 1202 in place within the cavity 1302. In some embodiments, a layer of adhesive 1314 may be applied to a top surface of the double-sided module 1202 or an inner surface of the cavity 1302 before the double-sided sensor module 1202 is inserted into the cavity 1302, as shown in FIG. 13B. In some embodiments, a layer of adhesive 1312 may be applied to a bottom surface of the double-sided module 1202 or a surface of the frame 1204 which contacts the bottom surface of the double-sided module 1202 before the frame 1204 is applied over the double-sided sensor module 1202 to securely hold the module 1202 in place within the cavity 1302, as shown in FIG. 13B. In some embodiments, two stiffener frames may be used, each frame surrounding a top and bottom sensing area while securely holding the module 1202 in place. As one function of the stiffener frame may be to retain the sensor module within the cavity, the stiffener frame may also be referred to as a retainer frame.

Opening 1302 includes a center portion 1310 that receives the sensor 1202. A through opening 1304 aligns with a sensor area 1206A (see FIG. 12A). A ledge 1306 surrounding the center portion 1310 has a depth corresponding to the thickness of the frame 1204 and supports the periphery of the frame. Card interconnects 1308 may be provided (e.g., on a transverse ledge) for connecting the sensor 1202 to the card. Frame 1204 may be secured to the ledge 1306 by a suitable adhesive.

Referring back to FIG. 12A, the sensing area 1206B remains uncovered by the stiffener frame 1204 through the cutout 1214, but all other components of the double-sided sensor module 1202 are covered by the stiffener frame and provided protection from any force applied to the smart card 1208. The cutout 1214 allows the sensing area 1206B to be recessed with respect to an outer surface of the stiffener frame 1204. This recess provides the advantage of allowing a user to feel where the sensor is without having to see where the sensing area 1206B is located, for example, if the sensing area 1206B is on the underside of the host device a user may accurately position the sensing area 1206B by running a finger over the stiffener frame 1204. In an embodiment, the depth of this recess is adjustable by configuring the thickness of the stiffener frame 1204. In an embodiment, material for the stiffener frame 1204 may be picked for its color and general appearance in relation to the host device, for example to highlight (or alternatively to camouflage) the sensing areas 1206A-B of the incorporated sensor.

Methods of Connecting the Double-Sided Sensor Module to a Host Device

Figure 14A:
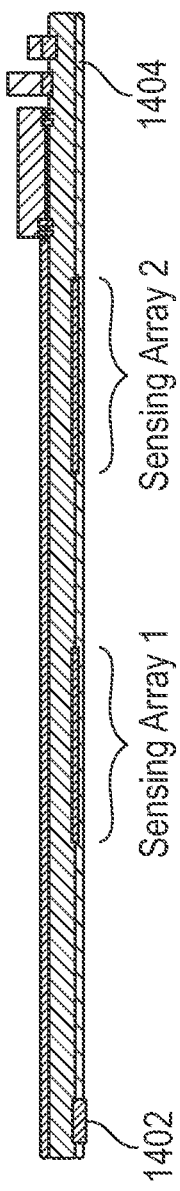
FIGS. 14A-14C illustrate an exemplary embodiment of an interconnection component integrated in the double-sided flexible substrate.
Figure 14B:
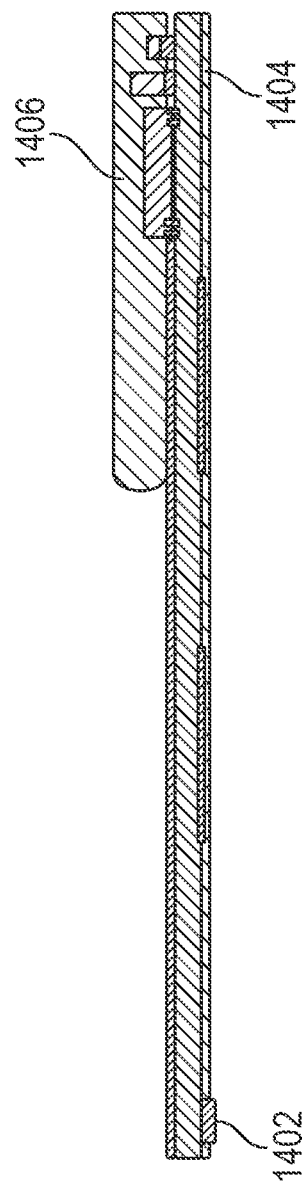
Figure 14C:
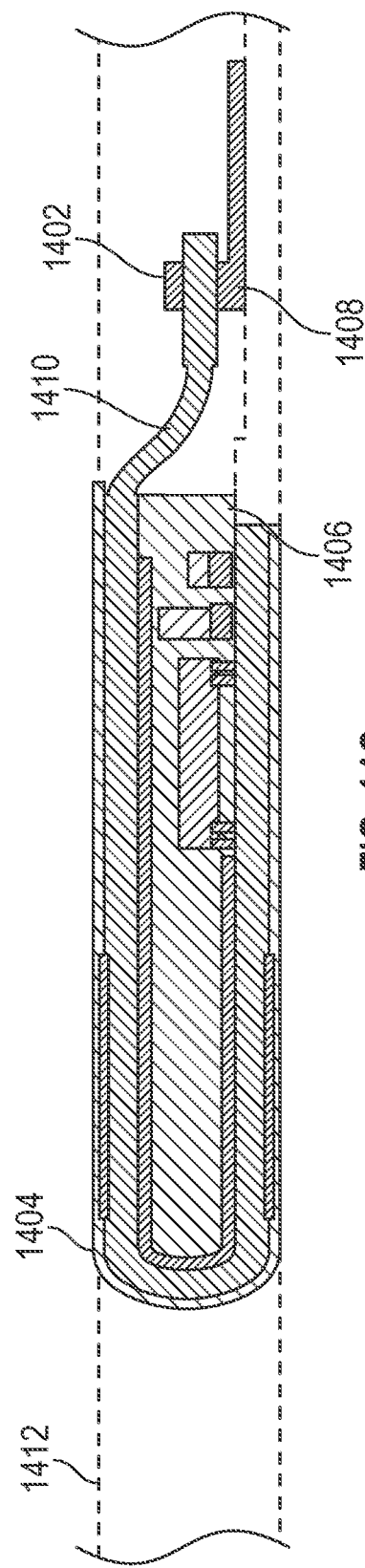

Interconnection components for connection to a host device are an integral part of the double-sided sensor module. FIG. 14A shows an exemplary embodiment of an interconnection component 1402 integrated in the double-sided flexible substrate 1404. The location of the interconnection component 1402 can be changed to optimize conductor routing. As shown in FIGS. 14B and 14C, the interconnection component 1402 is embedded in a portion of the double-sided flexible substrate 1404 which extends beyond the dimensions of an encapsulant core 1406 when the double-sided flexible substrate 1404 is folded over the core 1406. The extending portion of the double-sided flexible substrate 1404 trails over one edge of the encapsulant core 1406 and forms a host device connection tab 1410 comprising the interconnection component 1402. The host device connection tab 1410 and the interconnection component connect the sensor to the host device 1412. In an embodiment, the position of the interconnection component 1402 may vary based on the application of the double-sided sensor module.

Figure 15A:
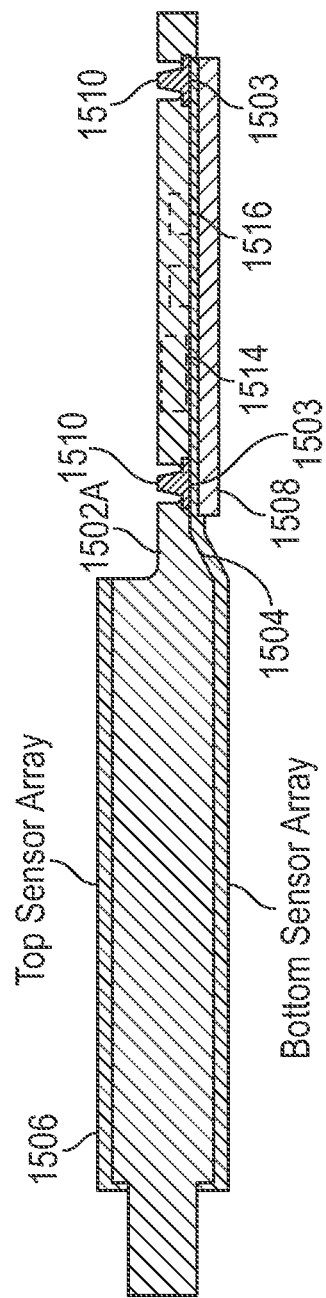
FIGS. 15A-15D illustrate alternative embodiments of providing interconnects for double-sided sensor modules to the host device.
Figure 15B:
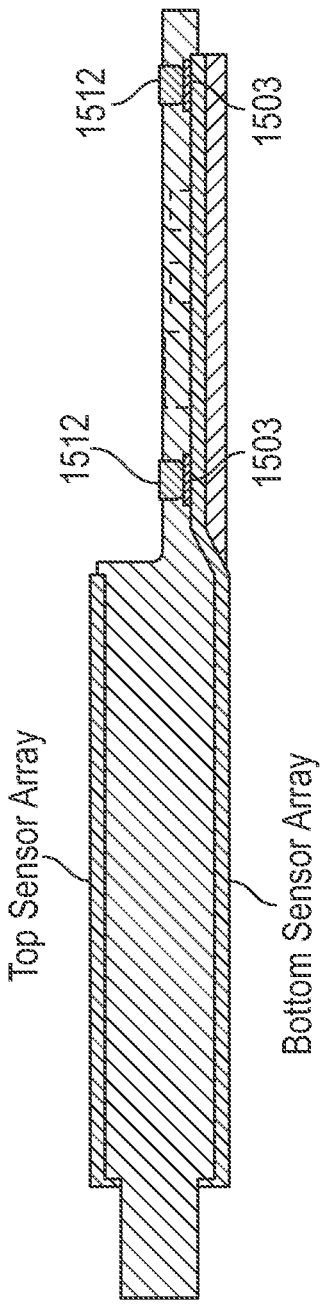

FIGS. 15A-15D illustrate alternative embodiments of providing interconnects for double-sided sensor modules to the host device. As shown in FIGS. 15A and 15B, a non-continuous encapsulant core 1502A comprises an angled step 1504 and one or more cutouts 1503. The angled step 1504 slightly elevates the ASIC 1514 and the passive components 1516 mounted on the inside surface of the double-sided flexible substrate 1506 so that a stiffener layer 1508 may be placed underneath the outer surface of a portion of the double-sided flexible substrate 1506 comprising the components. In this embodiment, the interconnection components are in the form of one or more gold stud bumps 1510, and the bumps 1510 are applied to the inside surface of the double sided flexible substrate using a wire bond process for subsequent ACF interconnection to a host device. The one or more gold stud bumps or ACA adhesive 1510 extend through cutouts 1503 formed during molding of the encapsulant core 1502A. As explained in FIG. 5C, the cutouts 1503 are created during an encapsulation process of the ASIC and the passive components to form the encapsulant core 1502A. The cutouts 1503 allow the insertion of the gold stud bumps 1510 (FIG. 15A) and/or the injection of anisotropic conductive adhesive 1512 (FIG. 15B) to enable connection of the double-sided sensor module to the host device.

Figure 15C:
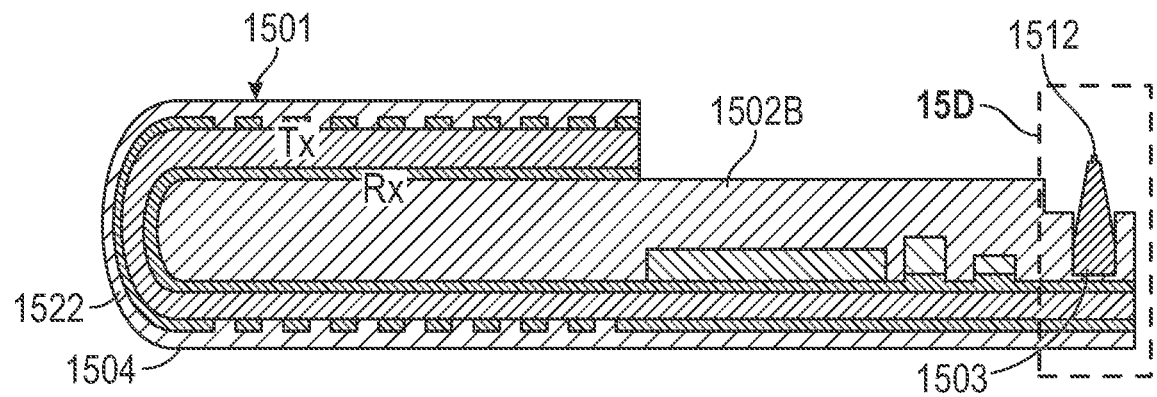
Figure 15D:
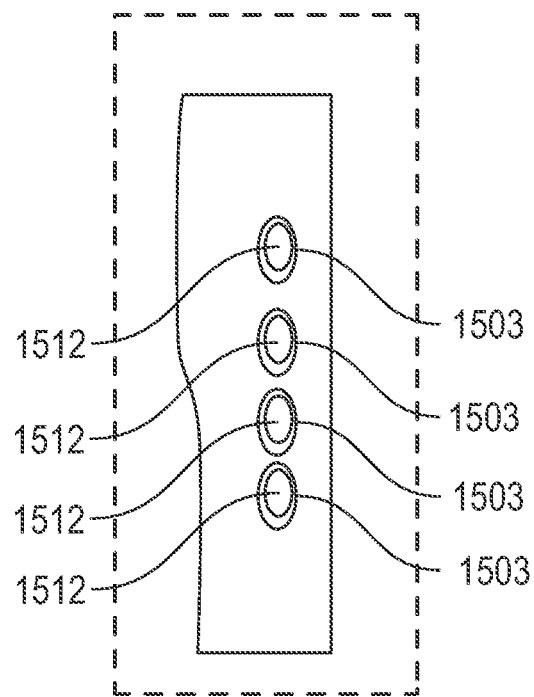

FIG. 15C, which is a cross-section of a sensor module, illustrates a further embodiment of providing interconnects to the host device. A non-continuous encapsulant core 1502B comprises one or more cutouts 1503. In this embodiment, flexible bumps, such as "MB FB 6000 Flexible bump" manufactured by Muehlbauer, are inserted in the one or more cutouts 1503 to provide interconnection for the double-sided sensor module 1501 with the host device. The flexible bumps 1512 are a very low elastic modulus conductive adhesive, having high conductivity and a high elongation elastomer base. Poisson's ratio maintains the electrical conductivity of the bump when it is stretched. FIG. 15D shows a top view of a portion the encapsulant core 1502B comprising the one or more flexible bumps 1512 inserted in the one or more cutouts 1503. A protective coating 1522, such as a photo-imagable polyimide layer, may cover the entire area of the outer surface of the wrapped double-sided flexible sensor 1501.

Figure 16:
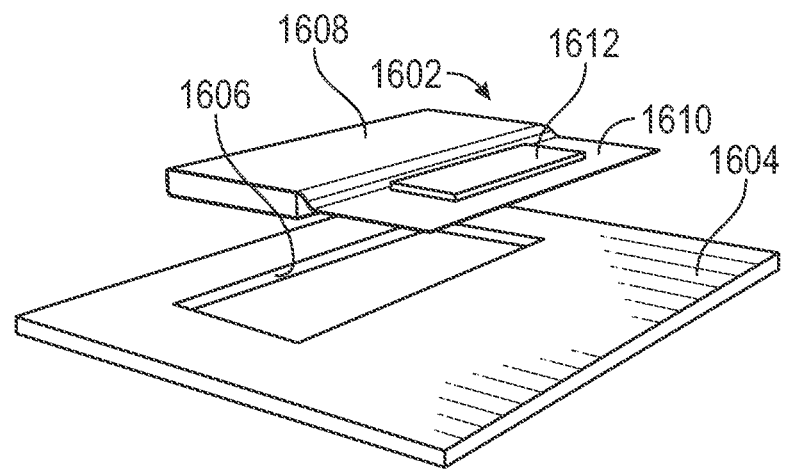
FIGS. 16-17 illustrate a double-sided wrapped flexible sensor inserted into a PCB frame.
Figure 17:
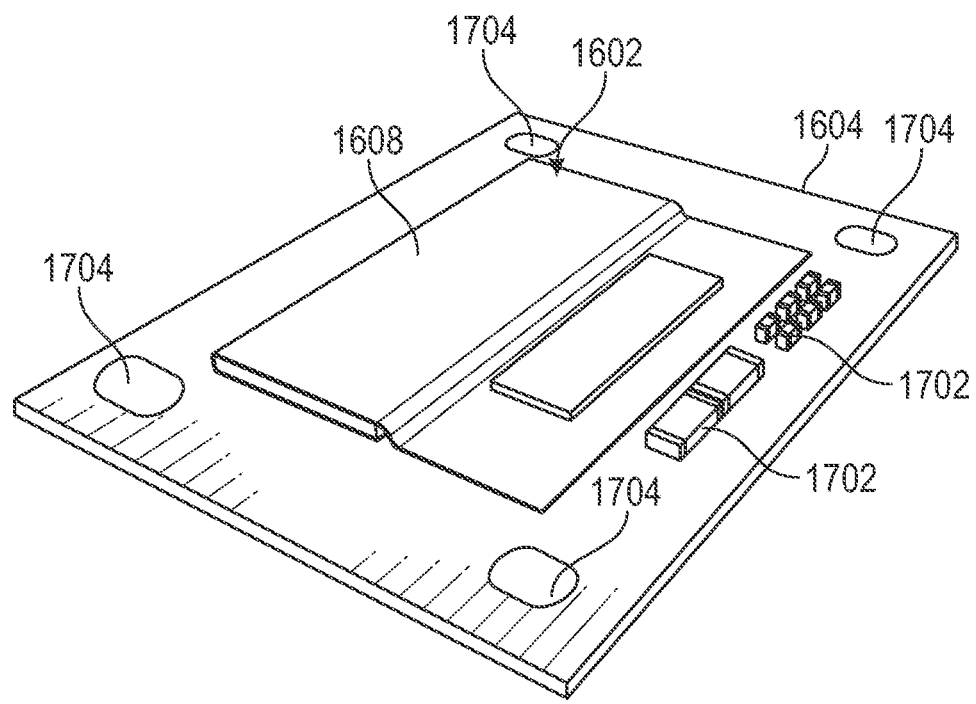
Figure 18A:
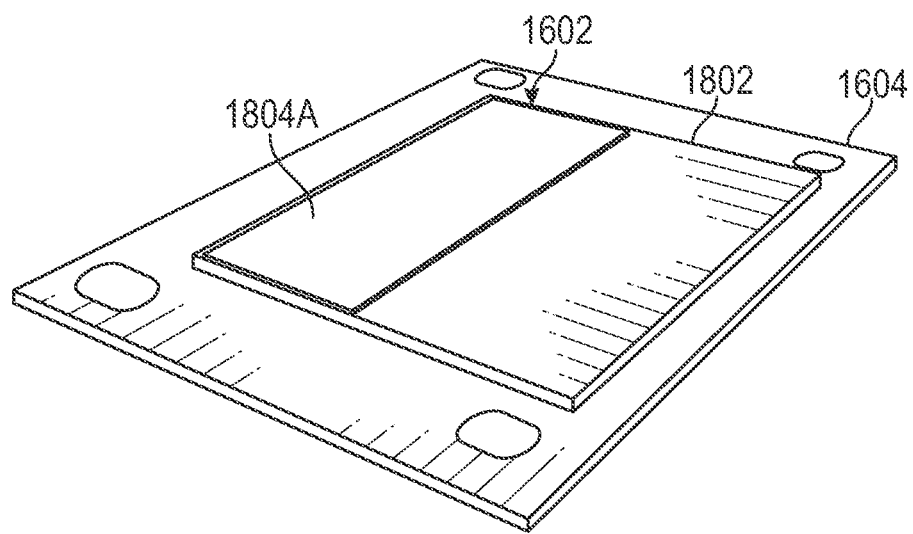
FIGS. 18A-18B illustrate a double-sided wrapped flexible sensor inserted into a PCB frame.
Figure 18B:
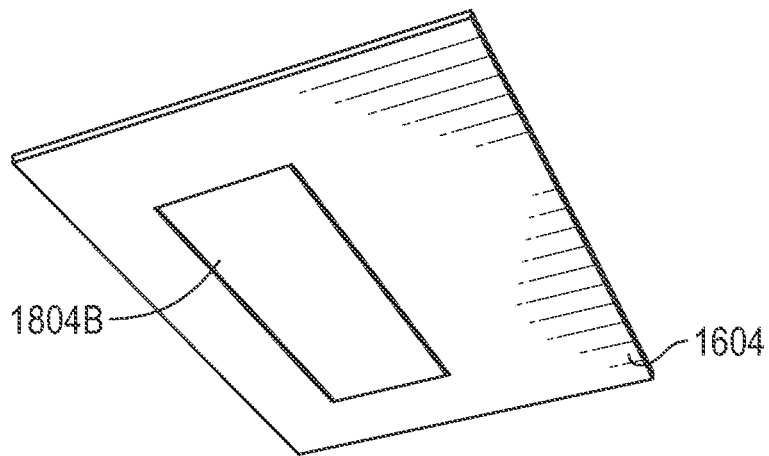

In another embodiment, a double-sided wrapped flexible sensor 1602 can be inserted into a PCB frame 1604, as shown in FIG. 16. The PCB frame 1604 is larger than the double-sided wrapped flexible sensor 1602 and has a cutout 1606 to provide clearance for the insertion of the double-sided wrapped flexible sensor 1602. The double-sided flexible sensor 1602 comprises two sensing areas, one sensing area on each surface of the sensor 1602, such as sensing area 1608 on the top surface, and a host device connection tab 1610. The host device connection tab 1610 comprises the ASIC 1612 and is used to make electrical contact with one side of the PCB frame 1604. As shown in FIG. 17, the double-sided wrapped flexible sensor 1602 is inserted into the PCB frame 1604, so that the two sensing areas are accessible through the cutout. In an embodiment, other components, such as, additional passive components 1702 and interconnect pads 1704 can be mounted on the PCB frame 1604. In an embodiment, an encapsulant 1802 (e.g., molding compound) is used to encapsulate the ASIC 1612 and the passive components 1702 in a protective compound, such as non-conductive dielectric material, as shown in FIGS. 18A-18B. In this embodiment, the top sensing area 1804A and the bottom sensing area 1804B are not encapsulated by the encapsulant 1802 and exposed on the top and bottom surface of the double-sided wrapped flexible sensor 1602.

Figure 19A:
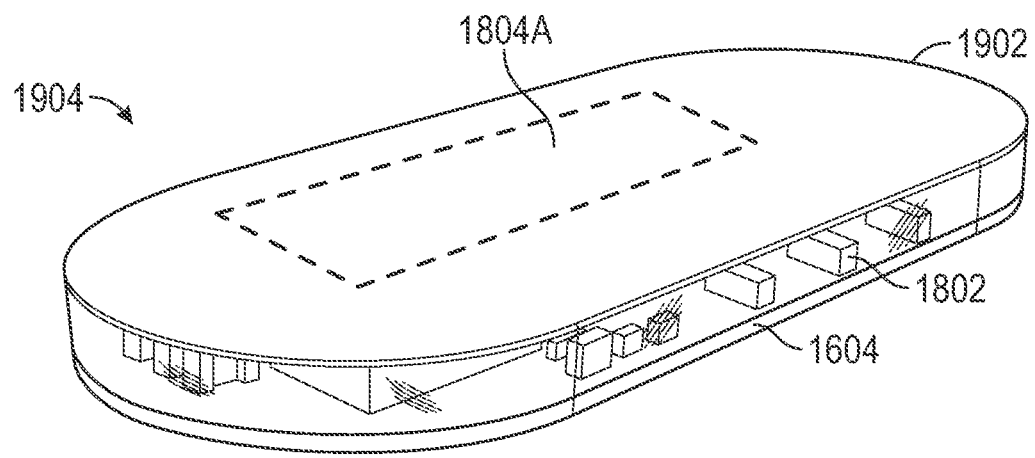
FIGS. 19A-19B illustrate an encapsulated double-sided sensor module.
Figure 19B:
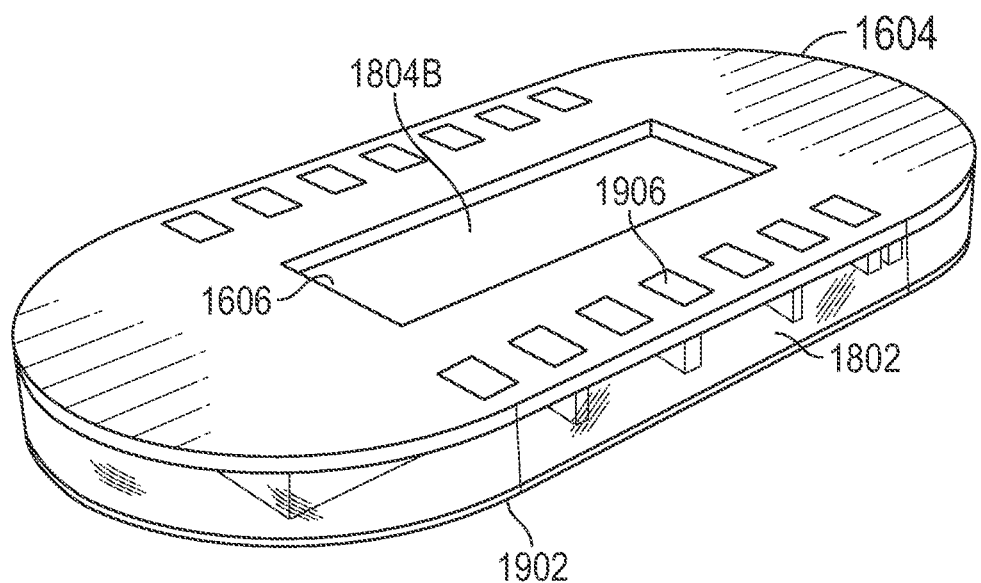

In another embodiment, the encapsulant 1802 can flow to the edges of the PCB frame 1604, as shown in FIGS. 19A-19B. As described in U.S. Patent Application Publication No. 2018-0213646 "Configurable, Encapsulated Sensor Module and Method for Making Same," the disclosure of which is hereby incorporated by reference, explains that a cover panel 1902 can be added before the encapsulation process so that the edges can be surrounded by the encapsulant 1802 in order to create a robust, homogeneous double-sided sensor module 1904. This allows the double-sided sensor module 1904 to be formed in a particular shape, such as a button or a switch for the host device. FIG. 19A shows a top view of the homogeneous double-sided sensor module 1904. As illustrated in FIG. 19A, the top sensing area 1804A is exposed underneath the cover panel 1902 (e.g. by forming an opening in the cover panel 1902 over the sensing area 1804A or by making at least a portion of the cover over the sensing area in such a manner to permit fingerprint sensing through the cover panel (thickness and/or material)). FIG. 19B shows a bottom view of the homogenous double-sided module 1904. As illustrated in FIG. 19B, the PCB 1604 comprises a cutout 1606 and the bottom sensing area 1804B is exposed through the cutout 1606. As shown in FIG. 19B, the sensor module 1904 may include one or more land grid arrays (LGA) pads 1906.

Embedding a Double-Sided Sensor Module into a Device

Figure 20:
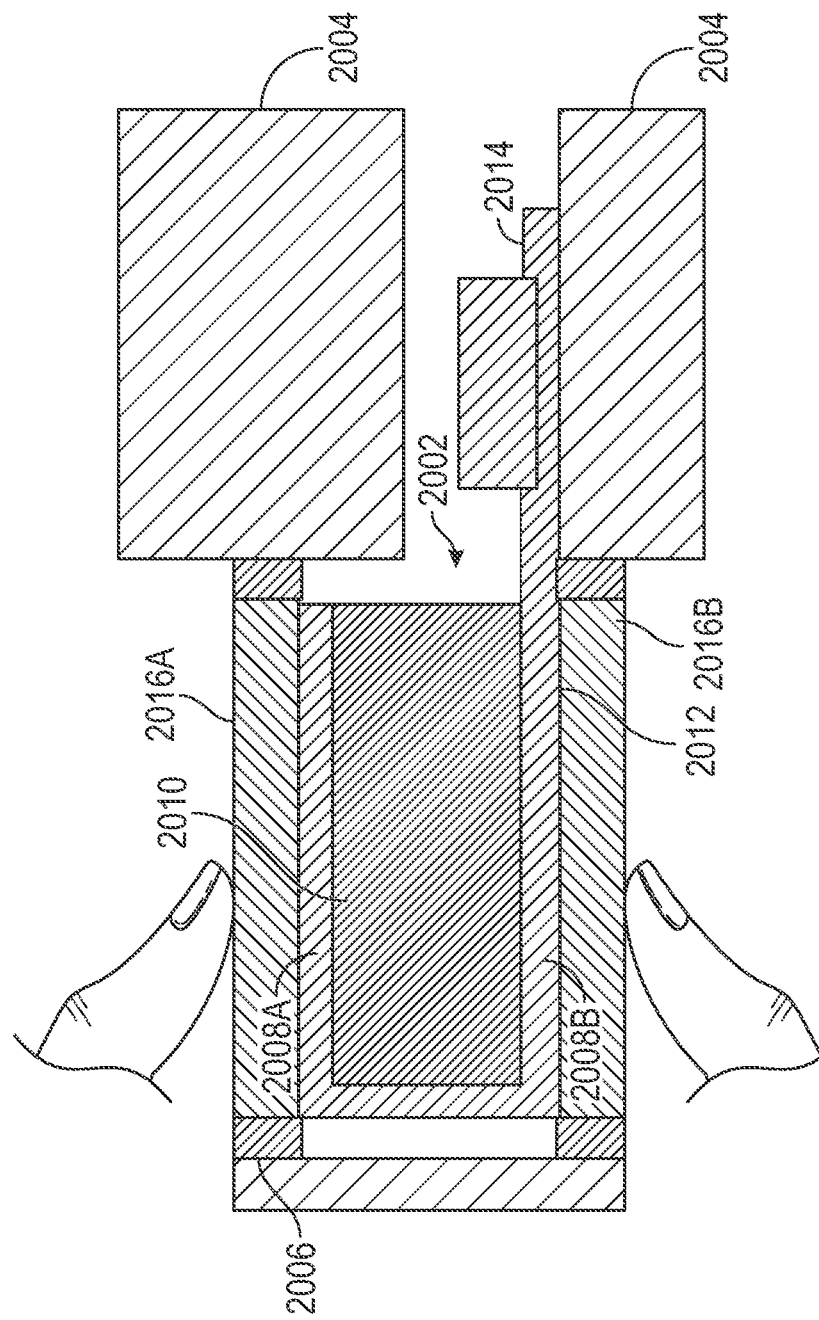
FIG. 20 illustrates a double-sided sensor module mounted into a host device.
Figure 21:
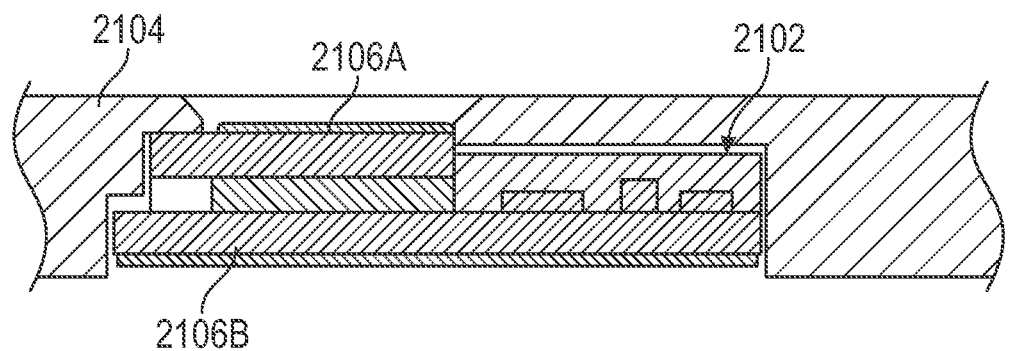
FIG. 21 illustrates an embodiment of a double-sided sensor module mounted in a device, wherein the double-sided sensor module comprises two PCBs for the double sided sensor.

In an exemplary embodiment, a double-sided sensor module 2002, which may comprise a double-sided flexible sensor substrate 2012 wrapped around a rigid core 2010, is incorporated into a host device 2004 (e.g., smart phone, computer, access control element (door lock), IoT device, etc.) in a suitable position such that a user can comfortably touch both sensing areas 2008A-B, as shown in FIG. 20. In an embodiment, an opening in the host device 2004 may be created to insert the double-sided sensor module 2002 and mount onto the host device 2004. An interconnect portion 2014 of the substrate 2012 connects the sensor module 2002 to the host device 2004. Upper and lower cover panels or protective coatings 2016A, 2016B may be provided to cover the sensing areas 2008A, 2008B, respectively. In another embodiment, the double-sided sensor module 2002 may be mounted on an edge or corner of the host device 2004. In an embodiment, a frame 2006, filler or bezel may surround the double-sided sensor module 2002 to hold it in place with respect to the host device 2004. In an embodiment, the sensing areas 2008A-B may be flush with an outer surface of the host device 2004, be recessed with respect to the outer surface of the host device 2004, protrude with respect to the outer surface of the host device 2004 or protrude with respect to the mounting frame 2006. In some embodiments, a double sided fingerprint sensor module 2102 comprising two separate PCB boards 2106A-B may be mounted in a host device 2104 (e.g., smart phone, computer, access control element (door lock), IoT device, etc.) as shown in FIG. 21. In some embodiments, the two separate PCB boards 2106A-B of the double-sided fingerprint sensor module 2102 may be connected as described in any one of FIGS. 9A-9C.

Method of Inserting a Double-Sided Sensor Module into a Smart Card

Figure 22A:
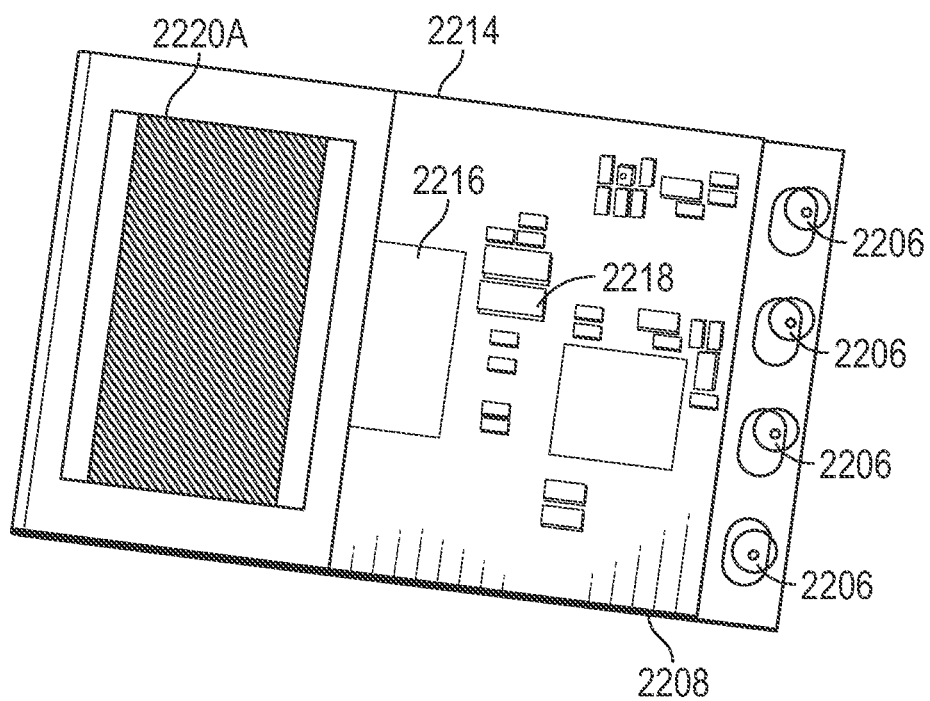
FIGS. 22A-22C illustrate a perspective view, top plan views, and a cross-sectional view of an embodiment of the double-sided sensor module.
Figure 22B:
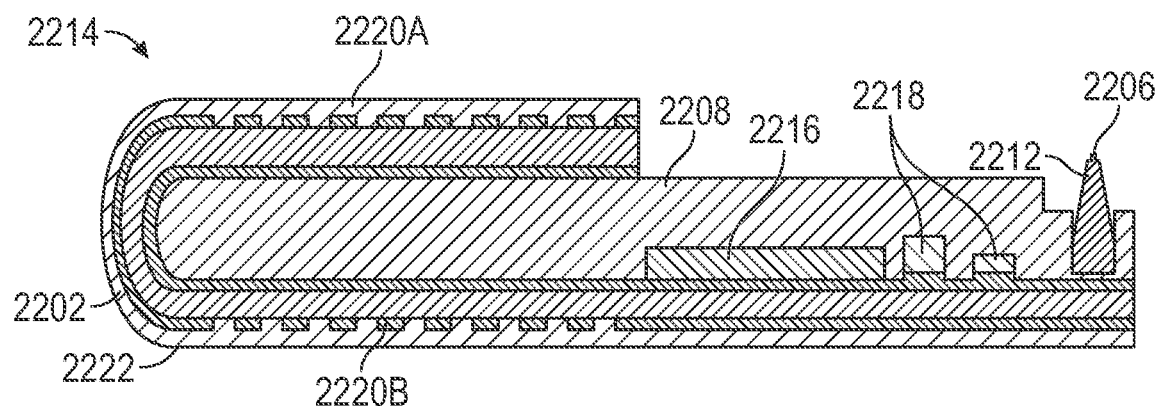

FIGS. 22A-22B illustrate an exemplary embodiment of a double-sided sensor module suitable for incorporation into a smart card. A double-sided flexible substrate comprises one or more alignment holes and a plurality of drive lines and pickup lines to form two separate sensing areas for the double-sided sensor module, as described in FIGS. 2A-2C. As shown in FIG. 6A, an encapsulant, such as non-conductive dielectric material, is applied on a portion of a top surface of the double-sided flexible substrate containing an ASIC and passive components to encapsulate the components and form an encapsulant core 602. FIG. 6A shows that the encapsulant core 602 has two opposing flat surfaces and comprises one or more integral mounting pins 604A, 604B on the top surface. The integral mounting pins are positioned on the top surface of the encapsulant core 602 to be aligned with the one or more alignment holes 606A, 606B on the double-sided flexible substrate 608 when the flexible substrate is wrapped around the core. As shown in FIG. 6A, the one or more cutouts 612 are formed around the conductive pads 614 on the flexible substrate 608. In some embodiments, one or more ACA flexible bumps are applied through the cutouts 612 on each of the conductive pads 614 to provide an interconnection between the double-sided flexible substrate 608 and the smart card. In a preferred embodiment, four ACA flexible bumps are used as interconnection components to connect to the smart card. In an embodiment, the encapsulant core 608 is stepped and comprises the one or more cutouts 612 of appropriate size and position to receive the ACA flexible bumps.

FIG. 6D shows a top view of the double-sided sensor module 600 (cover panel and/or protective coating is not shown). FIG. 22A shows an "x-ray" top view of the double-sided sensor module 2214 (similar or identical to module 600 in FIG. 6D). The "x-ray" top view illustrates the position of the components, such as the ASIC 2216 and passive components 2218, encapsulated within the encapsulant core 2208. FIGS. 22A and 22B further illustrates the location of the sensing areas 2220A-B (only top sensing area 2220A is shown in FIG. 22A) and the one or more ACA flexible bumps 2206 within the double-sided sensor module 2214.

FIG. 22B shows a cross-sectional view of the double-sided sensor module 2214. As shown in FIG. 22B, the ASIC 2216 and passive components 2218 are encapsulated within the encapsulant core 2208. The double-sided flexible substrate 2202 is wrapped around the encapsulant core 2208 so that a top sensing area 2220A is located on top of the encapsulant core 2208 and a bottom sensing area 2220B is located underneath the encapsulant core 2208. A protective coating 2222 may cover the entire outer surface of the double-sided flexible substrate 2202 and the one or more ACA flexible bumps 2206 are located within the one or more cutouts 2212 of the encapsulant core 2208.

Figure 22C:
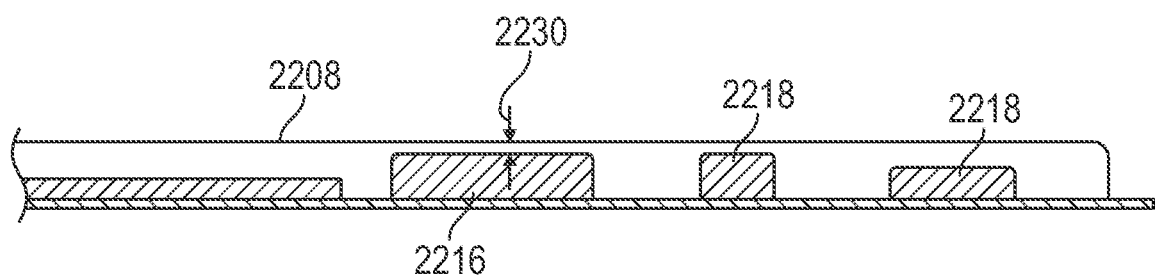

In some embodiments, the encapsulant core 2208 may provide a layer of protection above a top surface of the encapsulated ASIC 2216 and passive components 2218. As shown in FIG. 22C, the encapsulant core 2208 may provide a minimum molding gap 2230, i.e. a layer of encapsulant, of 0.090 mm over the top surface of the encapsulated ASIC 2216 and passive components 2218. The thickness of the minimum molding gap may vary in alternative embodiments. In some embodiments, the encapsulated ASIC 2216 and passive components 2218 may be 330 µm components. In some embodiments, the encapsulant, such as non-conductive dielectric material, applied on a portion of a top surface of the double-sided flexible substrate containing the ASIC and passive components to encapsulate the components and form an encapsulant core may be a translucent overmold or a solid overmold.

Figure 23A:
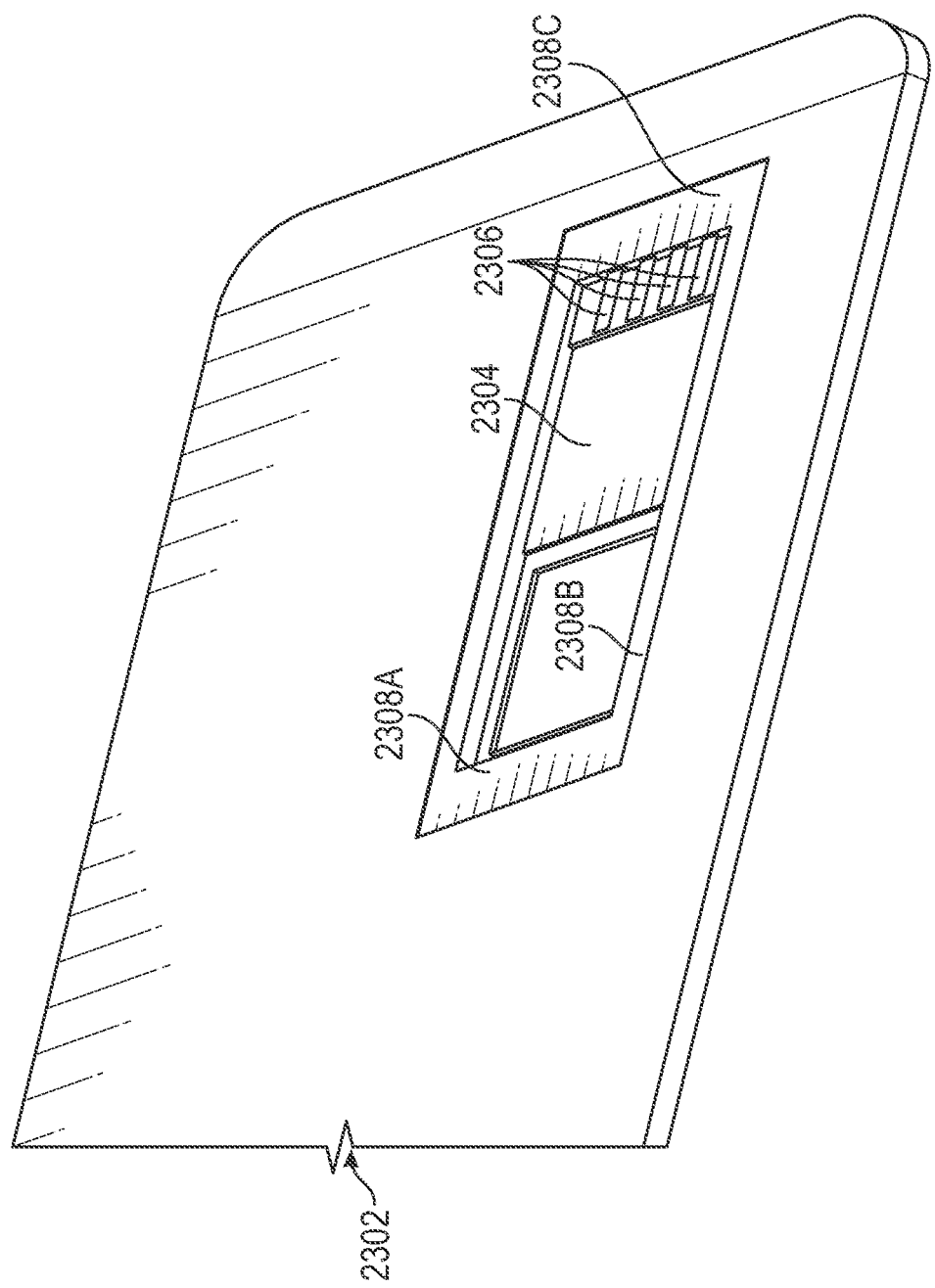
FIGS. 23A-23B shows a smart card that is manufactured using conventional methods with a cavity milled through the smart card to receive the double-sided sensor module.

In an exemplary embodiment, the double-sided sensor module 2214 is inserted into a smart card that is manufactured using standard processes and machinery. FIG. 23A shows a smart card 2302 that is manufactured using conventional methods with a cavity 2304 milled into and partially through the smart card 2302 to receive the double-sided sensor module 2214 described in FIGS. 22A-22B. The cavity 2304 comprises a cavity opening 2308B and a through hole 2308A. The cavity opening 2308B on one side of the smart card 2302 exposes a large enough area to allow practical insertion of the double-sided sensor module 2214. The through hole 2308A on the other side of the smart card 2302 is smaller in area, in order to expose only the sensing area of the double-sided sensor module and to leave a layer of the smart card 2302 to provide protection for the double-sided sensor module when inserted in the cavity 2304. A ledge 2308C surrounds the cavity opening 2308B and is not milled as deeply into the smart card 2302 as the cavity opening 2308B.

Figure 23B:
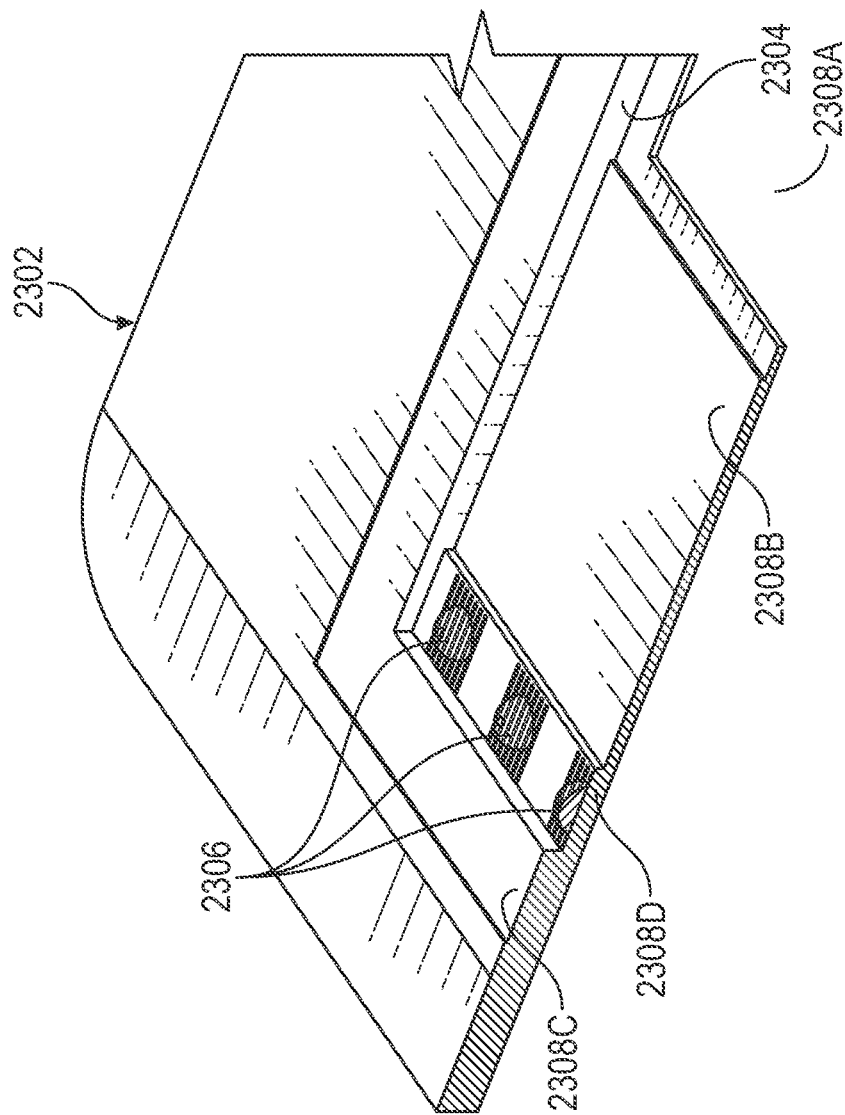

Contacts 2306 are formed at one edge of the cavity 2304 and may be disposed on a raised ledge 2308D. The contacts 2306 may be used for electrical connection between the sensor module 2214 and the existing smart card 2302 circuitry, such as one or more antennas, an EMV chip, and processors embedded in the smart card 2302. In an embodiment, the contacts 2306 are positioned in a line parallel to a short edge of the smart card 2302. In a preferred embodiment, the edge of the cavity 2304 comprises four contacts 2306. In an embodiment, the double-sided sensor module 2214 is inserted in the cavity 2304 so that the four ACA flexible bumps 2206, as described in FIG. 22A, are aligned with the four contacts 2306. FIG. 23B shows a perspective view cross-section of the cavity 2304 comprising the contacts 2306 and conductive bumps. In some embodiments, the one or more ACA flexible bumps 2206 are applied on the contacts 2306 of the smart card 2302, as shown in FIG. 23B. In this embodiment, the double-sided sensor module 2214 is aligned with the cavity 2304 and inserted so that the four ACA flexible bumps 2206 located on the contacts 2306 of the smart card 2302 fits in the cutouts 612 formed in the core 602 and contacts the conductive pads 614 to provide an interconnection between the double-sided flexible substrate 608 and the smart card. In some embodiments, the one or more ACA flexible bumps 2206 are applied on the contacts 2306 of the smart card 2302, as shown in FIG. 23B, and on each of the conductive pads 614 through the cutouts 612, as shown in FIG. 6A, to provide an interconnection between the double-sided sensor module 2214 and the smart card.

Figure 24A:
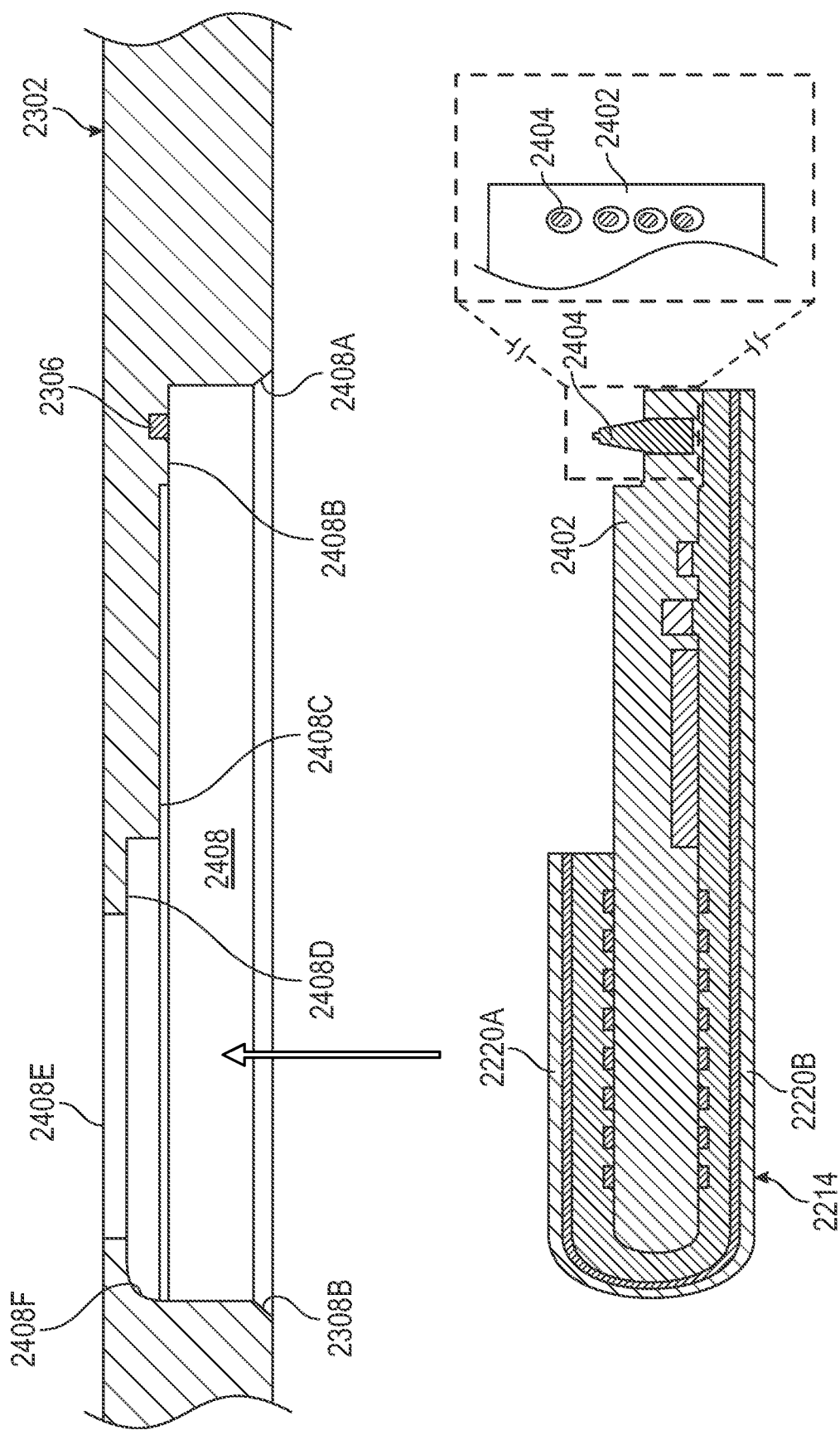
FIG. 24A-24F illustrates a method of inserting the double-sided sensor module into the smart card.
Figure 24B:
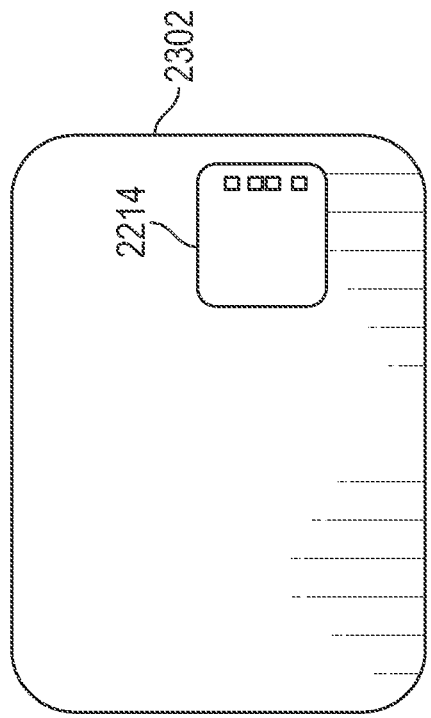

As shown in FIG. 24A, an exploded, cross-section of the card body and sensor module, the double-sided sensor module 2214 is inserted into the smart card 2302 through the larger cavity opening 2308B. A plan view of a bottom surface of the smart card 2302 with the double-sided sensor module 2214 mounted in place is shown in FIG. 24B.

Figure 24C:
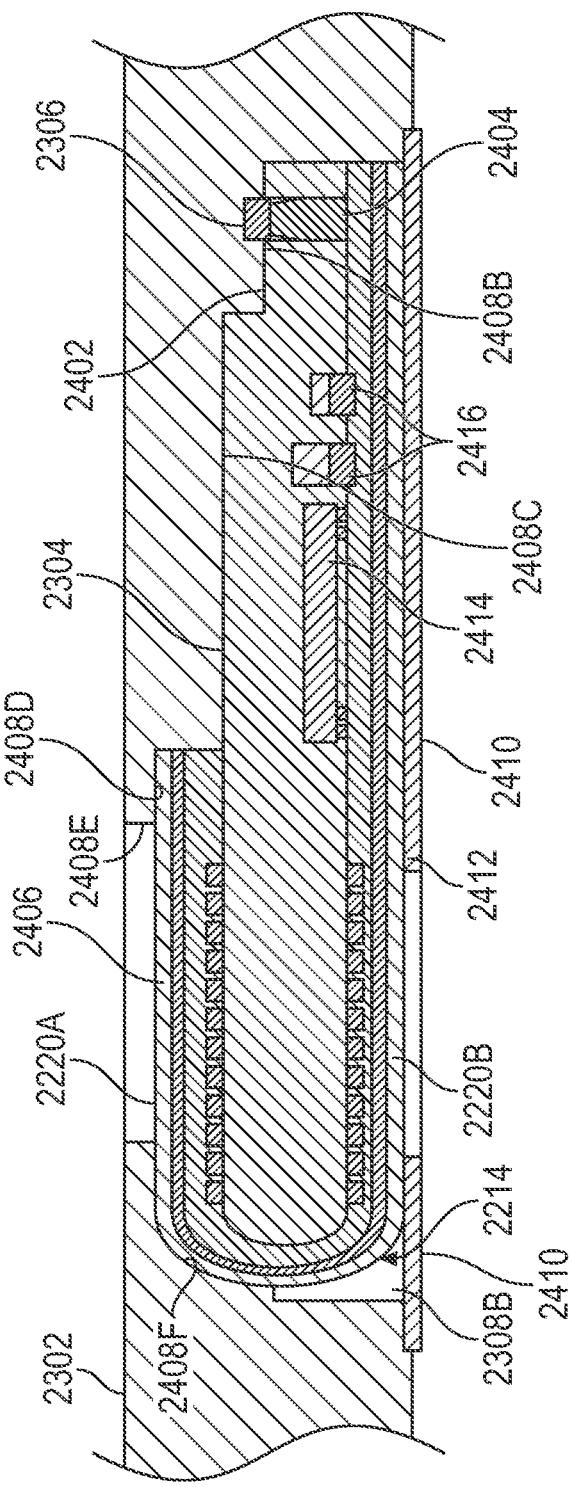

FIG. 24C shows a cross-sectional view of the smart card 2302 containing the inserted double-sided sensor module 2214. Referring to FIGS. 24A and 24C, a receiving surface of a cavity 2408 comprises steps 2408 B-D conforming to the contours of a top surface of the double-sided sensor module 2214 to accommodate the stepped design of the double-sided sensor module 2214. Cavity 2408 may include a rounded portion 2408F conforming to a rounded, wrapped end of the module 2214 and a through hole 2408E provides detecting access to upper sensing surface 2220A. The contacts 2306 on the edge of the cavity 2408 are aligned with the flexible bumps 2404 located in the double-sided sensor module 2214 (flexible bumps 2404 are shown both in cross-section and partial plan view in FIG. 24A).

In the preferred embodiment, the physical dimensions of the smart card 2302 are in accordance to an ID-1 ISO/IEC 7810 format smart card. In another embodiment, the physical dimensions of the smart card 2302 in the preferred embodiment may be scaled relatively for ID-2, ID-3, ID-00 or other format cards. In a preferred embodiment, the height of a step 2402 in the encapsulant core which facilitates the connection between the flexible bumps 2404 and the smart card contacts 2306 is approximately at the center of smart card 2302 cross-section. The connection between the flexible bumps 2404 and the smart card contacts 2306 is illustrated and further described in FIG. 24D.

In the preferred configuration, a top surface 2406 of the double-sided sensor module 2214 is recessed in relation to the top surface of the smart card 2302 (e.g. by approximately 150 μm). The recess (defined by step 2408D) provides a suitable amount of card material surrounding a top sensing area 2220A and allows a user to easily locate the top sensing area 2220A by feel and additionally provides protection for the sensor surface. Caution must be taken so that the recess is not too deep, thereby preventing a finger to make sufficient contact with the top sensing area 2220A. In the preferred embodiment, a layer of the smart card 2302 material (e.g. approximately 205 μm) is provided over the encapsulant core containing the ASIC 2414 and passive components 2416. The layer of the smart card 2302 (defined by step 2408C) protects the ASIC 2414 and passive components 2416 from outside force. Steps 2408C and 2408D (and, possibly, step 2408B) provide surfaces for retaining the sensor module 2214 within the cavity and to which the sensor module may be adhered by a suitable adhesive. As shown in FIG. 24E, a portion of the encapsulant core not covered by the overlapped portion of the flexible substrate has a reduced thickness, and may have a thickness that is equal to the thickness of the portion in which the openings for the contacts 2306 are formed.

In an embodiment, a thickness of the layer of the smart card 2302 over the encapsulant core containing the ASIC 2414 and passive components 2416 may be increased to line up with the approximate center of the smart card 2302 cross-section and the contacts 2306, as shown in FIG. 24E.

In the preferred embodiment, a stiffener frame 2410, also referred to as a "picture frame, is placed underneath the inserted double-sided sensor module 2214 to securely fix the module 2214 in the cavity 2304. The stiffener frame 2410 comprises a layer of stainless steel with a thickness of 100 um. The stiffener frame 2410 comprises a cutout 2412 to expose a bottom sensing area 2220B of the inserted double-sided sensor module 2214 while covering the cavity opening to securely fix the double-sided module in the cavity 2304. The frame 2410 may be set in the step, or ledge, 2408A surrounding the cavity 2304. FIGS. 13A-13B shows an exploded view of the stiffener frame 1204, the double-sided sensor module 1202, and the smart card 1208.

Figure 24D:
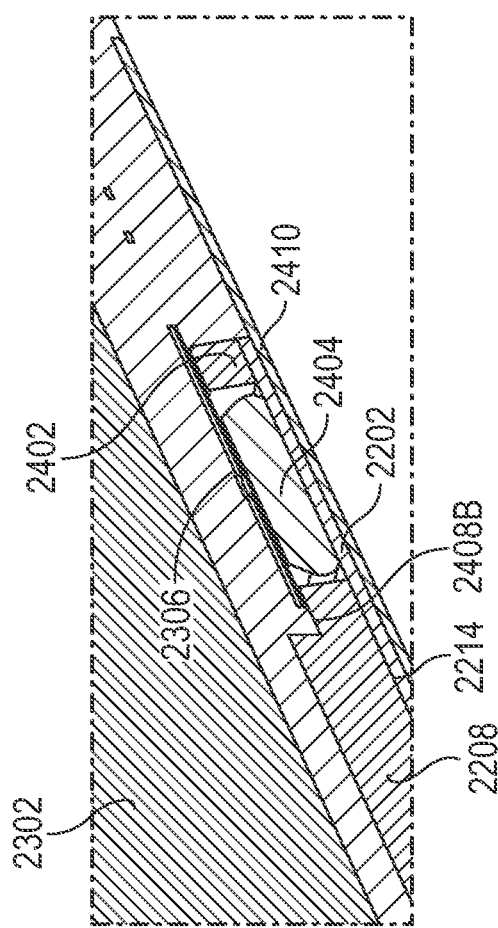
Figure 24E:
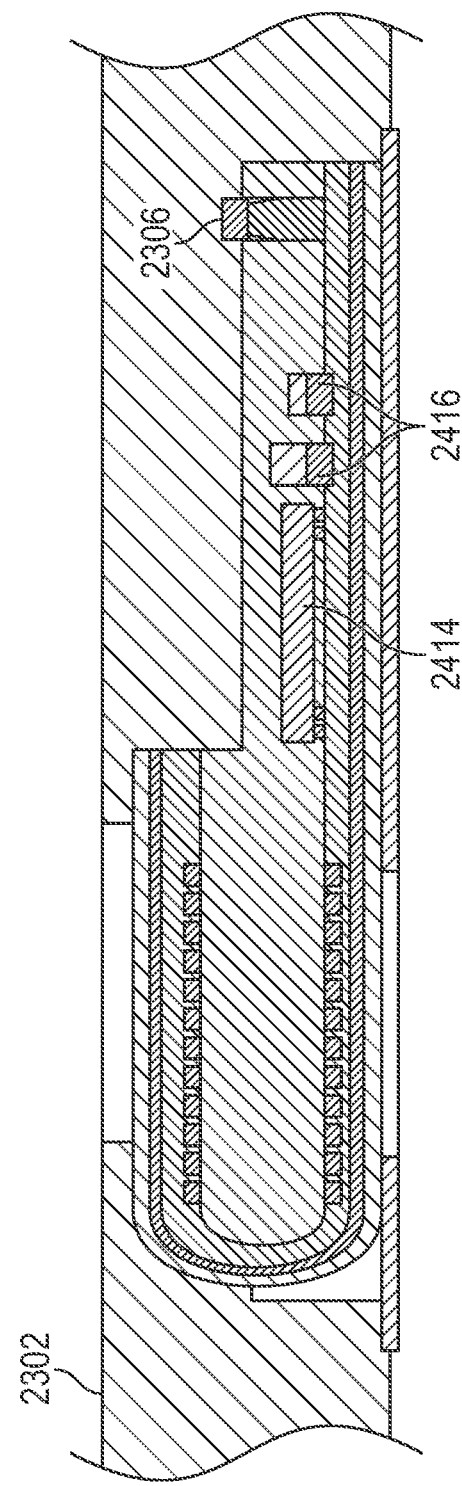

FIG. 24D shows a perspective cross-sectional view of a portion of the smart card 2302 interconnected with the inserted double-sided sensor module 2214. As shown in FIG. 24D, upon insertion of the double-sided sensor module 2214, a flexible bump 2404 electrically connects the double-sided flexible substrate 2202 within the double-sided sensor module 2214 with one card contact 2306. The flexible bump 2404 provides the significant advantage of decoupling the double-sided sensor module 2214 from any movement of the smart card 2302 while maintaining the electrical connection. In an embodiment, the "MB FB 6000 Flexible bump" from Muehlbauer is used as the flexible bump 2404. In a preferred embodiment, the contacts 2306 are lined up parallel to the short edge of the smart card 2302 and the flexible bumps 2404 have a height of approximately 200 μm. A low modulus, hot melt 'tape' (e.g. "MB CMA 6000 Chipmodule Adhesive" from Muehlbauer) is used to secure the sensor module into the cavity in the card. In some embodiments, the hot melt "tape" is applied around the perimeter of the double-sided sensor module 2214 for mechanical attachment to the smart card 2302. When both the flex bumps 2404 and the hot melt "tape" are used as interconnection components to securely mount the double-sided sensor module 2214 into the smart card 2302, the resulting radius of flexure of the double-sided sensor module 2214 is much greater than the smart card 2302 radius of flexure. Accordingly, the smart card 2302 containing the inserted double-sided sensor module 2214 will withstand the stringent industry standard twist and bend tests for smart cards.

Figure 24F:
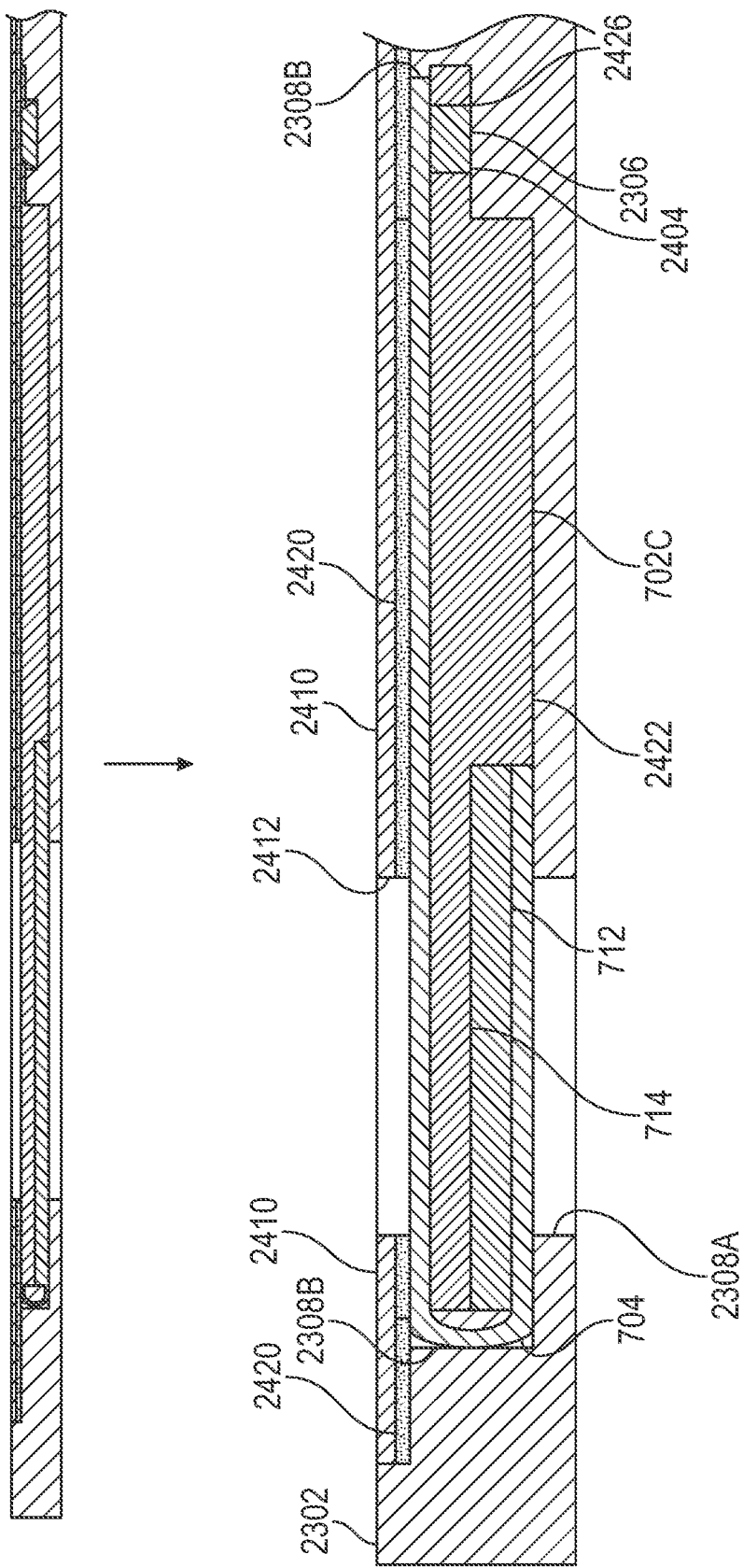

FIG. 24F shows a cross-sectional view of the smart card 2302 containing an inserted double-sided sensor module. In this embodiment, the double-sided sensor module comprises a wrapped encapsulant core 2422, which may comprise a core as shown in FIG. 7C. As described in FIG. 7C, the overmold sheet 712 formed on the surface of the double-sided flexible substrate 704 is folded over the first portion 714 of the stepped encapsulant core 702C to form the wrapped encapsulant core 2422. In some embodiments, the stepped encapsulant core 702C may comprise integrally molded cutouts 2426 which expose conductive pads on the flexible substrate 704. The wrapped encapsulant core 2422 is aligned and inserted into the smart card 2302 through the larger cavity opening 2308B. In some embodiments, the flexible conductive bumps 2404 electrically connect the exposed conductive pads of the double-sided flexible substrate 704 to the smart card contacts 2306. The stiffener frame 2410 may be placed over the inserted wrapped encapsulant core 2422 to securely fix the wrapped encapsulant core 2422 in place. In some embodiments, an adhesive layer 2420 is applied to a surface of the stiffener frame 2410 which faces the wrapped encapsulant core 2422 before placing the stiffener frame 2410 over wrapped encapsulant core 2422. The stiffener frame 2410 may comprise a cutout 2412 to expose a first sensing area of the inserted wrapped encapsulant core 2422. In some embodiments, a second sensing area of the inserted wrapped encapsulant core 2422 is exposed though the through hole 2308A formed in the smart card 2302. In alternative embodiments, the double-sided sensor module may comprise the wrapped encapsulant core 2422 as described in any one of FIGS. 7A-7B and 7D-7E.

Double-Sided Sensor Module Comprising Two Single Sensor Modules

Figure 25:
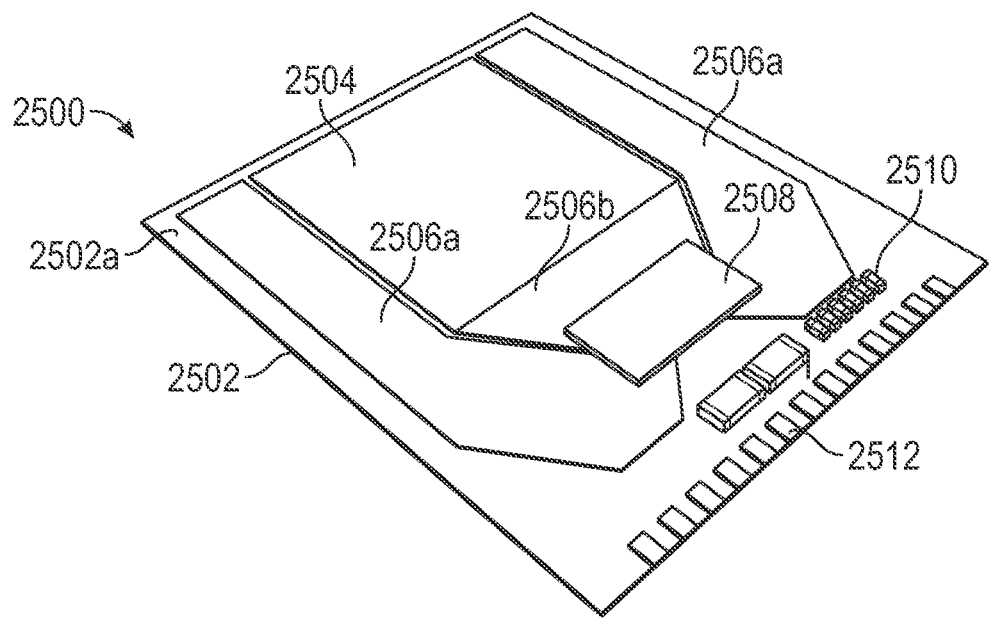
FIG. 25 is a perspective view showing a single-sided fingerprint sensor assembly.

FIG. 25 shows a single fingerprint sensor assembly 2500 implemented on a double-sided substrate 2502. As shown in FIG. 25, the single-sided fingerprint sensor 2500 may comprise a double-sided flexible substrate 2502, an ASIC (or other microchip or integrated circuit) 2508, one or more passive components 2510 (e.g., capacitors and inductors), and interconnect pads 2512 configured to connect the single fingerprint sensor assembly 2500 to a controlling processor. In various embodiments, the ASIC 2508 may control the functions of the single fingerprint sensor assembly 2500. For example, the ASIC 2508 may control functions of the single fingerprint sensor assembly 2500 such as managing image capture process, conducting image processing, matching and enrolling fingerprints, and authenticating fingerprints, among others. In some embodiments, the interconnect pads 2512 may be configured for use with Anisotropic Conductive Film (ACF), conductive bumps, among others. The assembly 2500 includes a sensing area 2504 comprising an array of sensor elements, wherein one surface of the array (a sensing surface) is configured to generate signals indicative of the presence or characteristics of an object contacting the surface, such as signals indicative of features of a fingerprint of a finger contacting the sensing surface of the array. In some embodiments, a first surface 2502a of the double-sided flexible substrate 2502 may comprise a plurality of pickup (Rx) lines (not shown in FIG. 25), the ASIC 2508, the passive components 2510, and the interconnect pads 2512. Each of the plurality of pickup lines is electrically connected to the ASIC 2508 by interconnect lines 2506a or 2506b (e.g., routing traces) (for simplicity, individual interconnect lines are not shown). In some embodiments, a second surface 2502b (not shown in FIG. 25) of the double-sided flexible substrate 2502 may comprise a plurality of drive (Tx) lines formed in a direction perpendicular to and overlapping the plurality of pickup lines. Each of the drive lines is electrically connected to the ASIC 2508 by interconnect lines 2506a or 2506b (e.g., routing traces) (for simplicity, individual interconnect lines are not shown). Portions of the interconnect lines 2506a and/or 2506b may be located on surface 2502b. Accordingly, in an embodiment, the sensing area 2504 of the fingerprint sensor 2500 comprises a grid of the plurality of pickup lines and the plurality of drive lines forming an array of sensor elements, each sensor element being formed by an overlapping drive line and pickup line. In some embodiments, the first surface 2502a of the double-sided flexible substrate 2502 may comprise the plurality of drive lines. In such embodiments, the second surface 2502b of the double-sided flexible substrate 2502 comprises the plurality of pickup lines. The double-sided flexible substrate 2502 may comprise a dielectric substrate and may comprise a flexible dielectric substrate, which may be a polymer-based substrate (e.g. polyimide), such as Kapton® or Upilex®, and the drive lines and pickup lines forming the sensor surface 2504 may comprise a plurality of conductive traces made of a suitable conductive material, such as copper, tin, silver, nickel, aluminum, or gold are formed, etched, deposited, plated, printed, or otherwise applied to or embedded into each surface, or side, of the double-sided flexible substrate 2502.

Figure 26:
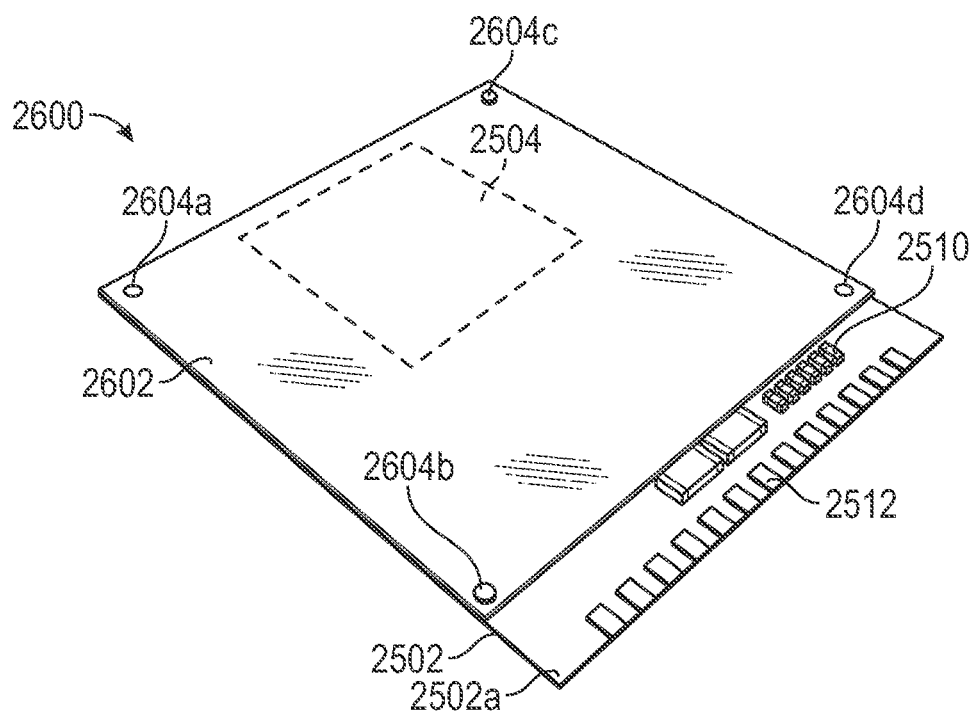
FIG. 26 is a perspective view showing a first step (intermediate assembly) for creating a double-sided sensor module from two single-sided fingerprint assemblies.
Figure 27A:
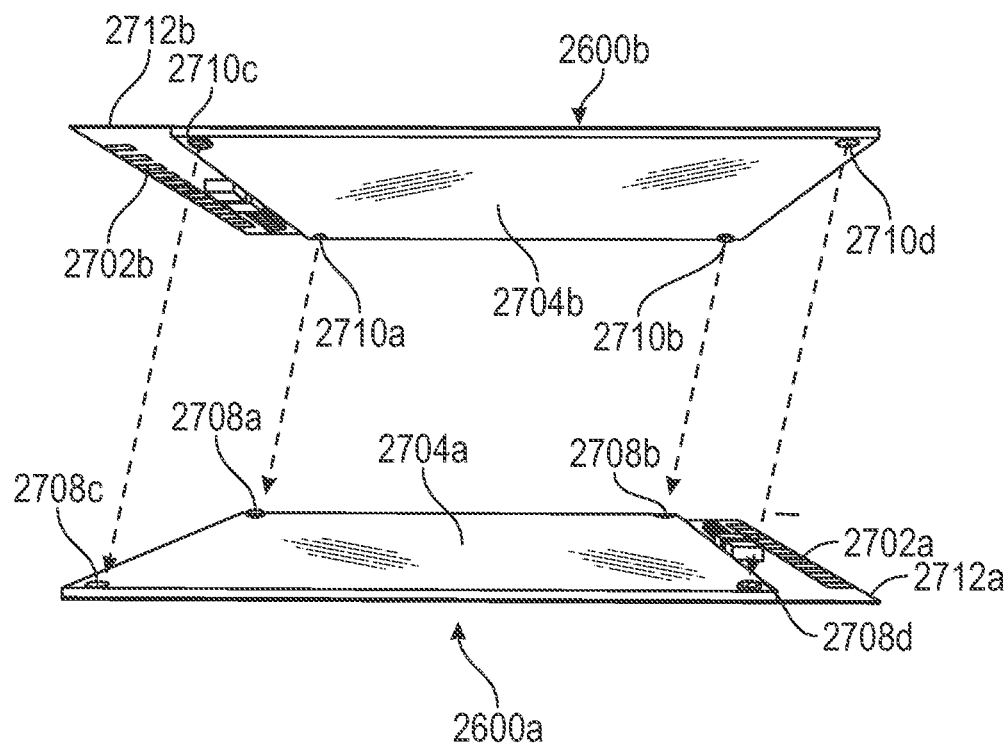
FIGS. 27A-27B are exploded perspective views showing a second step for creating the double-sided sensor module.
Figure 27B:
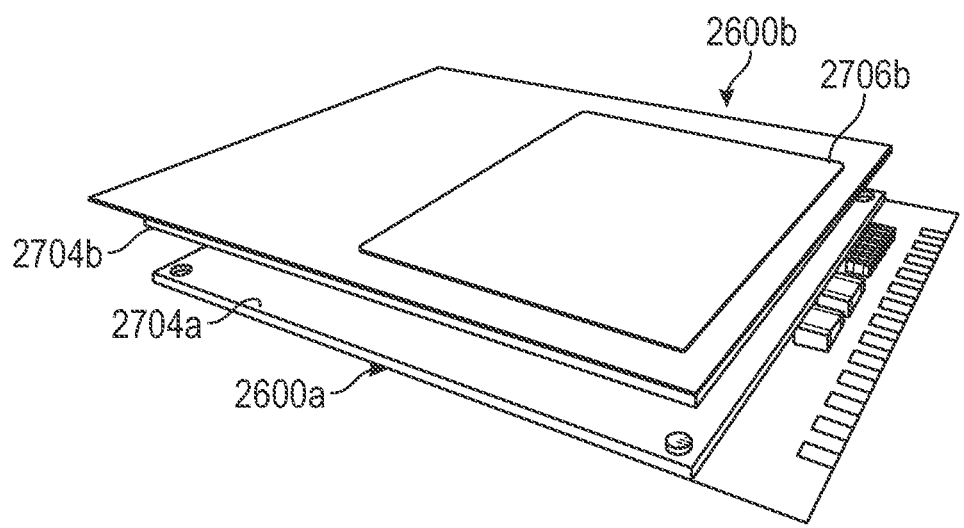
Figure 28:
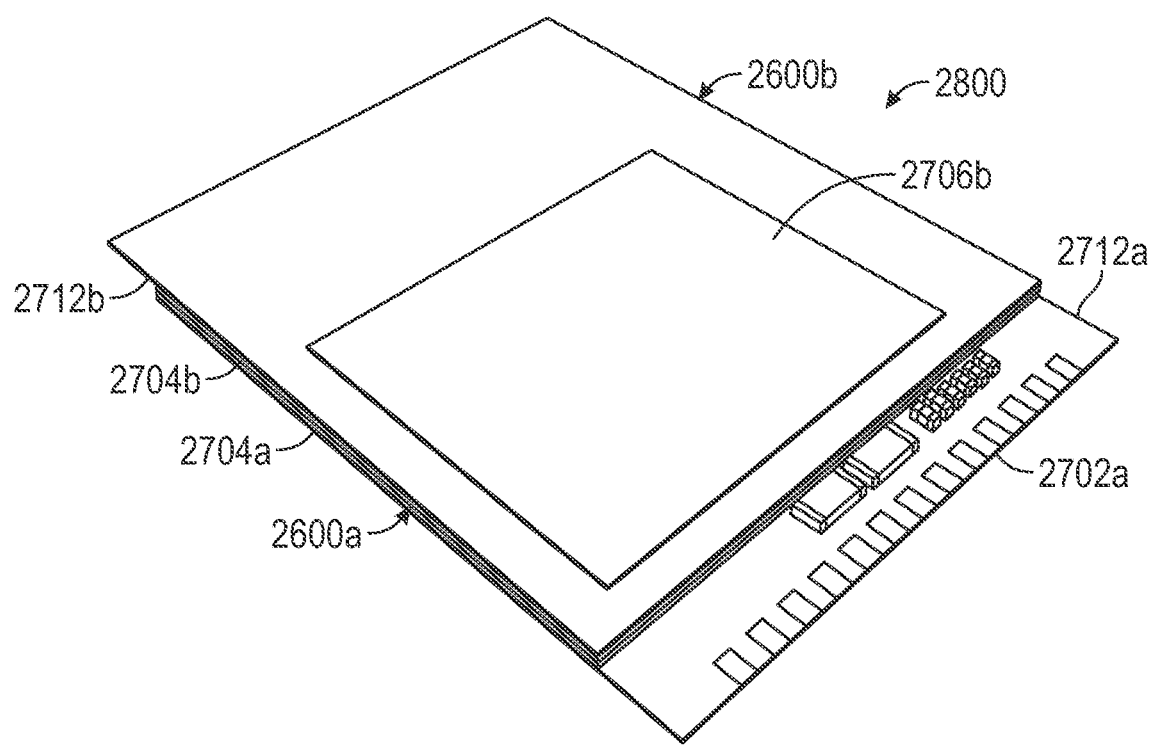
FIG. 28 is a perspective view of a double-sided fingerprint sensor embodying aspects of the present disclosure.

FIGS. 26-28 show a method of creating the double-sided sensor module using the single fingerprint sensor 2500 as described, for instance, in FIG. 25, according to some embodiments.

FIG. 26 shows an intermediate assembly 2600 of a first step for creating the double-sided sensor module. As shown in FIG. 26, components on the surface 2502a of the fingerprint sensor 2500 may be encapsulated with an overmold 2602 (e.g., encapsulant) to create a single-sided fingerprint sensor module 2600 (e.g., single-sided sensor assembly). In some embodiments, drive (Tx) lines of the sensing area 2504, the interconnect lines 2506a and 2506b, and the ASIC 2508 on the first surface 2502a may be encapsulated in the overmold 2602. In other words, the overmold 2602 encapsulates the non-sensing side of the sensor array forming the sensing area 2504 (shown in dashed lines in FIG. 26). In some embodiments, the overmold 2602 may be made of a non-conductive, moldable dielectric material, as described above, and chosen for its appropriate degree of flexibility. As shown in FIG. 26, the passive components 2510 may not be encapsulated by the overmold 2602. In some other embodiments, the passive components 2510 may be encapsulated by the overmold 2602. The interconnect pads 2512 on an edge of the flexible substrate 2502 are not encapsulated and/or covered by the overmold 2602. In some embodiments, the overmold 2602 may comprise mounting posts and/or alignment holes 2604a-d integrally molded on a top surface of the overmold 2602. Any combination of mounting posts and/or alignment holes 2604a-d may be integrally molded on the top surface. As a non-limiting example, the overmold 2602 may comprise two mounting posts 2604a, 2604d, each mounting post formed in two corners positioned diagonally opposite from each other. In such embodiments, the overmold 2602 may comprise two alignment holes 2604b, 2604c in the remaining two corners, respectively.

As shown in FIG. 26, the overmold 2602 may comprise a flat top surface (apart from the mounting pins/alignment holes 2604a-d), according to some embodiments. However, the flat top surface is not required, and the overmold 2602 may comprise different shapes and sizes to create a resulting double-sided sensor module in any appropriate shape according to alternative embodiments.

FIGS. 27A-27B show a second step for creating the double-sided sensor module. As shown in FIG. 27A, a first overmolded single fingerprint sensor module 2600*a* and a second overmolded single fingerprint sensor module 2600*b* are prepared as described above, for instance, in FIG. 26. In some embodiments, the first single fingerprint sensor module 2600*a* may be rotated 180 degrees with respect to the second sensor module 2600*b* and flipped over so that a top surface of the respective overmolds 2704*a* and 2704*b* of each of the first and second single sensor modules 2600*a* and 2600*b* are facing each other and the sensing area 2706*b* (only one of the two sensing areas is shown in FIGS. 27B and 28) are on opposite sides of the overmold modules. In such embodiments, the first single fingerprint sensor module 2600*a* may be rotated and flipped over so that interconnect pads 2702*a* on a first double-sided flexible substrate 2712*a* and interconnect pads 2702*b* on a second double-sided flexible substrate 2712*b* of the first and second single sensor modules 2600*a*, 2600*b*, respectively, are on opposite ends. The top surface of the second overmold 2704*b* may be aligned with the top surface of the first overmold 2704*a* and fitted together, thereby stacking the second overmold 2704*b* over the first overmold 2704*a*. In some embodiments, the first overmold 2704*a* may comprise integrally formed mounting posts and/or alignment holes 2708*a-d* corresponding to the integrally formed alignment holes and/or mounting posts 2710*a-d* of the second overmold 2704*b*. As a non-limiting example, the first overmold 2704*a* may comprise two mounting posts 2708*a*, 2708*d* and two alignment holes 2708*b*, 2708*c*, and the second overmold 2704*b* may comprise two mounting posts 2710*b*, 2710*c* and two alignment hole 2710*a*, 2710*d* so that when the overmolds 2704*a* and 2704*b* are rotated 180 degrees and inverted, the mounting posts of one of the overmolds align with the alignment holes of the other overmold. Accordingly, the overmolded single fingerprint sensor module 2600*a*, 2600*b* can be formed identically to each other, thereby simplifying manufacturing. Alternatively, any combination of mounting posts and/or alignment holes 2708*a-d*, 2710*a-d* may be integrally formed on the top surface of the first and second overmold 2704*a-b*. Accordingly, the first and second single sensor modules 2600*a-b* are fitted together, one on top of the other, using the mounting posts and alignment holes 2708*a-d*, 2710*a-d*, to create a double-sided fingerprint sensor 2800 (e.g., double-sided fingerprint sensor assembly) comprising a first sensing area (not shown) and a second sensing area 2706*b* on a bottom and top surfaces, respectively, as shown in FIG. 28.

As shown in FIGS. 27A-27B, the two fingerprint sensor modules 2600*a*, 2600*b* may be of substantially similar size and dimension. However, the size and dimension of the two fingerprint sensor modules 2600*a*, 2600*b* may vary for alternative embodiments. In such embodiments, the position of the mounting pins and alignment holes 2708*a-d*, 2710*a-d* may be integrally formed on the overmolds 2704*a-b* accordingly to facilitate the fitting of the two fingerprint sensor modules 2600*a*, 2600*b* together. As a non-limiting example, it may be advantageous to have a sensor (e.g., first single fingerprint sensor module 2600*a*) with a larger sensing area on a side where a thumb may contact and a smaller sensor (e.g., second single fingerprint sensor module 2600*b*) where a finger may contact on the other side.

As shown in FIG. 28, a portion of the first and second double-sided flexible substrate 2712*a*, 2712*b* containing the interconnect pads 2702*a*, 2702*b* (2702*b* not shown in FIG. 28), respectively, for each single fingerprint sensor module 2600*a*, 2600*b* may overhang each end of the mated overmolds 2704*a*, 2704*b* of the double-sided fingerprint sensor 2800. In some embodiments, the portion of the first and second double-sided flexible substrate 2712*a*, 2712*b* overhanging each end of the overmolds may comprise passive components for each single fingerprint sensor module 2600*a*, 2600*b*.

Figure 29:
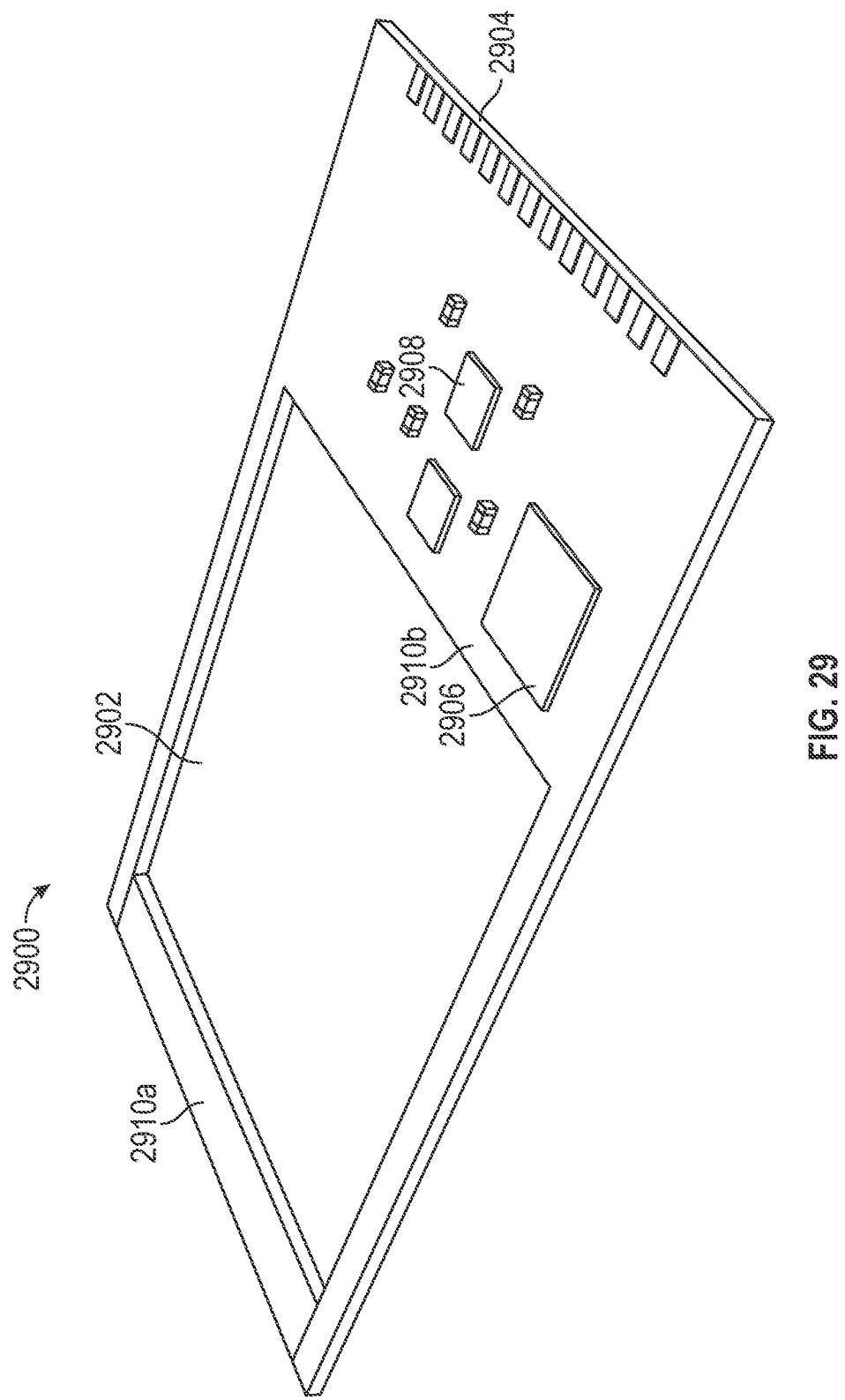
FIG. 29 is a perspective view of a printed circuit board "PCB" frame configured to receive and incorporate the double-sided fingerprint sensor.

FIG. 29 shows a PCB frame 2900 configured to receive and incorporate the double-sided fingerprint sensor 2800 according to some embodiments. The PCB frame 2900 may comprise a cut-out 2902. In some embodiments, the cut-out 2902 may be large enough to expose the sensing areas of the double-sided fingerprint sensor 2800. In some embodiments, the cut-out 2902 may be large enough to also accommodate the passive components mounted on the double-sided flexible substrate containing the interconnect pads 2702*a*, 2702*b* for each single fingerprint sensor module 2600*a*, 2600*b*, as will be described further in FIGS. 30A-30B. In some embodiments, the PCB frame 2800 may be multi-layered, e.g., having two or more circuit layers, and may comprise appropriately placed vias, interconnect pads 2910*a-b* (2910*b* not shown in FIG. 29), and interconnect lines (e.g., routing traces) (for simplicity, the interconnect lines are not shown) on both surfaces to ensure that the two single fingerprint sensor modules 2600*a-b* of the double-sided fingerprint sensor 2800 may be connected to a micro controller unit (MCU) 2906, e.g. controlling processor, mounted on the PCB frame 2900. In some embodiments, other supporting components 2908, such as a low-dropout regulator (LDO), may be mounted on the PCB frame 2900. In some embodiments, the PCB frame 2900 may comprise interconnect pads 2904 configured to connect to a host device. In some embodiments, the PCB frame 2900 may be connected to the host device either directly via the interconnect pads 2904 or via a flexible cable connected to the host device.

Figure 30A:
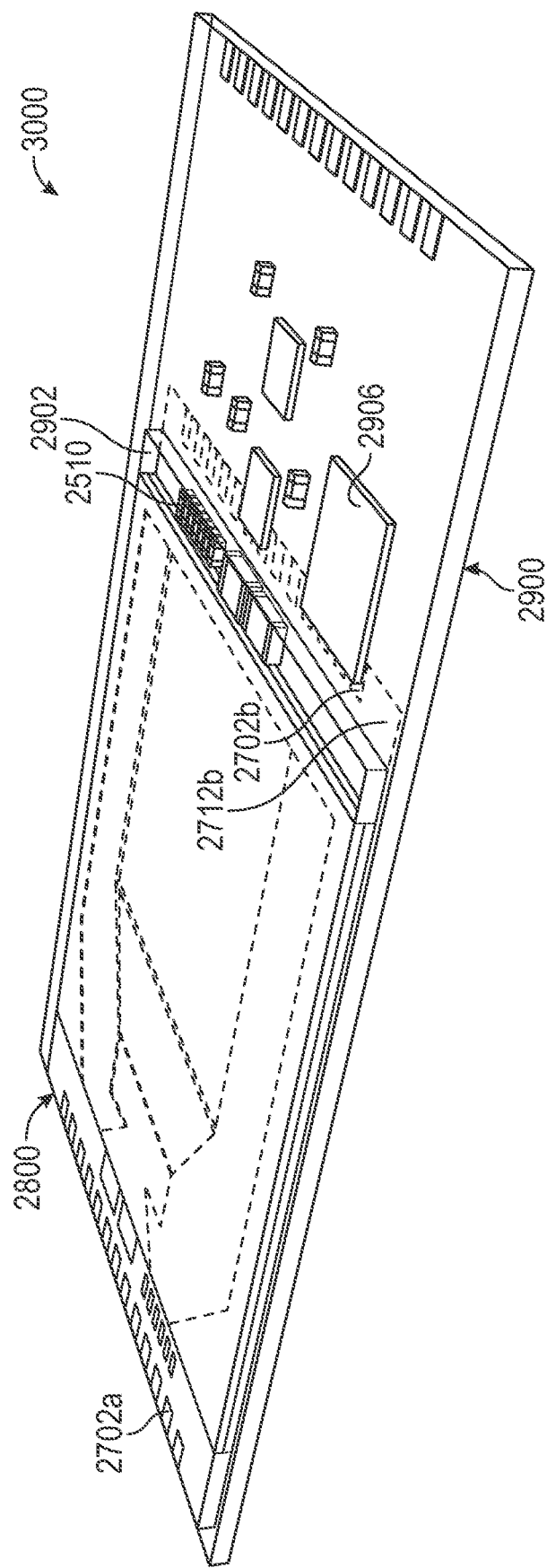
FIG. 30A is a top perspective view of a double-sided sensor module comprising a double sided sensor incorporated into the PCB frame in accordance with aspects of the present disclosure.
Figure 30B:
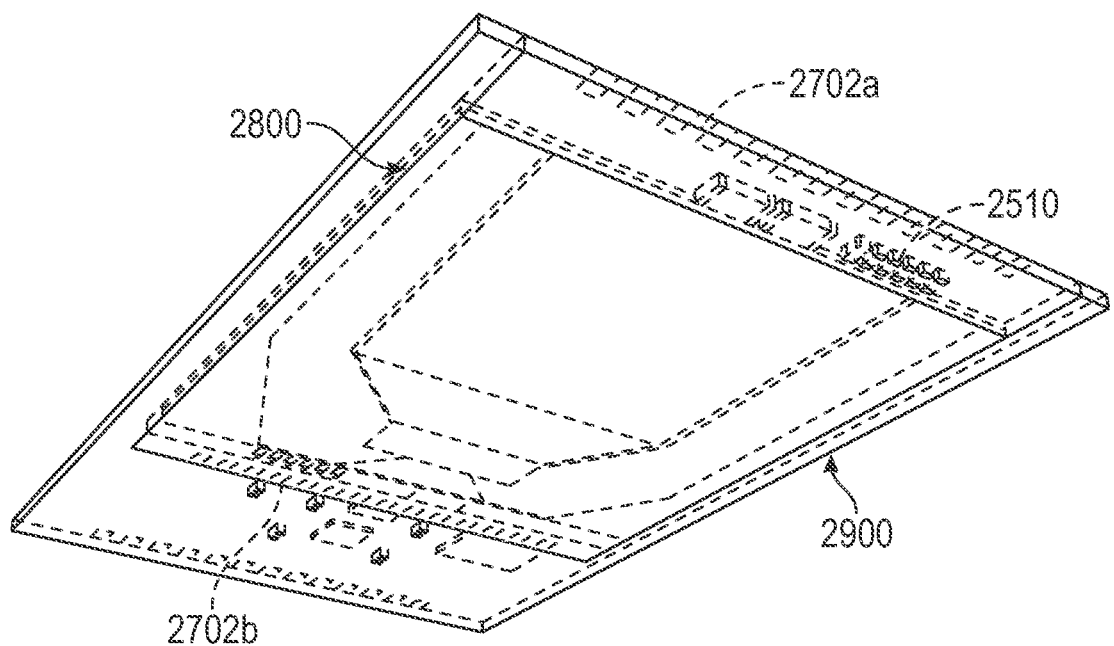
FIG. 30B is a bottom perspective view of the double-sided sensor module.

FIGS. 30A-30B show a third step for creating a double-sided sensor module 3000. FIG. 30A illustrates a top view of the double-sided sensor module 3000 comprising the double-sided fingerprint sensor 2800 inserted into the cut-out 2902 and connected to the PCB frame 2900. FIG. 30B illustrates a bottom view of the double-sided sensor module 3000 comprising the double-sided fingerprint sensor 2800 inserted into the cut-out 2902 and connected to the PCB frame 2900. As shown in FIGS. 30A-30B, the portion of the first and second double-sided flexible substrates 2712*a-b* overhanging each end of the double-sided fingerprint sensor 2800 containing the interconnect pads 2702*a-b* may be connected to interconnect pads on the top and bottom surface of the PCB frame 2900, respectively, thereby connecting the first and second fingerprint sensor modules 2600*a-b* to the PCB frame 2900. In some embodiments, the electrical interconnection between the interconnect pads 2702*a-b* on the double-sided fingerprint sensor 2800 and the interconnect pads on the PCB frame 2900 may be made with an electrically conductive adhesive or film, with hot bar soldering or by other interconnect means. In some embodiments, a mechanical bonding adhesive may be applied between the interconnect pads on the PCB frame 2900 and/or the between the interconnect pads 2702*a-b* on the double-sided fingerprint sensor 2800 to further mechanically affix the double-sided fingerprint sensor 2800 to the PCB frame 2900. In some embodiments, the passive components 2510 for each single fingerprint sensor module 2600*a-b* of the double-sided fingerprint sensor 2800 are positioned within the cut-out 2902 in the PCB frame 2900, as shown in FIG. 30A.

In some embodiments, a first ASIC of the first fingerprint sensor module 2600a and a second ASIC of the second fingerprint sensor module 2600b may be connected to the MCU 2906 via the interconnect lines (not shown in FIGS. 30A-30B) of the PCB 2900. In such embodiments, the MCU 2906 may be configured to control the two fingerprint sensor modules 2600a, 2600b. In some embodiments, the MCU 2906 may control and coordinate each of the two ASICs to control the operation timing of the first and second sensor module 2600a, 2600b. For example, the MCU 2906 may control which processes to run and coordinate when to run the processes for each sensor module 2600a, 2600b in order to authenticate and/or enroll a "pinch" print, i.e. a combination of a first fingerprint captured by the first sensor module 2600a and a second fingerprint captured by the second sensor module 2600b. In some embodiments, the MCU 2906 may determine when to provide feedback to a host device regarding the operations of the double-sided fingerprint sensor 2800. In some embodiments, the functions of the first ASIC, the second ASIC, and the MCU 2906 may be divided up and allocated in various ways. In yet another embodiment, the double-sided fingerprint sensor 2800 may be integrated on a smart card. In such an embodiment, some of the functions of a secure element component of the smart card may be allocated to the first ASIC, the second ASIC, and the MCU 2906. In some embodiments, some of the functions of the first ASIC, the second ASIC, and the MCU 2906 may be allocated to the secure element component.

In alternate embodiments, one or both overmolds can extend beyond one or more edges of the flexible substrate, and the overhanging portion(s) of the overmold(s) can be secured to the PCB adjacent the cutout to secure the double-sided fingerprint sensor 2800 to the PCB 2900.

In some embodiments, the third step described in FIGS. 30A-30B, where the double-sided fingerprint sensor 2800 inserted into the cut-out 2902 and connected to the PCB frame 2900, may be omitted. In such embodiments, the double-sided fingerprint sensor 2800 may be connected to a microcontroller unit (MCU), e.g. a controlling processor, using a flexible interconnect cable or other suitable connector. Accordingly, the first ASIC of the first fingerprint sensor module 2600a and the second ASIC of the second fingerprint sensor module 2600b may be connected to the MCU via the flexible interconnect cable or other suitable connector.

In some embodiments, the first and second single fingerprint sensor module 2600a-b included in the double-sided fingerprint sensor 2800 may be stacked on top of one another to have the interconnect pads 2702a-b for connection to the PCB frame 2900 emanating from a same end of the double-sided fingerprint sensor 2800 rather than opposite sides as described above in FIG. 28. In such embodiments, the interconnect pads 2702a-b of the double-sided fingerprint sensor 2800 may be connected to interconnect pads 2910a-b on the same end of the PCB frame 2900 on opposing surfaces. In such embodiments, the PCB frame 2900 may still include the cut-out 2902 for the sensing areas of the double-sided fingerprint sensor 2800 or the cut-out 2902 may be offset from the sensing areas. In some embodiments, the first and second fingerprint sensor modules 2600a-b may not be substantially similar in size and dimension.

Figure 31:
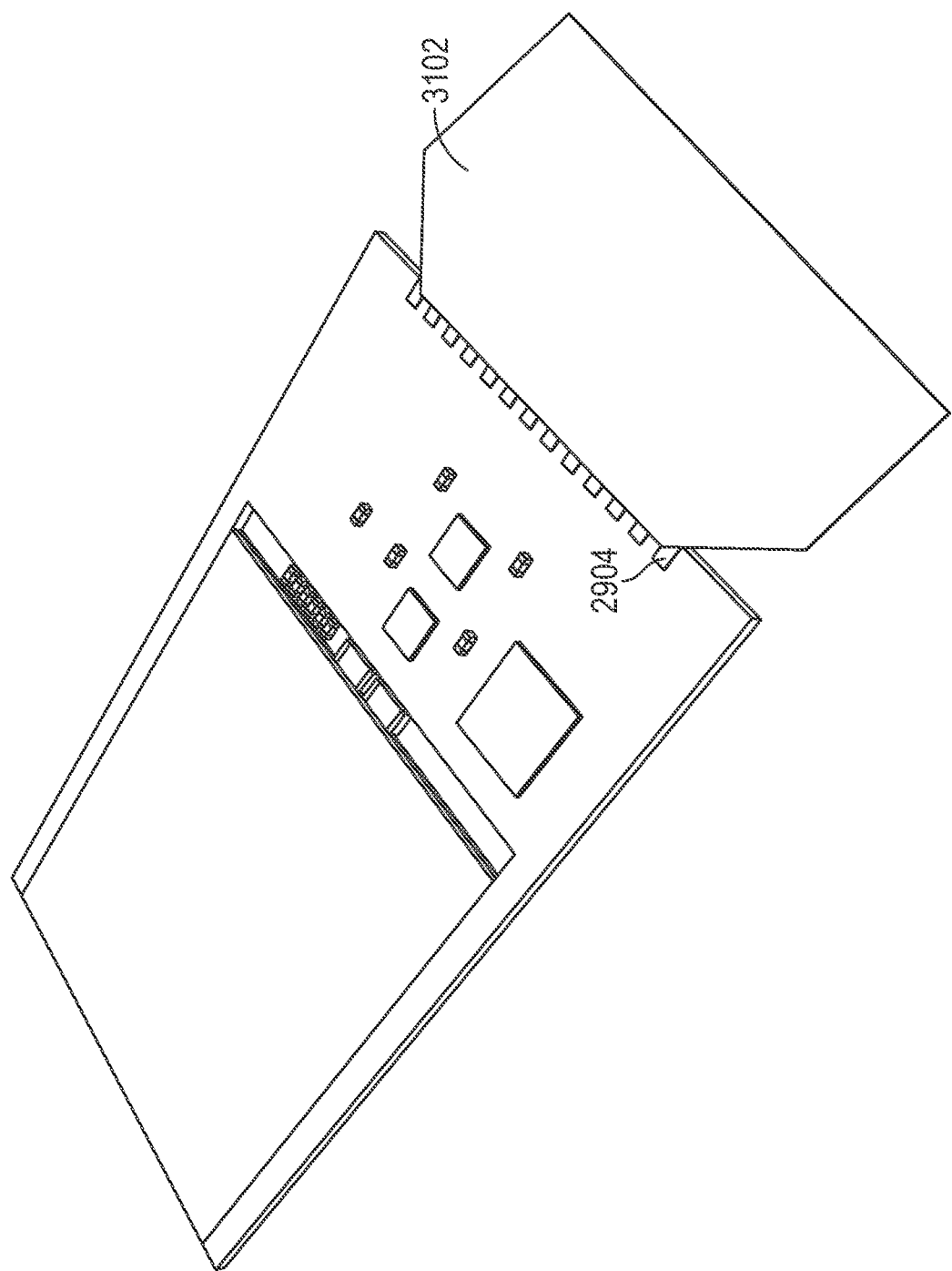
FIG. 31 is a top perspective view of the double-sided sensor module with a flexible interconnect cable connected to the PCB frame.

As shown in FIG. 31, a flexible interconnect cable 3102 may be connected to the connecting pads 2904 of the PCB frame 2900. The flexible cable 3102 may be connected to a host device, thereby connecting the double-sided sensor module 3000 to the host device. In some embodiments, supporting components may be mounted on the flexible interconnect cable 3102.

Importantly, the double-sided sensor module 3000 created according to the embodiments described above in FIGS. 25-31, may be any size, shape or dimension. In an exemplary embodiment, the double-sided sensor module 3000 may be sized appropriately for incorporation in a smart card as described above and shown in FIG. 13B. As shown in FIG. 13B, the double-sided sensor module 3000 is inserted into a cavity 1302 in a smart card 1208. A bottom sensing area is surrounded by the stiffener frame 1204 when the frame 1204 is applied over the bottom surface of the double-sided sensor module 3000 to securely hold the module in place within the cavity 1302. In some embodiments, a layer of adhesive 1314 may be applied to a top surface of the double-sided module 3000 or an inner surface of the cavity 1302 before the double-sided sensor module 1202 is inserted into the cavity 1302, as shown in FIG. 13B. In some embodiments, a layer of adhesive 1312 may be applied to a bottom surface of the double-sided module 3000 or a surface of the frame 1204 which contacts the bottom surface of the double-sided module 3000 before the frame 1204 is applied over the double-sided sensor module 3000 to securely hold the module 3000 in place within the cavity 1302.

It may be a challenge to achieve a sufficiently low-profile double-sided sensor module due to the need for two ASICs and two sets of passive components within the double-sided fingerprint sensor 2800. Accordingly, the depth of the overmold for the first and second single fingerprint sensor module 2600a-b included in the double-sided fingerprint sensor 2800 may be configured to provide protection for the ASICs, but not so much that the resulting double-sided sensor module 3000 becomes too thick to incorporate into the smart card. In some embodiments, the passive components of the first and second single fingerprint sensor modules 2600a-b may be the highest elements on the double-sided flexible substrates 2712a-b, hence the most difficult to accommodate in the double-sided sensor module 3000. Accordingly, the passive components may be excluded from the overmold in the embodiments described in FIG. 26 and instead accommodated in the cut-out 2902 in the PCB frame 2900, as shown in FIGS. 30A-30B.

Double-Sided Sensor Module Created with a Single Substrate

Figure 32:
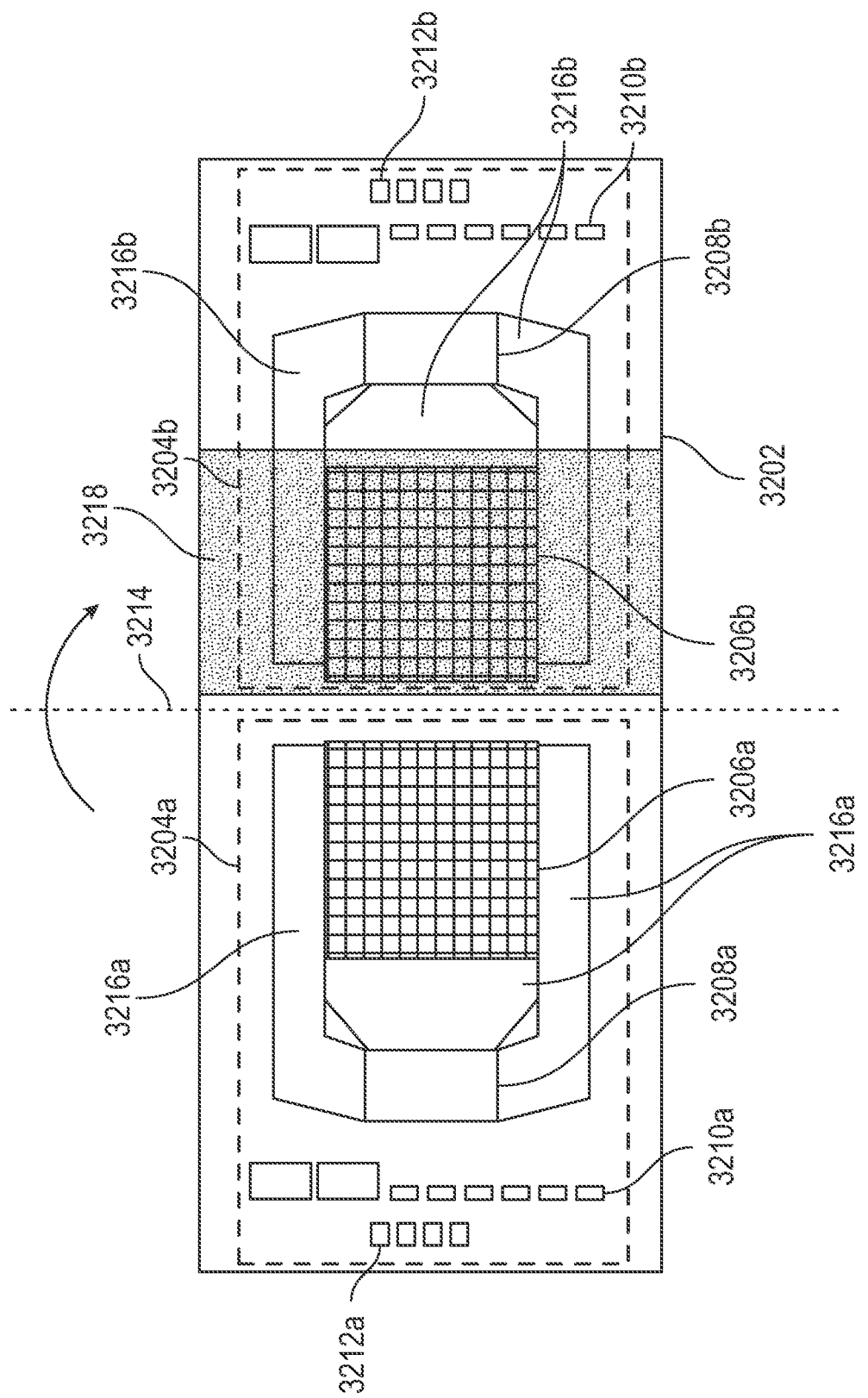
FIG. 32 is a plan view of a foldable substrate with two spatially distinct sensing areas and an ASIC associated with each sensing area, with a rigid core positioned over one of the sensing areas.

FIG. 32 shows an alternative method to create a double-sided sensor module, according to some embodiments. FIG. 32 shows a double-sided flexible substrate 3202. A first end of the double-sided flexible substrate 3202 may comprise a first fingerprint sensor 3204a imprinted on it. The first fingerprint sensor 3204a may comprise a first sensing area (or sensor array) 3206a comprising a set of drive (Tx) and pickup (Rx) lines each disposed on an opposite surface of the substrate 3202. The set of drive and pickup lines may be connected to a first ASIC 3208a via routing traces 3216a (for simplicity, individual routing traces—each of which would typically be associated with one drive line or one pickup line—are not shown). In some embodiments, the set of drive and pickup lines are also connected to passive components 3210a. In various embodiments, the first ASIC 2108a may control the functions of the first fingerprint sensor 3204a. For example, the first ASIC 3208a may control functions of the first fingerprint sensor 3204a such as managing image capture process, conducting image processing, matching and enrolling fingerprints, and authenticating fingerprints, among others. The first fingerprint sensor 3204a may further comprise interconnect pads 3212a positioned close to an edge of the first end of the double-sided flexible substrate 3202, as shown in FIG. 32. In some embodiments, a second end of the double-sided flexible substrate 3202 may comprise a second fingerprint sensor 3204b imprinted on it. The second fingerprint sensor 3204b may comprise a second sensing area (or sensor array) 3206b comprising a separate set of drive (Tx) and pickup (Rx) lines each disposed on an opposite surface of the substrate 3202. The separate set of drive and pickup lines may be connected to a second ASIC 3208b via routing traces 3216b (for simplicity, the routing traces are shown as shade areas). In some embodiments, the set of drive and pickup lines are also connected to passive components 3210b. In various embodiments, the second ASIC 3208b may control the functions of the second fingerprint sensor 3204b. For example, the second ASIC 3208b may control functions of the second fingerprint sensor 3204b such as managing image capture process, conducting image processing, matching and enrolling fingerprints, and authenticating fingerprints, among others. The second fingerprint sensor 3204b may further comprise interconnect pads 3212b positioned close to an edge of the second end of the double-sided flexible substrate 3202, as shown in FIG. 32. In some embodiments, the interconnect pads 3212a-b may be configured for use with Anisotropic Conductive Film (ACF), conductive bumps, among other connectors.

The double-sided flexible substrate 3202 may comprise a dielectric substrate and may comprise a flexible dielectric substrate, which may be a polymer-based substrate (e.g. polyimide), such as Kapton® or Upilex®, and the drive lines and pickup lines forming the sensor sensing areas (sensor arrays) 3206a, 3206b may comprise a plurality of conductive traces made of a suitable conductive material, such as copper, tin, silver, nickel, aluminum, or gold are formed, etched, deposited, plated, printed, or otherwise applied to or embedded into each surface, or side, of the double-sided flexible substrate 3202.

In some embodiments, the second fingerprint sensor 3204b may be arranged so as to be a mirror image of the first fingerprint sensor 3204a with respect to a fold line 3214. However, the second fingerprint sensor 3204b is not required to be a mirror image of the first fingerprint sensor 3204a and other layouts may be possible, according to alternative embodiments.

In some embodiments, one or more of ASICs 3208a-b, passive components 3210a-b and interconnect pads 3212a-b may be mounted on the opposite side of the double-sided flexible substrate 3202 to sensing areas 3206a-b. In some embodiments, an ASIC 3208a and/or one or more of the passive components 3210a or interconnect pads 3212a may be located on one side of the flexible substrate 3202, and the other ASIC 3208b and/or one or more of the other passive components 3210b or interconnect pads 3212b may be located on the opposite side of the flexible substrate 3202.

Figure 33:
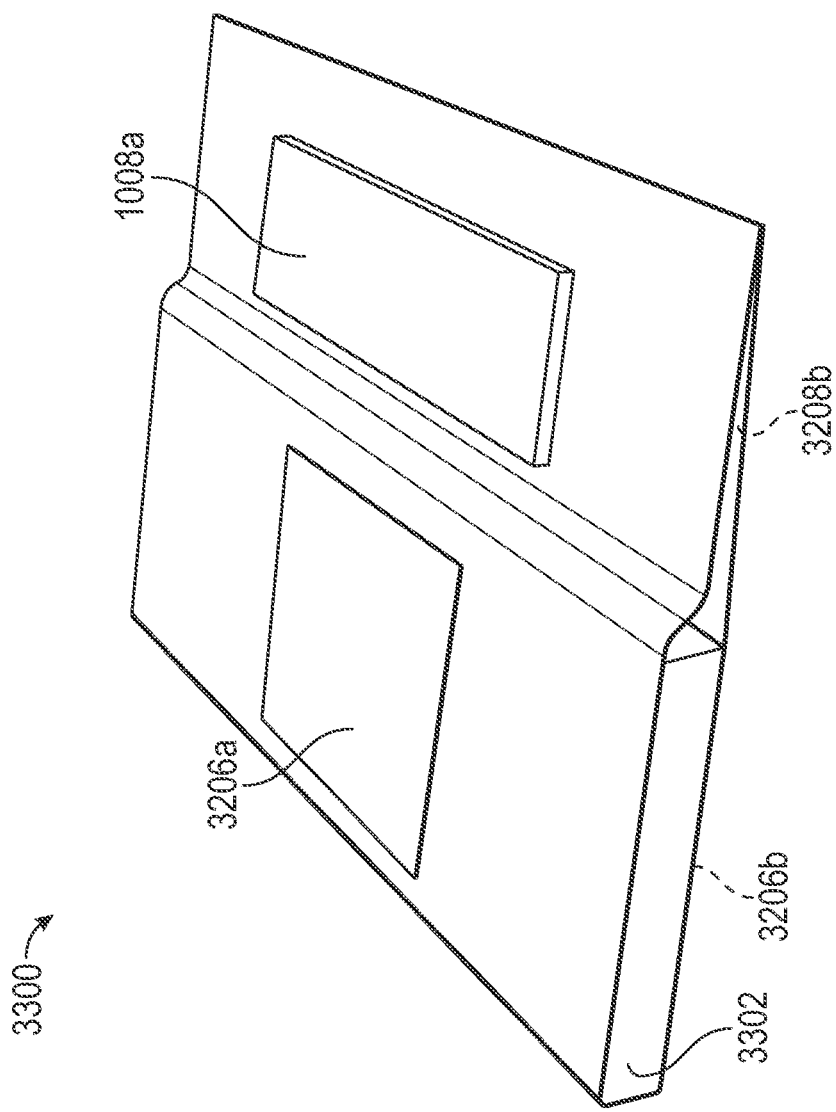
FIG. 33 is a perspective view of the foldable substrate folded over the rigid core.

As shown in FIG. 32, a core may be aligned with one of the sensing areas 3206a-b, as indicated by the shaded area 3218. The core 3218 may comprise a generally rigid substrate preferably formed from a suitable rigid, substantially inflexible, thermally and dimensionally stable material that can be readily machined or otherwise shaped in a desired manner. The core may have opposed, generally parallel planar surfaces. In some embodiments, the core may be placed on a surface of the double-sided flexible substrate 3202, as indicated by the shaded area 3218, thereby placing the core above the second sensing area 3206b. In such embodiments, the first end of the double-sided flexible substrate 3202 comprising the first fingerprint sensor 3204a may be wrapped around the core in direction A at the fold line 3214 to form the double-sided sensor module. Accordingly, the first sensing area 3206a may be located on one surface of the core while the second sensing area 3206b may be located on an opposed surface of the core 3302, as shown in FIG. 33. In an embodiment, the drive (Tx) lines are disposed on the top surface of the substrate 3202 so that when the substrate is wrapped around the core 3218, the drive lines are facing or in contact with surfaces of the core and the pickup (Rx) lines are on an outer surface of the substrate relative to the surfaces of the core 3218.

FIG. 33 shows the double-sided fingerprint sensor 3300 created by wrapping a double-sided flexible substrate around the core 3302 as described above. As shown in FIG. 33, the first sensing area 3206a is located on a top surface of the core 3302 while the second sensing area 3206b is located on a bottom surface of the core 3302. Both sensing areas 3206a-b face outwards so that a user may "pinch" the double-sided fingerprint sensor 3300 and capture two fingerprints, i.e. one fingerprint from each sensing area. The ASICs 3208a, 3208b in FIG. 32 are positioned on the substrate so that they face outwardly when the substrate is wrapped around the core 3302 (unlike the configuration shown in FIG. 32, in which the ASICs 3208a, 3208b are positioned on the top side of the flexible substrate 3202 and would face inwardly when the substrate 3202 is wrapped around the core 3218). In some embodiments, the first ASIC 3208a and the second ASIC 3208b may be connected to a microcontroller unit (MCU), e.g. a controlling processor, configured to control the two fingerprint sensors 3204a-b. In such embodiments, the MCU may be configured to control the two fingerprint sensors 3204a-b. In some embodiments, the MCU may control and coordinate each of the two ASICs 3208a, 3208b to control the operation timing of the first and second fingerprint sensors 3204a-b. For example, the MCU may control which processes to run and coordinate when to run the processes for each fingerprint sensor 3204a-b in order to authenticate and/or enroll a "pinch" print, i.e. a combination of a first fingerprint captured by the first fingerprint sensor 3204a and a second fingerprint captured by the second fingerprint sensor 3204b. In some embodiments, the MCU may determine when to provide feedback to a host device regarding the operations of the double-sided fingerprint sensor 3300. In some embodiments, the functions of the first ASIC 3208a, the second ASIC 3208b, and the MCU may be divided up and allocated in various ways. In yet another embodiment, the double-sided fingerprint sensor 3300 may be integrated on a smart card. In such an embodiment, some of the functions of a secure element component of the smart card may be allocated to the first ASIC 3208a, the second ASIC 3208b, and the MCU. In some embodiments, some of the functions of the first ASIC 3208a, the second ASIC 3208b, and the MCU may be allocated to the secure element component.

In some embodiments, a double-sided sensor module may be created by incorporating the double-sided fingerprint sensor 3300 in a PCB frame, as described above, for instance, in FIGS. 29-30 and also described above in a similar arrangement in FIG. 16. In such embodiments, the MCU may be mounted on the PCB frame. In some embodiments, the core 3302 may comprise a polymer or a glass and may be in a cuboid or an irregular shape. In some embodiments, the double-sided sensor module may comprise double-sided fingerprint sensor 3300 connected to the MCU using a flexible interconnect cable.

The double-sided sensor module created by embodiments described above, for instance, in FIGS. 32 and 33 may be any size, shape or dimension. In an exemplary embodiment, the double-sided sensor module may be sized appropriately for incorporation in a smart card, according to the method described above and depicted in FIG. 13B.

Figure 34:
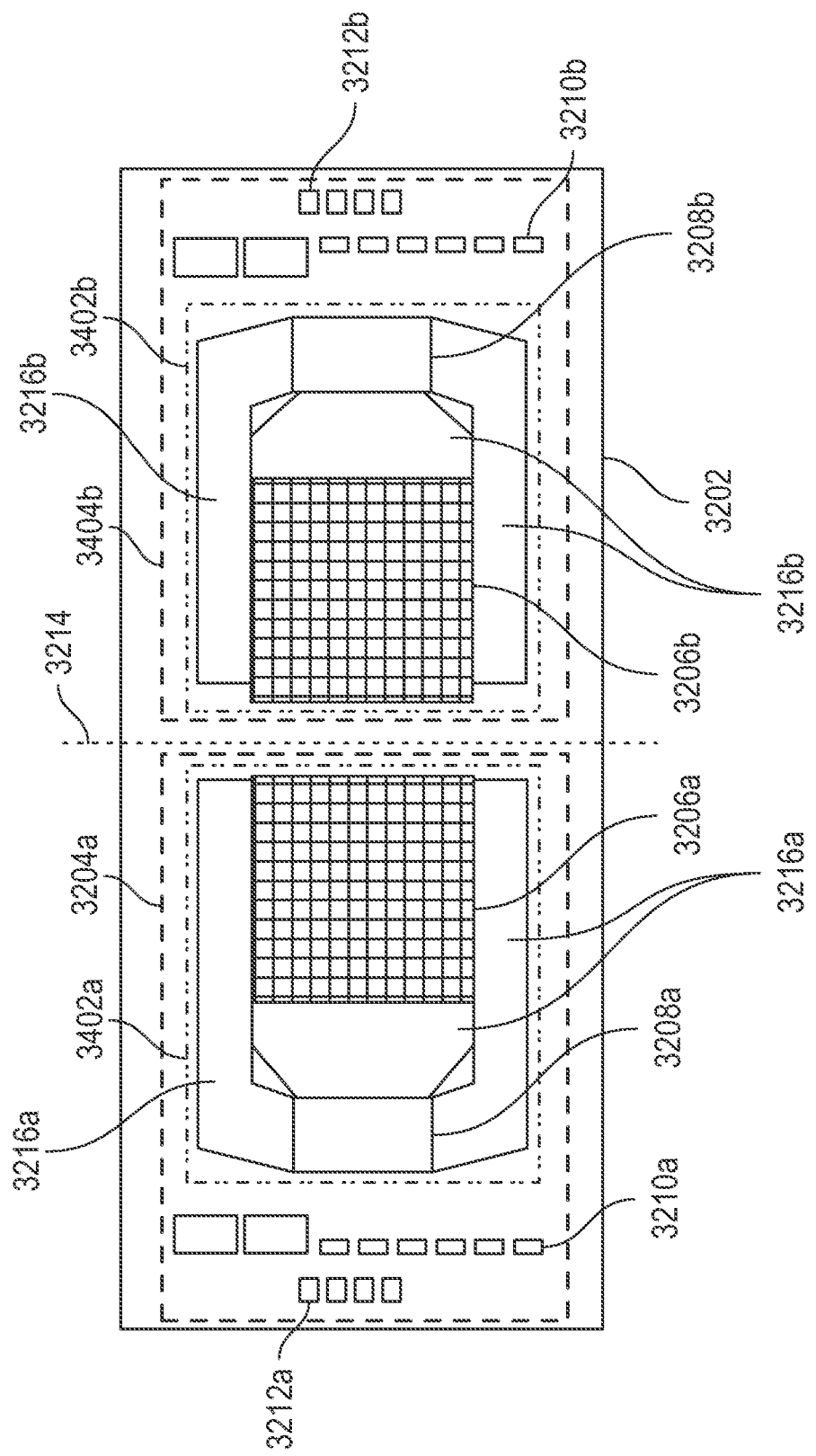
FIG. 34 is a plan view of an alternate foldable substrate with two spatially distinct sensing areas and an ASIC associated with each sensing area, with an encapsulating overmold over each of the sensing areas and the associated ASICs.

FIG. 34 shows an alternative method to create a double-sided sensor module, according to some embodiments. As shown in FIG. 34, rather than place a core on a surface of the double-sided flexible substrate 3202, as described above in FIGS. 32-33, locations corresponding to the non-contact surfaces of the sensing areas 3206a-b, the routing traces 3216a-b, and the ASICs 3208a-b of each fingerprint sensor 3204a-b are separately encapsulated in an overmold. In some embodiments, the overmold may be made of a material as described above, chosen for its appropriate degree of flexibility. FIG. 34 indicates a first area 3402a where the overmold may be formed over a surface of the double-sided flexible substrate 3302 to form a first core 3404a, according to some embodiments. The surface of the double-sided flexible substrate 3202 upon which the overmold is formed over is not contacted by a finger. That is, the overmold formed over the first area 3402a covers the surface of the double-sided flexible substrate 3202 that is opposite the contact surface that is touched by the finger. The overmold formed over the first area 3402a may be disposed over a portion of the double-sided flexible substrate 3202 corresponding to the non-contact side of the first sensing area 3206a and encapsulate the first ASIC 3208a and the routing traces 3216a.

FIG. 34 indicates a second area 3402b where the overmold may be formed over the surface of the double-sided flexible substrate 3202 to form a second core 3404b. The surface of the double-sided flexible substrate 3202 upon which the overmold is formed over is not contacted by the finger. That is, the overmold formed over the second area 3402b covers the surface of the double-sided flexible substrate 3202 that is opposite the contact surface that is touched by the finger. The overmold formed over the second area 3402b may be disposed over a portion of the double-sided flexible substrate 3202 corresponding to the non-contact side of the second sensing area 3206b and encapsulate the second ASIC 3208b and the routing traces 3216b. In some embodiments, the passive components 3210a-b may be excluded from the overmold. In another embodiment, the passive components 3210a-b may be encapsulated in the overmold. As shown in FIG. 34, the interconnect pads 3212a-b positioned on the two edges of the double-sided flexible substrate 3202 may be excluded from the overmold.

In some embodiments, the portion of the double-sided flexible substrate 3202 comprising the first fingerprint sensor 3204a may be folded over the second fingerprint sensor 3204b so that the first core 3404a and the second core 3404b align to create a double-sided fingerprint sensor 3502, as shown in FIGS. 35A-35B. In various embodiments, the first sensing area 3206a is aligned with and overlies a top surface of the overmold 3404a while the second sensing area 3206b is aligned with and overlies a bottom surface of the overmold 3404b. Both sensing areas 3206a-b may face outwards so that a user may "pinch" the double-sided fingerprint sensor 3300 and capture two fingerprints, i.e. one fingerprint from each sensing area. The first sensing area (or sensor array) 3206a and the second sensing area 3206b may each comprise a set of drive (Tx) lines 3510a and pickup (Rx) lines 3510b each disposed on an opposite surface of the substrate 1002. Each of the drive (Tx) lines 3510a and pickup (Rx) lines 3510b is separately connected to the respective ASIC 3208a-b via routing lines (not shown). While FIGS. 35A-35B show the drive (Tx) lines 3510a disposed on the inner surface of the substrate 3202 and the pickup (Rx) lines 3510b disposed on the outer surface of the substrate 3202, this is not required and the location of the drive (Tx) lines 3510a and the pickup (Rx) 3510b lines may be switched. In some embodiments, a surface of the first core 3404a and the second core 3404b may comprise mounting posts and corresponding alignment holes or retainer bars and corresponding slots to facilitate the proper alignment of the two cores 3404a-b the two sensors when folded, as described above in FIGS. 7B-7E.

FIGS. 35A-35B show alternative embodiments for attaching the double-sided fingerprint sensor 3502 to a PCB 3506 comprising a MCU 3508 to control the first and second ASICs 3208a-b. FIGS. 35A-35B show a double-sided sensor module 3504a-b comprising the double-sided fingerprints sensor 3502 as described, for instance, in FIG. 34, attached to the PCB 3506. In some embodiments, the PCB 3506 may further support additional components 3510, such components employed in a smart card, such as a secure element or an antenna. In some embodiments, the PCB 3506 may comprise a cut-out large enough to incorporate the passive components 3210a-b (not shown in FIGS. 35A-35B) in order to keep the height, i.e., thickness, of the double-sided sensor module 3504a-b to a minimum. FIG. 35A shows the double-sided sensor module 3504a with the double-sided fingerprint sensor 3502 with one end of the double-sided flexible substrate 3202 attached to the PCB 3506. In some embodiments, the one end of the double-sided flexible substrate 3202 may be attached to the PCB 3506 with Anisotropic Conductive Film (ACF), thereby electrically connecting the first ASIC 3208a to the MCU 3508 mounted on the PCB 3506. ASIC 3208b in FIG. 35A may be connected to the PCB 3506 by vias extending through the substrate 3202 and routing traces extending the length of the substrate 3202. FIG. 35B shows the double-sided sensor module 3504b with the double-sided fingerprint sensor 3502 with both ends of the double-sided flexible substrate 3202 attached to the PCB 3506. In some embodiments, the both ends of the double-sided flexible substrate 3202 may be attached to the PCB 3506 with Anisotropic Conductive Film (ACF).

As noted above, an important point to note is that the double-sided sensor module 3504a-b may be any size or shape. According to a preferred embodiment, the double-sided sensor module 3504a-b may be sized appropriately for incorporation in a smart card, according to the method described above and depicted in FIG. 13b. It may be difficult to achieve a sufficiently low-profile double-sided sensor module 3504a-b due to the two ASICs 3208a-b and two sets of passive components 3210a-b (only one set of passive components 3510 shown in FIGS. 35A-35B). Accordingly, the depth of the first and second core 3404a-b may be configured to provide protection for the first and second ASIC 3208a-b, respectively. That is, the first and second core 3404a-b may be configured to be deep enough to be practical to deposit the overmold using standard overmolding equipment, but not so much that the resulting first and second cores 3404a-b is too deep, thereby creating a double-sided module 3504a-b too thick to be incorporated into a smart card. In a non-limiting exemplary embodiment, the first and second core 1304a-b may comprise overmold covering a top surface of the first and second ASIC 3208a-b, respectively, approximately 20 µm where the double-sided flexible substrate 3202 has a thickness of 130 µm, each ASIC 3208a-b has a thickness of 150 µm, and each ASIC 3208a-b is attached to the double-sided flexible substrate 3202 with a die bump (e.g., Au bump) comprising a height of 15 μm.

Figure 36:
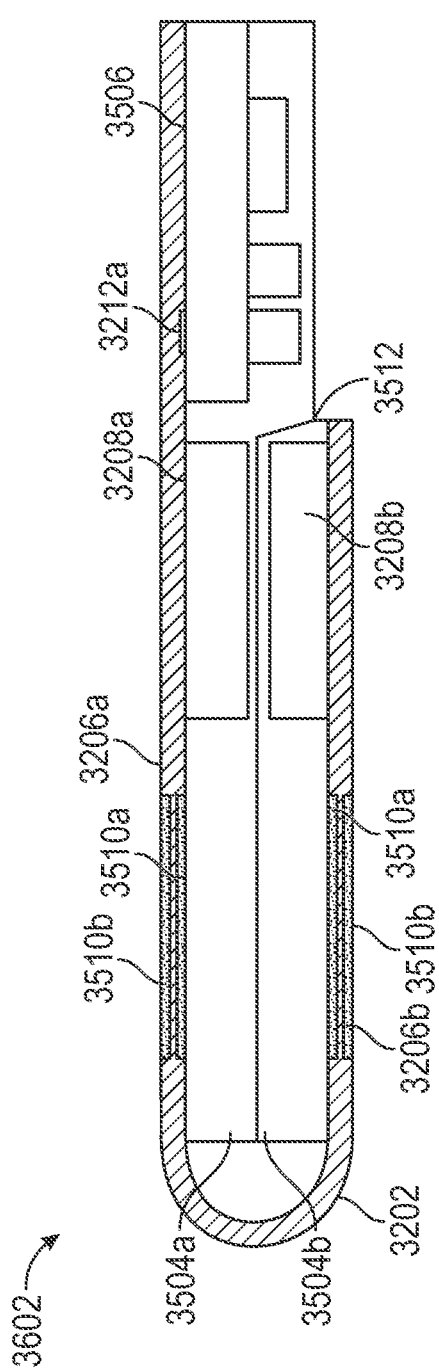
FIG. 36 shows a cross-sectional side view of an alternate double-sided sensor module embodying aspects of the present disclosure.
Figure 37:
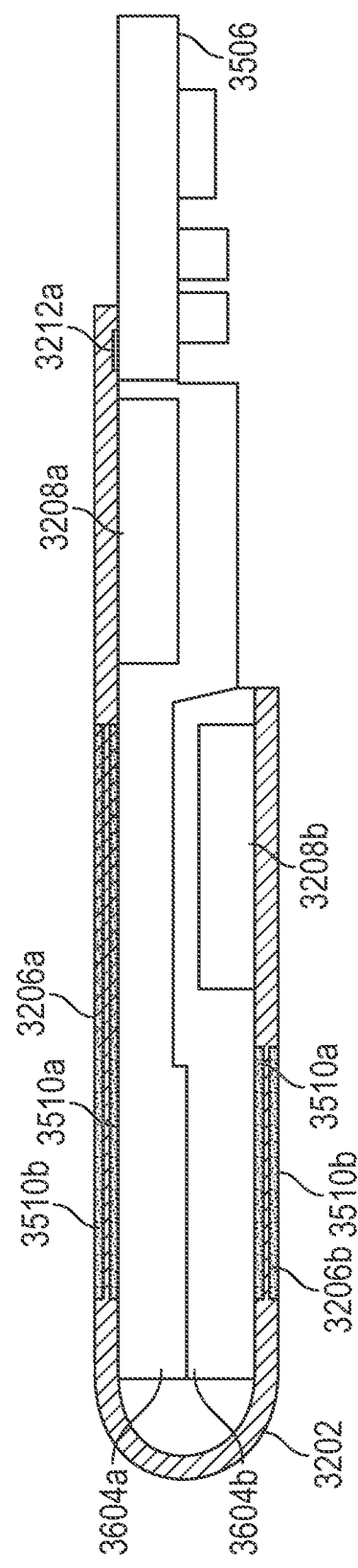
FIG. 37 shows a cross-sectional side view of an alternate double-sided sensor module embodying aspects of the present disclosure.

FIGS. 36 and 37 show further variations of the alternative method of creating the double-sided sensor module as described above in FIG. 34. As shown in FIG. 36, the PCB 3506 may be attached to the interconnect pads 3212a on one side of the double-sided flexible substrate 3202 using the interconnect pads 3212a with ACF prior to forming the first and second core 3504a-b. ASIC 3208b in FIG. 35 may be connected to the PCB 3506 by vias extending through the substrate 3202 and routing traces extending the length of the substrate 3202. In such embodiments, the overmold may be added over the first area 3402a (see FIG. 34) in addition to the the PCB 3506 and support components, such components employed in a smart card, such as a secure element or an antenna, to form the first core 3504a. The overmold may encapsulate the PCB 3506 and the support components. In some embodiments, the first core 3504a may be stepped or sloped as at 3512 to aid alignment when the second core 3504b, which may have a conforming step or slope, is folded onto the first core 3504a to create the double-sided sensor module 3602. As shown in FIG. 36, the first core 3504a provides a rigid connection between the PCB 3506 and at least one of the ASICs 3208a-b. Accordingly, the double-sided sensor module 3602 formed by the first core 3504a and the second core 3504b is rigid throughout the module 3602, thereby facilitating the handling and mounting of the module 3602 onto a host device.

In various embodiments, the first sensing area 3206a is aligned with and overlies a top surface of the overmold 3504a while the second sensing area 3206b is aligned with and overlies a bottom surface of the overmold 3504b. Both sensing areas 3206a-b may face outwardly so that a user may "pinch" the double-sided fingerprint sensor 3300 and capture two fingerprints, i.e. one fingerprint from each sensing area. The first sensing area 3206a (or sensor array) 3206a and the second sensing area 3206b may each comprise a set of drive (Tx) lines 3510a and pickup (Rx) lines 3510b each disposed on an opposite surface of the substrate 3202. Each of the drive (Tx) lines 3510a and pickup (Rx) lines 3510b is separately connected to the respective ASIC 3208a-b via routing lines (not shown). While FIG. 36 shows the drive (Tx) lines 3510a disposed on the inner surface of the substrate 3202 and the pickup (Rx) lines 3510b disposed on the outer surface of the substrate 3202, this is not required and the location of the drive (Tx) lines 3510a and the pickup (Rx) lines 3510b may be switched.

In FIG. 37, the shape of the first and second core 3604a-b, the folding position, the double-sided flexible substrate 3202, and the arrangement of components on the double-sided flexible substrate 3202 may be configured such that when the second core 3604b is folded over the first core 3604a to create the double-sided sensor module 3702, the ASICs 3208a-b are not directly aligned. As shown in FIG. 37, the PCB 3506 may be attached to the interconnect pads 3212a on one side of the double-sided flexible substrate 3202 with ACF. ASIC 3208b in FIG. 37 may be connected to the PCB 3506 by vias extending through the substrate 3202 and routing traces extending the length of the substrate 3202. In such embodiments, double-sided sensor module dimensions achieved for the double-sided sensor module 3702 may comprise substantially similar dimensions to the double-sided sensor modules created according to the embodiments described above, for instance, in FIGS. 34-36, while providing an increased amount of overmold over the first and second ASICs 3208a-b in the first and second core 3604a-b, respectively. Accordingly, the increased amount of overmold over the first and second ASICs 3208a-b may provide increased protection while making it easier to deposit the overmold to form the first and second cores 3604a-b.

In various embodiments, the first sensing area 3206a is aligned with and overlies a top surface of the overmold 3604a while the second sensing area 3206b is aligned with and overlies a bottom surface of the overmold 3604b. Both sensing areas 3206a-b may face outwards so that a user may "pinch" the double-sided fingerprint sensor 3300 and capture two fingerprints, i.e. one fingerprint from each sensing area. In some embodiments, the size of the sensing areas 3206a-b may be different, as shown in FIG. 37. For example, the first sensing area 3206a may be extended to cover a larger top surface of the overmold 3604a. The first sensing area 3206a (or sensor array) 3206a and the second sensing area 3206b may comprise a set of drive (Tx) lines 3510a and pickup (Rx) lines 3510b each disposed on an opposite surface of the substrate 3202. Each of the drive (Tx) lines 3510a and pickup (Rx) lines 3510n is separately connected to the respective ASIC 3208a-b via routing lines (not shown). While FIG. 37 shows the drive (Tx) lines 3510a disposed on the inner surface of the substrate 3202 and the pickup (Rx) lines 3510b disposed on the outer surface of the substrate 3202, this is not required and the location of the drive (Tx) lines 3510a and the pickup (Rx) lines 3510b may be switched.

Figure 38A:
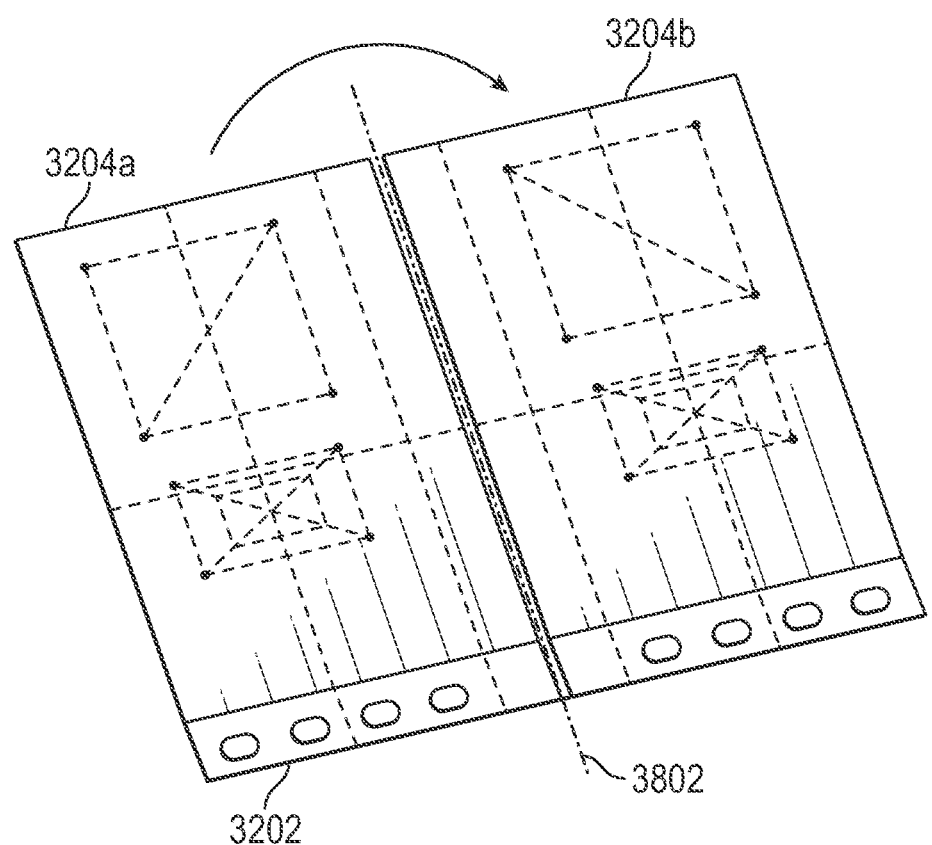
FIGS. 38A-38B show an alternative folding arrangement to create the double-sided sensor module embodying aspects of the present disclosure.
Figure 38B:
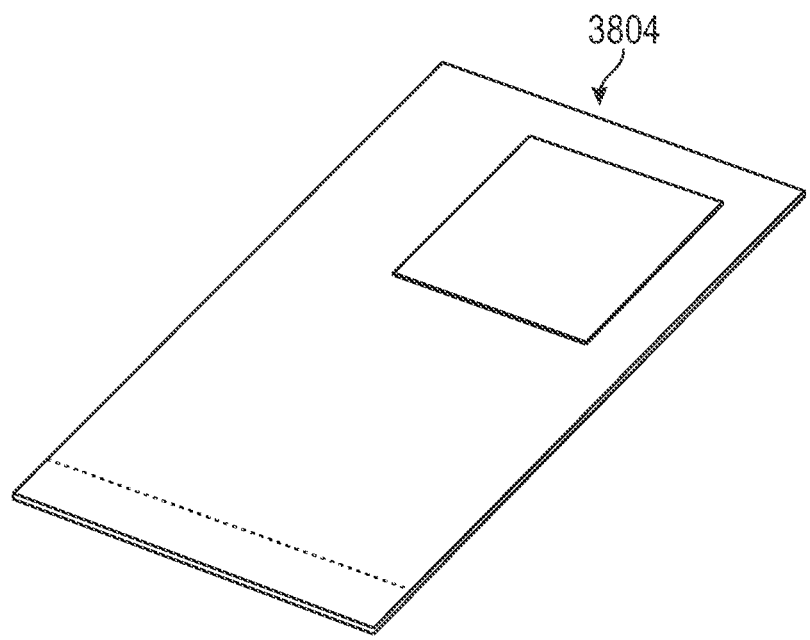

FIGS. 38A-38B show an alternative folding arrangement described in FIGS. 32 and 34. Rather than have the fingerprint sensors 3204a-b imprinted "horizontally" on the double-sided flexible substrate 3202, as shown in FIGS. 32 and 34, FIGS. 38A-38B show the fingerprint sensors 3204a-b imprinted "vertically" on the double-sided flexible substrate 3202. Similar to the folding arrangement described in FIGS. 32 and 34, FIGS. 38A-38B shows that the first fingerprint sensor 3204a may be folded in direction B along fold line 3802 to align the first fingerprint sensor 3204a with the second fingerprint sensor 3204b and form the double-sided fingerprint sensor 3804.

Figure 39:
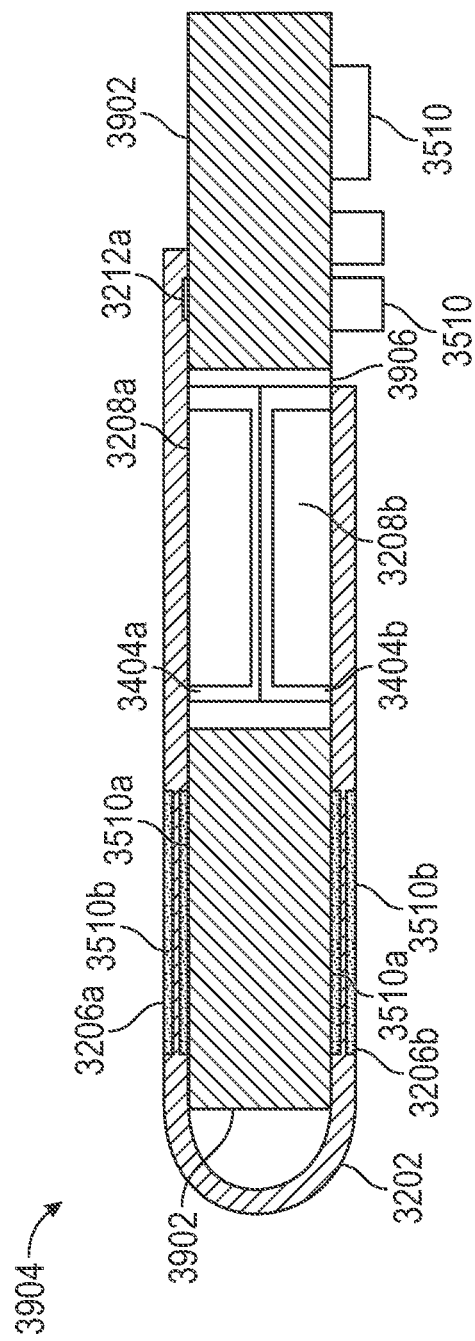
FIG. 39 shows a cross-sectional side view of an alternate double-sided sensor module embodying aspects of the present disclosure.

FIG. 39 shows another alternative method of creating the double-sided sensor module as described above in FIG. 34. As shown in FIG. 39, a PCB frame 3902 comprising a cut out 3906 may be attached to the interconnect pads 3212a on one side of the double-sided flexible substrate 3202 with ACF to create a double-sided sensor module 3904. In some embodiments, the cut out 3906 of the PCB frame 3902 may surround the first and second core 3404a-b including the first and second ASIC 3208a-b, respectively. A portion of the PCB frame 3902 may function as a stiffener under a first sensing area on a first surface of the double-sided sensor module 3904 and a second sensing area on a second surface of the double-sided sensor module 3904. In some embodiments, the PCB frame 3902 may comprise the MCU 3508 and additional components 3510. In some embodiments, the MCU 3508 and the additional components 3510 may be embedded in the PCB frame 3902.

In various embodiments, the first sensing area 3206a is aligned with and overlies a top surface of the PCB 3902 while the second sensing area 3206b is aligned with and overlies a bottom surface of the PCB 3902. Both sensing areas 3206a-b may face outwards so that a user may "pinch" the double-sided fingerprint sensor 3300 and capture two fingerprints, i.e. one fingerprint from each sensing area. The first sensing area 3206a (or sensor array) and the second sensing area 3206b may each comprise a set of drive (Tx) lines 3510a and pickup (Rx) lines 3510b each disposed on an opposite surface of the substrate 3202. Each of the drive (Tx) lines 3510*a* and pickup (Rx) lines 3510*b* is separately connected to the respective ASIC 3208*a-b* via routing lines (not shown). While FIG. 39 shows the drive (Tx) lines 3510*a* disposed on the inner surface of the substrate 3202 and the pickup (Rx) lines 3510*b* disposed on the outer surface of the substrate 3202, this is not required and the location of the drive (Tx) lines 3510*a* and the pickup (Rx) lines 3510*b* may be switched.

EXEMPLARY EMBODIMENTS

Embodiment 1

A sensor assembly comprising:
a core having first and second surfaces;
a flexible substrate having opposed first and second surfaces;
first conductive traces formed on a first part of the first surface of the flexible substrate, wherein the first conductive traces are generally parallel to one another;
second conductive traces formed on a second part of the first surface of the flexible substrate, wherein the second conductive traces are generally parallel to one another, and wherein the second conductive traces are generally parallel to the first conductive traces; and
third conductive traces formed on the second surface of the flexible substrate, wherein the third conductive traces are oriented transversely to the first and the second conductive traces, and wherein a first portion of the third conductive traces overlies the first conductive traces and a second portion of the third conductive traces overlies the second conductive traces;
wherein the flexible substrate is at least partially wrapped around the core such that the first conductive traces and the first part of the third conductive traces overlie the first surface of the core and the second conductive traces and the second part of the third conductive traces overlie the second surface of the core.

Embodiment 2

The sensor assembly of embodiment 1, further comprising at least one integrated circuit disposed on the flexible substrate, wherein one or more of the first, second, and third conductive traces are electrically connected to each integrated circuit.

Embodiment 3

The sensor assembly of embodiment 1 or embodiment 2, further comprising a conductive interconnect line connecting each of the first conductive traces, the second conductive traces, and the third conductive traces to an integrated circuit.

Embodiment 4

The sensor assembly of any one of embodiments 1 to 3, wherein a first plurality of sensor elements comprises the first conductive traces and the third conductive traces separated from the first conductive traces by a layer of dielectric material,
wherein a second plurality of sensor elements comprises the second conductive traces and the third conductive traces separated from the second conductive traces by the layer of dielectric material, and
wherein each of the first and second plurality of sensor elements is configured to produce a signal in response to a finger surface placed in detectable proximity to the sensor element.

Embodiment 5

The sensor assembly of any one of embodiments 1 to 4, wherein the first and second conductive traces are drive lines configured to transmit a signal, and wherein the third conductive traces are pickup lines configured to receive at least a portion of the signal transmitted by the drive lines.

Embodiment 6

The sensor assembly of any one of embodiments 1 to 4, wherein the third conductive traces are drive lines configured to transmit a signal, and the first and second conductive traces are pickup lines configured to receive at least a portion of the signal transmitted by the drive lines.

Embodiment 7

The sensor assembly of any one of embodiments 1 to 3, wherein a first plurality of sensor elements comprises the first conductive traces and the third conductive traces separated from the first conductive traces by a layer of dielectric material, wherein each of the first and third conductive traces is configured to transmit a signal to a finger surface placed in detectable proximity and receive a resultant signal.

Embodiment 8

The sensor assembly of embodiment 7, wherein a second plurality of sensor elements comprises the second conductive traces and the third conductive traces separated from the second conductive traces by a layer of dielectric material, wherein each of the second and third conductive traces is configured to transmit a signal to a finger surface placed in detectable proximity and receive a resultant signal.

Embodiment 9

The sensor assembly of any one of embodiments 1 to 8, wherein the first and second surfaces of the core are parallel to each other.

Embodiment 10

The sensor assembly of any one of embodiments 1 to 9 wherein the core comprises an encapsulant over-molded onto the first part of the flexible substrate and covering the first conductive traces and the first portion of the third conductive traces, and wherein the second part of the flexible substrate is folded over the encapsulant.

Embodiment 11

The sensor assembly of any one of embodiments 1 to 10, wherein the core comprises one or more mounting pins on the second surface of the core and the flexible substrate comprises one or more alignment holes formed on the second part of the flexible substrate, and wherein each of the mounting pins extend into one of the alignment holes when the second part of the flexible substrate is partially wrapped over the second surface of the core.

Embodiment 12

The sensor assembly of any one of embodiments 1 to 10, further comprising a retainer bar attached to the second part of the flexible substrate, and wherein the core comprises a slot formed in the second surface thereof and configured to receive the retainer bar when the second part of the flexible substrate is partially wrapped over the second surface of the core.

Embodiment 13

The sensor assembly of embodiment 9, further comprising a second encapsulant over-molded onto the second part of the flexible substrate and covering the second portion of the third conductive traces.

Embodiment 14

The sensor assembly of embodiment 12, wherein the core comprises a step formed in the second surface thereof and configured to receive the second encapsulant when the second part of the flexible substrate is partially wrapped over the second surface of the core.

Embodiment 15

The sensor assembly of embodiment 13 or 14, wherein the core comprises one or more mounting posts on the step formed in the second surface of the core and the second encapsulant comprises one or more integrally molded alignment holes, and wherein each of the mounting posts extend into the alignment holes when the second part of the flexible substrate is partially wrapped over the second surface of the core.

Embodiment 16

The sensor assembly of any one of embodiments 1 to 15, wherein the flexible substrate is wrapped such that the first surface of the flexible substrate overlies and faces the first and second surfaces of the core.

Embodiment 17

The sensor assembly of any one of embodiments 1 to 15, wherein the flexible substrate is wrapped such that the second surface of the flexible substrate overlies and faces the first and second surfaces of the core.

Embodiment 18

The sensor assembly of any one of embodiments 1 to 17, further comprising conductive pads formed on the flexible substrate and aligned with openings formed in the core.

Embodiment 19

The sensor assembly of any one of embodiments 1 to 18, wherein the core comprises two separate materials.

Embodiment 20

The sensor assembly of embodiment 19, wherein a first material is a printed circuit board (PCB) and a second material is an encapsulant overmolded on a portion of the PCB, the PCB comprising the first surface of the core and the encapsulant comprising the second surface of the core.

Embodiment 21

A sensor module comprising:
a wrapped sensor assembly comprising:
a flexible substrate having opposed first and second surfaces and comprising:
spatially distinct first and second sensing areas;
an integrated circuit disposed on the first surface; and
one or more conductive pads disposed on the first surface, and
an encapsulant core with first and second surfaces over-molded onto the first surface of the flexible substrate and having openings formed therein aligned with the conductive pads, wherein the flexible substrate is partially wrapped around the encapsulant core so that the first surface of the flexible substrate contacts the first and second surfaces of the encapsulant core, the first sensing area overlies the first surface of the encapsulant core, and the second sensing area overlies the second surface of the encapsulant core.

Embodiment 22

The sensor module of embodiment 21, wherein the encapsulant core encapsulates the integrated circuit and the one or more passive components.

Embodiment 23

The sensor module of embodiment 22, further comprising a stiffener plate secured to the second surface of a portion of the flexible substrate, wherein the first surface of the portion of the flexible substrate comprises a portion of the encapsulant core encapsulating the integrated circuit.

Embodiment 24

The sensor module of embodiment 21 or 22, further comprising a stiffener plate secured to the second surface of a portion of the flexible substrate, wherein the first surface of the portion of the flexible substrate comprises the integrated circuit.

Embodiment 25

The sensor module of any one of embodiments 21 to 24, wherein the first and second sensing areas are formed on respective parallel surfaces.

Embodiment 26

The sensor module of any one of embodiments 21 to 25, wherein one or both of the first and second sensing areas are covered with a protective coating.

Embodiment 27

The sensor module of any one of embodiments 21 to 26, wherein the wrapped sensor assembly further comprises one or more passive components disposed on the first surface.

Embodiment 28

The sensor module of embodiment 27, wherein the encapsulant core encapsulates the one or more passive components.

Embodiment 29

The sensor module of embodiment 28, further comprising a stiffener plate secured to the second surface of a portion of the flexible substrate, wherein the first surface of the portion of the flexible substrate comprises a portion of the encapsulant core encapsulating the one or more passive components.

Embodiment 30

A method of inserting a sensor module into a smart card, the method comprising:
forming a cavity in a card body of the smart card, wherein the card comprises opposed first and second surfaces, wherein the cavity forms a first cavity opening in the first surface of the card body and a second cavity opening in the second surface of the card body, and wherein the cavity exposes a plurality of electrical contacts;
inserting the sensor module into the cavity through the first cavity opening, wherein the sensor module comprises opposed first and second sensing surfaces and a plurality of conductive interconnects, and wherein upon insertion of the sensor module: (i) the plurality of conductive interconnects are connected to the plurality of electrical contacts, (ii) the first sensing surface is aligned with and exposed through the first cavity opening, and (iii) the second sensing surface is aligned with and exposed through the second cavity opening; and
attaching a rigid frame on the first surface of the card body to cover the first cavity opening and secure the inserted sensor module within the cavity, wherein the rigid frame comprises a cutout to expose the first sensing surface.

Embodiment 31

The method of embodiment 30, wherein the first cavity opening is larger than the second cavity opening.

Embodiment 32

The method of embodiments 30 or 31, wherein the plurality of conductive interconnects comprise compressible conductive bumps.

Embodiment 33

A host device with an integrated sensor comprising:
a host device body comprising first and second surfaces;
operative circuitry embedded within the host device body, wherein the host device body includes a sensor cavity formed therein, the sensor cavity being defined by a center cavity open to the second surface of the host device body and a through hole from the center cavity and through the first surface of the host device body; and
a sensor module mounted within the host device body, the sensor module comprising:
a first sensing area on a first surface of the sensor module; and
a second sensing area on a second surface of the sensor module;
wherein the sensor module is disposed within the center cavity of the sensor cavity and the first sensing area is aligned with and accessible through the through hole of the sensor cavity.

Embodiment 34

The host device of embodiment 33 wherein the first surface of the sensor module is recessed below, co-planar with, or projected above the first surface of the host device body, and the second surface of the sensor module is recessed below, co-planar with, or projected above the second surface of the host device body.

Embodiment 35

The host device of either embodiment 33 or 34, further comprising a first frame disposed over the center cavity of the sensor cavity and secured at the periphery thereof to a portion of the second surface of the host device body peripherally surrounding the center cavity, the first frame having a cutout formed therein, wherein the second sensing area is aligned with and accessible through the cut out of the first frame.

Embodiment 36

The host device of embodiment 35, further comprising a second frame disposed over the through hole and secured at the periphery thereof to a portion of the first surface of the host device body peripherally surrounding the through hole, the second frame having a cutout formed therein, wherein the first sensing area is aligned with and accessible through the cutout of the second frame.

Embodiment 37

The host device of embodiment 36 where the host device is a smart card.

Embodiment 38

The sensor assembly of embodiment 1, wherein the first conductive traces and the second conductive traces are spatially separated by a distance greater than the height of an edge connecting the first and second surfaces of the core.

Embodiment 39

A sensor module having two sensing surfaces and comprising:
a first single-sided sensor assembly having a first integrated circuit, a first surface, and a second surface, wherein the second surface of the first single-sided sensor assembly comprises a first sensing area; and
a second single-sided sensor assembly having a second integrated circuit, a first surface, and a second surface, wherein the second surface of the second single-sided sensor assembly comprises a second sensing area;
wherein the first single-sided sensor assembly is inverted and rotated relative to the second single-sided sensor assembly, and the first surface of the first single-sided sensor assembly is attached to the first surface of the second single-sided sensor assembly to form a double-sided fingerprint sensor assembly, the double-sided fingerprint sensor assembly having a first sensing surface comprising the first sensing area and a second sensing surface comprising the second sensing area.

Embodiment 40

The sensor module of embodiment 39 wherein the first and second integrated circuits are each connected to a controlling processor.

Embodiment 41

The sensor module of any one of embodiments 39 to 40, further comprising a printed circuit board (PCB) comprising a cut-out, wherein the double-sided fingerprint sensor assembly is inserted in the cut-out and the first and second integrated circuits are electrically connected to the PCB.

Embodiment 42

The sensor module of any one of embodiments 39 to 41, wherein the first single-sided sensor assembly comprises a first overmold encapsulating the first integrated circuit, and the second single-sided sensor assembly comprises a second overmold encapsulating the second integrated circuit.

Embodiment 43

The sensor module of embodiment 42, wherein a surface of the first overmold comprises the first surface of the first single sided sensor assembly, which further comprises at least one or more integrally formed: (i) mounting pin and (ii) alignment hole.

Embodiment 44

The sensor module of embodiment 43, wherein a surface of the second overmold comprises the first surface of the second single sided sensor assembly, which comprises at least one or more integrally formed: (i) mounting pin and (ii) alignment hole,
wherein the at least one or more integrally formed mounting pin on the second overmold is configured to fit into the at least one or more alignment hole integrally formed on the first overmold when the first surface of the first single-sided sensor assembly is attached to the first surface of the second single-sided sensor assembly, and
wherein the at least one or more integrally formed alignment hole on the second overmold is configured receive the at least one or more mounting pin integrally formed on the first overmold when the first surface of the first single-sided sensor assembly is attached to the first surface of the second single-sided sensor assembly.

Embodiment 45

The sensor module of embodiment 40, wherein the controlling processor is on the PCB.

Embodiment 46

The sensor module of embodiment 39,
wherein the first single-sided sensor assembly comprises a first flexible substrate having opposed first and second surfaces, a plurality of drive lines disposed on the first surface of the first substrate, a plurality of pickup lines disposed on the second surface of the first substrate and arranged transversely to the drive lines and defining the first sensing area, and a plurality of routing lines formed on at least one of the first and second surfaces of the first substrate and connecting the drive lines and the pickup lines of the first single-sided sensor assembly to the first integrated circuit, and
wherein the second single-sided sensor assembly comprises a second flexible substrate having opposed first and second surfaces, a plurality of drive lines disposed on the first surface of the second substrate, a plurality of pickup lines disposed on the second surface of the second substrate and arranged transversely to the drive lines and defining the second sensing area, and a plurality of routing lines formed on at least one of the first and second surfaces of the second substrate and connecting the drive lines and the pickup lines of the second single-sided sensor assembly to the second integrated circuit.

Embodiment 47

The sensor module of embodiment 46, further comprising a plurality of first interconnect pads formed on the first substrate and a plurality of second interconnect pads formed on the second substrate.

Embodiment 48

The sensor module of embodiment 46 or embodiment 47, wherein the first integrated circuit is disposed on the first surface of the first substrate, and wherein the first single-sided sensor assembly comprises a first overmold encapsulating at least a portion of the first surface of the first substrate, the drive lines, and the first integrated circuit, and wherein the second integrated circuit is disposed on the first surface of the second substrate, and wherein the second single-sided sensor assembly comprises a second overmold encapsulating at least a portion of the first surface of the second substrate, the drive lines, and the second integrated circuit.

Embodiment 49

A sensor module having two sensing surfaces and comprising:
a flexible substrate having opposed first and second surfaces;
first and second sensing areas disposed on spatially distinct portions of the flexible substrate;
a first integrated circuit disposed on the first surface of the flexible substrate and connected to the first sensing area,
a second integrated circuit disposed on the first surface of the flexible substrate and connected to second sensing area; and
a rigid core with first and second surfaces, wherein the flexible substrate is at least partially wrapped around the core such that the second sensing area overlies the second surface of the core.

Embodiment 50

The sensor module of embodiment 49, further comprising:
first interconnect pads disposed on the first surface of the flexible substrate; and
second interconnect pads disposed on the first surface of the flexible substrate, wherein the portions of the flexible substrate on which the first and second interconnect pads are disposed overhanging the core.

Embodiment 51

The sensor module of embodiment 50, further comprising a controlling processor, wherein the first and second integrated circuits are electrically connected to the controlling processor.

Embodiment 52

The sensor module of embodiment 51, further comprising a printed circuit board (PCB) comprising the controlling processor.

Embodiment 53

The sensor module of embodiment 52 wherein at least one of the first and second interconnect pads is connected to the PCB.

Embodiment 54

The sensor module of any one of embodiments 49 to 53, wherein the core comprises a rigid piece of polymer or glass having opposed flat surfaces defining the first and second surfaces of the core.

Embodiment 55

The sensor module of any one of embodiments 49 to 53, wherein the core comprises a first overmold disposed over a first portion of the first surface of the flexible substrate corresponding to a non-contact surface of the first sensing area and encapsulating the first ASIC and a second overmold disposed over a second portion of the first surface of the flexible substrate corresponding to a non-contact surface of the second sensing area and encapsulating the second ASIC, and wherein the first and second overmolds are folded on top of each other.

Embodiment 56

The sensor module of embodiment 55, wherein the first ASIC and the second ASIC overlap each other when the first and second overmolds are folded on top of each other.

Embodiment 57

The sensor module of embodiment 55, wherein the first ASIC and the second ASIC do not overlap each other when the first and second overmolds are folded on top of each other.

Embodiment 58

The sensor module of embodiment 49, further comprising a printed circuit board (PCB) comprising a controlling unit, wherein at least one of the first and second integrated circuits is electrically connected to the PCB, wherein the core comprises a first overmold encapsulating the first ASIC and the PCB and a second overmold encapsulating the second ASIC, and wherein the first and second overmolds are folded on top of each other.

Embodiment 59

The sensor module of embodiment 55, wherein the first overmold comprises a step formed in a first surface thereof and configured to receive the second overmold when the first and second overmolds are folded on top of each other.

While the subject matter of this disclosure has been described and shown in considerable detail with reference to certain illustrative embodiments, including various combinations and sub-combinations of features, those skilled in the art will readily appreciate other embodiments and variations and modifications thereof as encompassed within the scope of the present disclosure. Moreover, the descriptions of such embodiments, combinations, and sub-combinations is not intended to convey that the claimed subject matter requires features or combinations of features other than those expressly recited in the claims. Accordingly, the scope of this disclosure is intended to include all modifications and variations encompassed within the spirit and scope of the following appended claims.

The invention claimed is:

1. A sensor assembly comprising:
a core having first and second surfaces;
a flexible substrate having opposed first and second surfaces;
first conductive traces formed on a first part of the first surface of the flexible substrate, wherein the first conductive traces are generally parallel to one another;
second conductive traces formed on a second part of the first surface of the flexible substrate, wherein the second conductive traces are generally parallel to one another, and wherein the second conductive traces are generally parallel to the first conductive traces; and
third conductive traces formed on the second surface of the flexible substrate, wherein the third conductive traces are oriented transversely to the first and the second conductive traces, and wherein a first portion of the third conductive traces overlies the first conductive traces and a second portion of the third conductive traces overlies the second conductive traces;
wherein the flexible substrate is at least partially wrapped around the core such that the first conductive traces and the first part of the third conductive traces overlie the first surface of the core and the second conductive traces and the second part of the third conductive traces overlie the second surface of the core.

2. The sensor assembly of claim 1, further comprising at least one integrated circuit disposed on the flexible substrate, wherein one or more of the first, second, and third conductive traces are electrically connected to each integrated circuit.

3. The sensor assembly of claim 1, further comprising a conductive interconnect line connecting each of the first conductive traces, the second conductive traces, and the third conductive traces to an integrated circuit.

4. The sensor assembly of claim 1, wherein a first plurality of sensor elements comprises the first conductive traces and the third conductive traces separated from the first conductive traces by a layer of dielectric material,
wherein a second plurality of sensor elements comprises the second conductive traces and the third conductive traces separated from the second conductive traces by the layer of dielectric material, and
wherein each of the first and second plurality of sensor elements is configured to produce a signal in response to a finger surface placed in detectable proximity to the sensor element.

5. The sensor assembly of claim 1, wherein the first and second conductive traces are drive lines configured to transmit a signal, and wherein the third conductive traces are pickup lines configured to receive at least a portion of the signal transmitted by the drive lines.

6. The sensor assembly of claim 1, wherein the third conductive traces are drive lines configured to transmit a signal, and the first and second conductive traces are pickup lines configured to receive at least a portion of the signal transmitted by the drive lines.

7. The sensor assembly of claim 1, wherein a first plurality of sensor elements comprises the first conductive traces and the third conductive traces separated from the first conductive traces by a layer of dielectric material, wherein each of the first and third conductive traces is configured to transmit a signal to a finger surface placed in detectable proximity and receive a resultant signal.

8. The sensor assembly of claim 7, wherein a second plurality of sensor elements comprises the second conductive traces and the third conductive traces separated from the second conductive traces by a layer of dielectric material, wherein each of the second and third conductive traces is configured to transmit a signal to a finger surface placed in detectable proximity and receive a resultant signal.

9. The sensor assembly of claim 1, wherein the first and second surfaces of the core are parallel to each other.

10. The sensor assembly of claim 1, wherein the core comprises an encapsulant over-molded onto the first part of the flexible substrate and covering the first conductive traces and the first portion of the third conductive traces, and wherein the second part of the flexible substrate is folded over the encapsulant.

11. The sensor assembly of claim 1, wherein the core comprises one or more mounting pins on the second surface of the core and the flexible substrate comprises one or more alignment holes formed on the second part of the flexible substrate, and wherein each of the mounting pins extend into one of the alignment holes when the second part of the flexible substrate is partially wrapped over the second surface of the core.

12. The sensor assembly of claim 10, further comprising a second encapsulant over-molded onto the second part of the flexible substrate and covering the second portion of the third conductive traces.

13. The sensor assembly of claim 1, wherein the flexible substrate is wrapped such that the first surface of the flexible substrate overlies and faces the first and second surfaces of the core.

14. The sensor assembly of claim 1, wherein the flexible substrate is wrapped such that the second surface of the flexible substrate overlies and faces the first and second surfaces of the core.

15. The sensor assembly of claim 1, further comprising conductive pads formed on the flexible substrate.

16. The sensor assembly of claim 1, wherein the first conductive traces and the second conductive traces are spatially separated by a distance greater than the height of an edge connecting the first and second surfaces of the core.

17. A sensor module comprising:
a wrapped sensor assembly comprising:
a flexible substrate having opposed first and second surfaces and comprising:
spatially distinct first and second sensing areas;
an integrated circuit disposed on the first surface; and
one or more conductive pads disposed on the first surface, and
an encapsulant core with first and second surfaces over-molded onto the first surface of the flexible substrate and having openings formed therein aligned with the conductive pads, wherein the flexible substrate is partially wrapped around the encapsulant core so that the first surface of the flexible substrate contacts the first and second surfaces of the encapsulant core, the first sensing area overlies the first surface of the encapsulant core, and the second sensing area overlies the second surface of the encapsulant core.

18. The sensor module of claim 17, wherein the encapsulant core encapsulates the integrated circuit and the one or more passive components.

19. The sensor module of claim 18, further comprising a stiffener plate secured to the second surface of a portion of the flexible substrate, wherein the first surface of the portion of the flexible substrate comprises a portion of the encapsulant core encapsulating the integrated circuit.

20. The sensor module of claim 17, further comprising a stiffener plate secured to the second surface of a portion of the flexible substrate, wherein the first surface of the portion of the flexible substrate comprises the integrated circuit.

21. The sensor module of claim 17, wherein the first and second sensing areas are formed on respective parallel surfaces.

22. The sensor module of claim 17, wherein one or both of the first and second sensing areas are covered with a protective coating.

23. The sensor module of claim 17, wherein the wrapped sensor assembly further comprises one or more passive components disposed on the first surface, and wherein the encapsulant core encapsulates the one or more passive components.

24. The sensor module of claim 23, further comprising a stiffener plate secured to the second surface of a portion of the flexible substrate, wherein the first surface of the portion of the flexible substrate comprises a portion of the encapsulant core encapsulating the one or more passive components.

25. A host device with an integrated sensor comprising:
a host device body comprising first and second surfaces;
operative circuitry embedded within the host device body, wherein the host device body includes a sensor cavity formed therein, the sensor cavity being defined by a center cavity open to the second surface of the host device body and a through hole from the center cavity and through the first surface of the host device body; and
a sensor module mounted within the host device body, the sensor module comprising:
a first sensing area on a first surface of the sensor module; and
a second sensing area on a second surface of the sensor module;
wherein the sensor module is disposed within the center cavity of the sensor cavity and the first sensing area is aligned with and accessible through the through hole of the sensor cavity.

26. The host device of claim 25 wherein the first surface of the sensor module is recessed below, co-planar with, or projected above the first surface of the host device body, and the second surface of the sensor module is recessed below, co-planar with, or projected above the second surface of the host device body.

27. The host device of claim 26, further comprising a first frame disposed over the center cavity of the sensor cavity and secured at the periphery thereof to a portion of the second surface of the host device body peripherally surrounding the center cavity, the first frame having a cutout formed therein, wherein the second sensing area is aligned with and accessible through the cut out of the first frame.

28. The host device of claim 27, further comprising a second frame disposed over the through hole and secured at the periphery thereof to a portion of the first surface of the host device body peripherally surrounding the through hole, the second frame having a cutout formed therein, wherein the first sensing area is aligned with and accessible through the cutout of the second frame.

29. The host device of claim 28 where the host device is a smart card.

* * * * *